US011342241B2

(12) United States Patent
Cheng et al.

(10) Patent No.: US 11,342,241 B2
(45) Date of Patent: May 24, 2022

(54) POWER MODULE

(71) Applicant: Delta Electronics (Shanghai) CO., LTD, Shanghai (CN)

(72) Inventors: Wei Cheng, Shanghai (CN); Shouyu Hong, Shanghai (CN); Dongfang Lian, Shanghai (CN); Tao Wang, Shanghai (CN); Zhenqing Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/533,868

(22) Filed: Aug. 7, 2019

(65) Prior Publication Data

US 2020/0027807 A1    Jan. 23, 2020

Related U.S. Application Data

(63) Continuation-in-part of application No. 16/502,175, filed on Jul. 3, 2019.

(30) Foreign Application Priority Data

Jul. 18, 2018  (CN) .......................... 201810790118.7
Dec. 28, 2018  (CN) .......................... 201811620061.2
(Continued)

(51) Int. Cl.
  *H01L 23/538*  (2006.01)
  *H01L 23/50*  (2006.01)
  (Continued)

(52) U.S. Cl.
  CPC .............. *H01L 23/34* (2013.01); *H01L 23/50* (2013.01); *H01L 23/538* (2013.01); *H01L 23/645* (2013.01)

(58) Field of Classification Search
  CPC .......... H01L 23/34; H01L 23/50; H01L 23/66
  See application file for complete search history.

(56) References Cited

U.S. PATENT DOCUMENTS

2006/0151874 A1  7/2006  Milich et al.
2010/0230800 A1  9/2010  Beaupre et al.
(Continued)

FOREIGN PATENT DOCUMENTS

CN    101582415 A    11/2009
CN    104040715 A    9/2014
(Continued)

OTHER PUBLICATIONS

The EESR dated Oct. 10, 2019 by the EPO.
(Continued)

*Primary Examiner* — Moin M Rahman
*Assistant Examiner* — Mohammad A Rahman
(74) *Attorney, Agent, or Firm* — Qinghong Xu

(57) ABSTRACT

A power module, including: a first conductor, disposed at a first reference plane; a second conductor, disposed at a second reference plane, wherein projections of the first and second conductors on the first reference plane have a first overlap area; a third conductor, disposed at a third reference plane; a plurality of first switches, first ends of which are coupled to the first conductor; and a plurality of second switches, first ends of which are coupled to second ends of the first switches through the third conductor, and second ends of the second switches are coupled to the second conductor, wherein projections of minimum envelope areas of the first and second switches on the first reference plane have a second overlap area, and the first and second overlap areas have an overlap region. Heat sources of the power module are evenly distributed and its parasitic inductance is low.

17 Claims, 80 Drawing Sheets

(30) Foreign Application Priority Data

Jan. 23, 2019 (CN) .......................... 201910064451.4
Apr. 22, 2019 (CN) .......................... 201910323836.8

(51) Int. Cl.

| | |
|---|---|
| H01L 23/64 | (2006.01) |
| H01L 25/16 | (2006.01) |
| H01L 23/66 | (2006.01) |
| H01L 23/34 | (2006.01) |

(56) References Cited

U.S. PATENT DOCUMENTS

| | | | |
|---|---|---|---|
| 2012/0300522 A1 | 11/2012 | Tokuyama et al. | |
| 2013/0015495 A1 | 1/2013 | Hauenstein | |
| 2014/0077354 A1* | 3/2014 | Yamamoto | H02M 7/003 |
| | | | 257/712 |
| 2014/0346676 A1 | 11/2014 | Horio et al. | |
| 2015/0243640 A1* | 8/2015 | Horio | H01L 24/49 |
| | | | 257/701 |
| 2017/0148770 A1 | 5/2017 | Ishino et al. | |
| 2018/0059749 A1 | 3/2018 | Chen et al. | |
| 2018/0102301 A1 | 4/2018 | Jeon et al. | |

FOREIGN PATENT DOCUMENTS

| | | |
|---|---|---|
| CN | 106256082 A | 12/2016 |
| CN | 106463501 A | 2/2017 |
| CN | 107155372 A | 9/2017 |
| CN | 207165543 U | 3/2018 |
| EP | 3104411 A1 | 12/2016 |
| EP | 3226294 A1 | 10/2017 |
| EP | 3343746 A1 | 7/2018 |
| EP | 3416189 A1 * 12/2018 ............ H01L 23/48 |
| JP | 2004214452 A | 7/2004 |
| JP | 2011086769 A | 4/2011 |
| JP | 2016162777 A | 9/2016 |
| JP | 2018133481 A | 8/2018 |
| WO | 2013118415 A1 | 8/2013 |
| WO | 2016035651 A1 | 3/2016 |
| WO | 2016038955 A1 | 3/2016 |
| WO | 2017138414 A1 | 8/2017 |
| WO | 2018011969 A1 | 1/2018 |

OTHER PUBLICATIONS

The EESR dated Jan. 3, 2020 by the EPO.
The JP1OA dated Aug. 25, 2020 by the JPO.
The EP1OA dated Nov. 10, 2020 by the EPO.
The CN1OA dated Nov. 23, 2020 by the CNIPA.
The 1st Office Action dated Jan. 19, 2021 by the CNIPA from application No. 201811620061.2 .
The Notice of Allowance dated Jan. 28, 2021 by the CNIPA from application No. 201910323836.8 .
The Notice Of Allowance dated Jun. 15, 2021 for CN patent application No. 201811620061.2.
The 2nd Office Action dated Jul. 27, 2021 for EP patent application No. 19180703.1.
The Non-Final OA dated Mar. 15, 2022 for U.S. Appl. No. 16/502,175.

\* cited by examiner

POWER MODULE

CROSS REFERENCE

This application is a continuation-in-part application of U.S. patent application Ser. No. 16/502,175, filed on Jul. 3, 2019 and claimed the benefit of priority of Chinese Patent Application No. 201810790118.7, filed on Jul. 18, 2018, Chinese Patent Application No. 201910064451.4, filed on Jan. 23, 2019 and Chinese Patent Application No. 201910323836.8, filed on Apr. 22, 2019, and claims the benefit of priority of Chinese Patent Application No. 201811620061.2, filed on Dec. 28, 2018. The entire contents thereof are incorporated herein by reference.

TECHNICAL FIELD

The present disclosure relates to the field of packaging technology, and more particularly, to a power module.

BACKGROUND

As important parts of power conversion, modern power electronic devices are widely used in industries of power, electronics, motors and energy. Ensuring long-term stable operation of the power electronic devices and improving power conversion efficiency of the power electronic devices are important goals of those skilled in the art at all times.

As core components of modem power electronic devices, the performance of power semiconductor components directly determines reliability and power conversion efficiency of power electronic devices. In order to design safer and more reliable high-performance power electronic devices, the power semiconductor components are required to have characteristics of low voltage stress, low power loss and high heat dissipation performance. The power semiconductor components used in power electronic devices are operated in switching states, while high frequency switching actions may cause high current change rates in circuits. According to circuit principle, a voltage may be generated when a varying current acts on a parasitic inductance. When a current change rate is constant, larger parasitic inductance will produce higher voltage spike. Excessive voltage spike will reduce device reliability and increase device turn-off loss. If the parasitic inductance of circuits could be reduced, the devices will be allowed to use smaller drive resistors to achieve faster switching speeds and lower switching loss to improve converter efficiency. In addition, if the power semiconductor components generate a large amount of heat during switching operations, their working performance will be seriously affected.

Moreover, power semiconductor devices used in power electronics equipments operate in a switching mode, and high frequency switching will induce a high current change rate di/dt in the wires. Therefore, a voltage Vs is caused by the changed current applied on the stray inductance $L_{stray}$ and is calculated as followed.

$$V_s = L_{stray} di/dt$$

Therefore, a higher voltage spike is caused by larger stray inductance when the current change rate keeps in constant. The voltage spike will reduce the device reliability and increase turn off loss of the device. The device is allowed to switch faster with smaller gate resistance as the line stray inductance is reduced, which have lower switching losses and higher efficiency of the converter. The requirement of reducing the stray inductance is yhen proposed. It is necessary to need a package structure for reducing the stray inductance.

To sum up, requirements for reducing the parasitic inductance in the circuits where the power semiconductor components are located and improving their heat dissipation performance are proposed. Both the parasitic inductance and heat dissipation performance are related to the packaging of power semiconductor components, so there is a need to develop a power module with a reasonable package structure.

SUMMARY

The object of the present disclosure is to provide a power module, which may at least partially solve the technical problem that the existing power module has large parasitic inductance and poor heat dissipation.

According to an aspect of the present disclosure, a power module is provided which including:

a first conductor, wherein at least a portion of the first conductor is disposed at a first reference plane;

a second conductor, wherein at least a portion of the second conductor is disposed at a second reference plane, the second reference plane is parallel to the first reference plane, and a projection of the first conductor on the first reference plane and a projection of the second conductor on the first reference plane have a first overlap area;

a third conductor, wherein at least a portion of the third conductor is disposed at a third reference plane, and the third reference plane is parallel to the first reference plane and the second reference plane;

a plurality of first switches, wherein a first end of each of the first switches is electrically coupled to the first conductor; and a plurality of second switches, wherein a first end of each of the second switches is electrically coupled to a second end of at least one of the first switches through the third conductor, and a second end of each of the second switches is electrically coupled to the second conductor, wherein a projection of a minimum envelope area of the plurality of first switches on the first reference plane and a projection of a minimum envelope area of the plurality of second switches on the first reference plane have a second overlap area, and the first overlap area and the second overlap area have an overlap region.

The power module in the embodiments of the present disclosure may effectively reduce parasitic inductance of the power module, by setting projections of the P electrode conductor and the N electrode conductor on the first reference plane to have a first overlap area. In addition, on both sides of the first overlap area, an upper bridge arm switch and a lower bridge arm switch are simultaneously disposed, and the projections of the minimum envelope area of all the upper bridge arm switches and the minimum envelope area of all the lower bridge arm switches on the first reference plane have a second overlap area, such that, the heat source may be uniformly distributed, thereby effectively eliminating the hot spot, reducing heat transfer resistance between the switch with larger heat generation and the environment, and then improving the heat dissipation performance of the power module.

It should be understood that the above general description and the following detailed description are merely exemplary and explanatory, which is not limited to the present disclosure.

BRIEF DESCRIPTION OF THE DRAWINGS

The drawings here are incorporated into the specification and form a part of the specification, showing embodiments in accordance with the present disclosure, and used together with the specification to explain the principle of the present disclosure. Obviously, the drawings in the following description are only some embodiments of the present disclosure, and those skilled in the art may obtain other drawings according to the drawings without any creative work.

DETAILED DESCRIPTION

Figure 1:
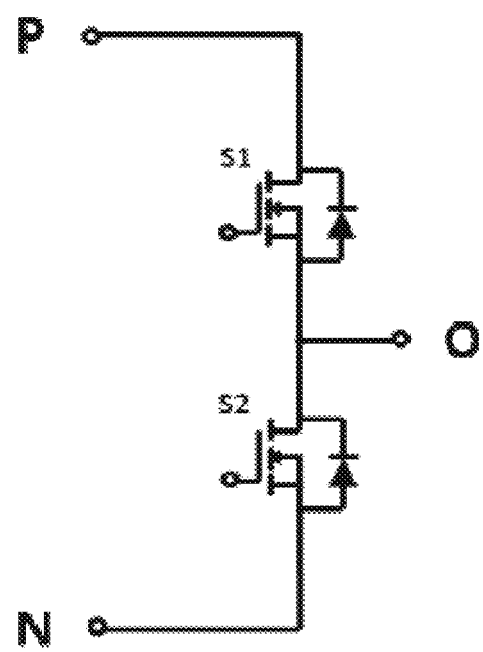
FIG. 1 shows a schematic view of a prior art of equivalent circuits of a half-bridge module.

Exemplary embodiments will now be described more fully with reference to accompanying drawings. However, the exemplary embodiments may be embodied in many forms and should not be understood as being limited to the embodiments described here; in contrast, the embodiments are provided so that the present disclosure will be comprehensive and complete, and the concept of the exemplary embodiments is fully conveyed to those skilled in the art. The same reference numeral in the drawings shows the same or similar structures, and thus their detailed description will be omitted.

In order to solve the technical problem that the existing power modules have large parasitic inductance and poor heat dissipation performance, an embodiment of the present disclosure provides a power module, including a first conductor, a second conductor, a third conductor, a plurality of first switches and a plurality of second switches. At least a portion of the first conductor is disposed at a first reference plane, at least a portion of the second conductor is disposed at a second reference plane, the second reference plane is parallel to the first reference plane, and a projection of the first conductor on the first reference plane and a projection of the second conductor on the first reference plane have a first overlap area; at least a portion of the third conductor is disposed at a third reference plane, wherein the third reference plane is parallel to the first reference plane and the second reference plane; a first end of each of the first switches is electrically coupled to the first conductor, a first end of each of the second switches is electrically coupled to a second end of at least one of the first switches through the third conductor, and a second end of each of the second switches is electrically coupled to the second conductor, wherein a projection of a minimum envelope area of the plurality of first switches on the first reference plane and a projection of a minimum envelope area of the plurality of second switches on the first reference plane have a second overlap area, and the first overlap area and the second overlap area have an overlap region.

The power module may be a half bridge module, a two-phase half bridge module, or a three-phase half bridge module, etc. The first switch and the second switch may be a power device such as IGBT, MOSFET or diode. The minimum envelope area means an area covered by an envelope rectangle with the smallest area, the minimum envelope area of the plurality of first switches refers to an area covered by an envelope rectangle having the smallest area among rectangles enclosing outermost edges of the plurality of first switches, and the minimum envelope area of the plurality of second switches refers to an area covered by an envelope rectangle having the smallest area among rectangles enclosing outermost edges of the plurality of second switches. The first conductor is one of a P electrode conductor and an N electrode conductor, the second conductor is the other one of the P electrode conductor and the N electrode conductor, and the third conductor is an O electrode conductor; and correspondingly, the first switch is one of an upper bridge arm switch and a lower bridge arm switch, and the second switch is the other one of the upper bridge arm switch and the lower bridge arm switch.

The power module in the embodiments of the present disclosure may effectively reduce parasitic inductance of the power module, by setting projections of the P electrode conductor and the N electrode conductor on the first reference plane to have a first overlap area. In addition, on both sides of the first overlap area, an upper bridge arm switch and a lower bridge arm switch are simultaneously disposed, and the projections of the minimum envelope area of all the upper bridge arm switches and the minimum envelope area of all the lower bridge arm switches on the first reference plane have a second overlap area, such that, the heat source may be uniformly distributed, thereby effectively eliminating the hot spot, reducing heat transfer resistance between the switch with larger heat generation and the environment, and then improving the heat dissipation performance of the power module.

The following is an example where the first conductor is a P electrode conductor, the second conductor is an N electrode conductor, the third conductor is an O electrode conductor, the first switch is an upper bridge arm switch, and the second switch is a lower bridge arm switch, to describe the power module of the embodiments of the present disclosure in detail.

FIG. 1 shows a schematic view of a prior art of equivalent circuits of a half-bridge module. As shown in FIG. 1, a first switch S1 is serially connected with a second switch S2. The first switch S1 includes a first end and a second end. The second switch S2 includes a third end and a fourth end. The P pole is electrically connected to the first end of the first switch S1. The N pole is electrically connected to the fourth end of the second switch S2. The second end of the first switch S1 is electrically connected to the third end of the second switch S2. The second end of the first switch S1 and the third end of the second switch S2 both are electrically connected to the O pole.

Figure 2:
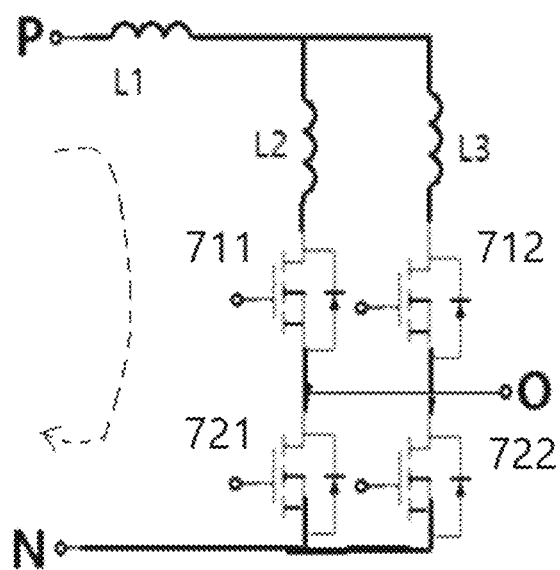
FIG. 2 is a circuit diagram showing a half bridge module according to a one embodiment of the present disclosure.
Figure 3:
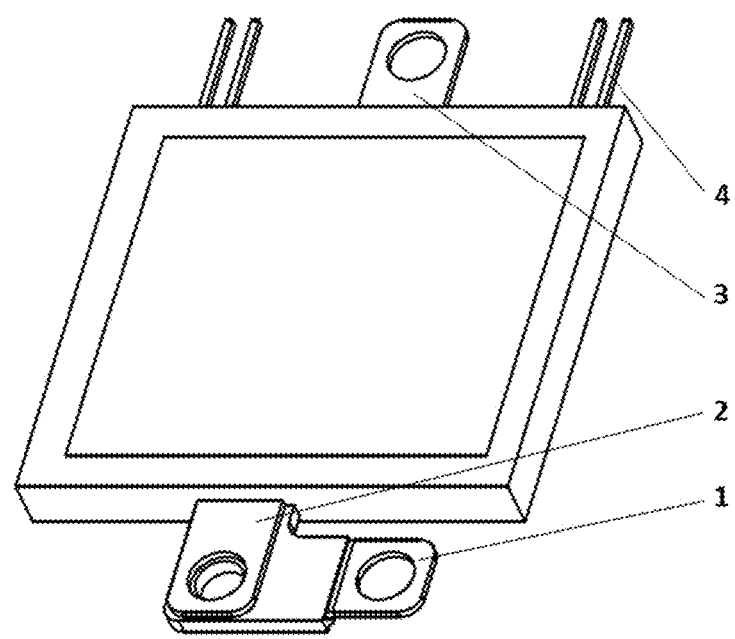
FIG. 3 is an axonometric diagram showing a structure of the half bridge module according to the one embodiment of the present disclosure.
Figure 4:
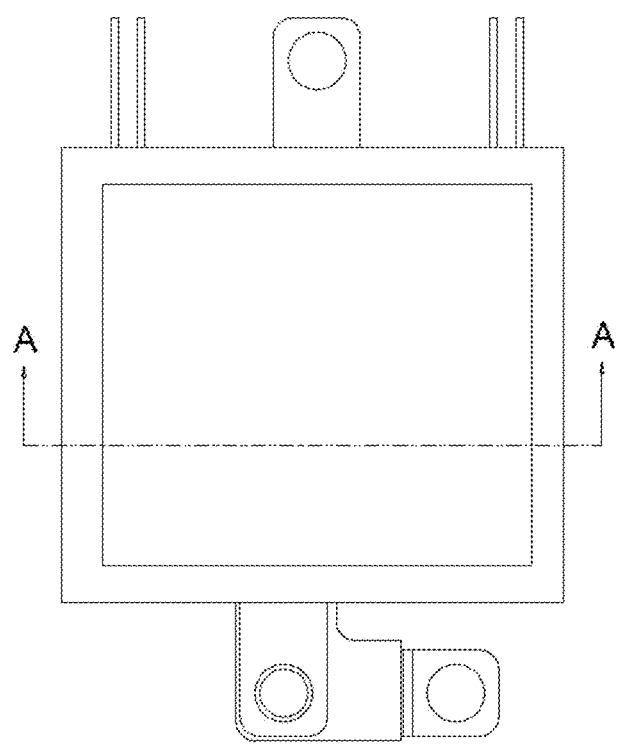
FIG. 4 is a top view showing the structure of the half bridge module according to the one embodiment of the present disclosure.
Figure 5:
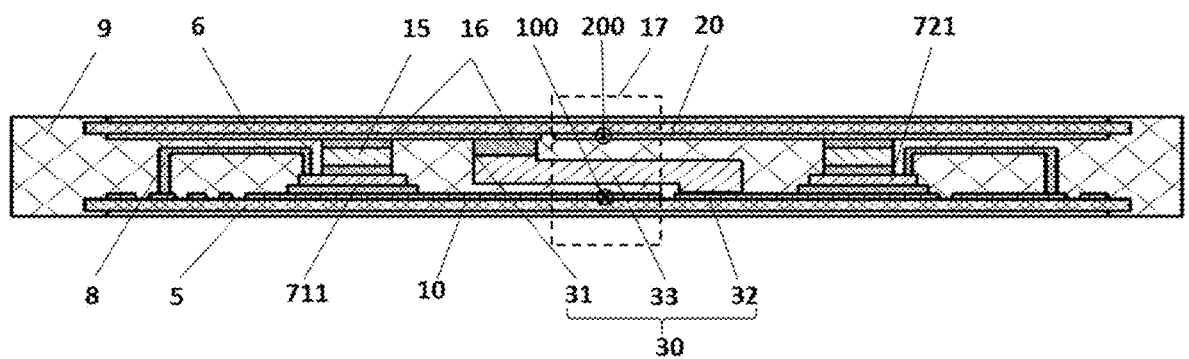
FIG. 5 is a cross-sectional view showing A-A section of the half bridge module in FIG. 4.
Figure 6:
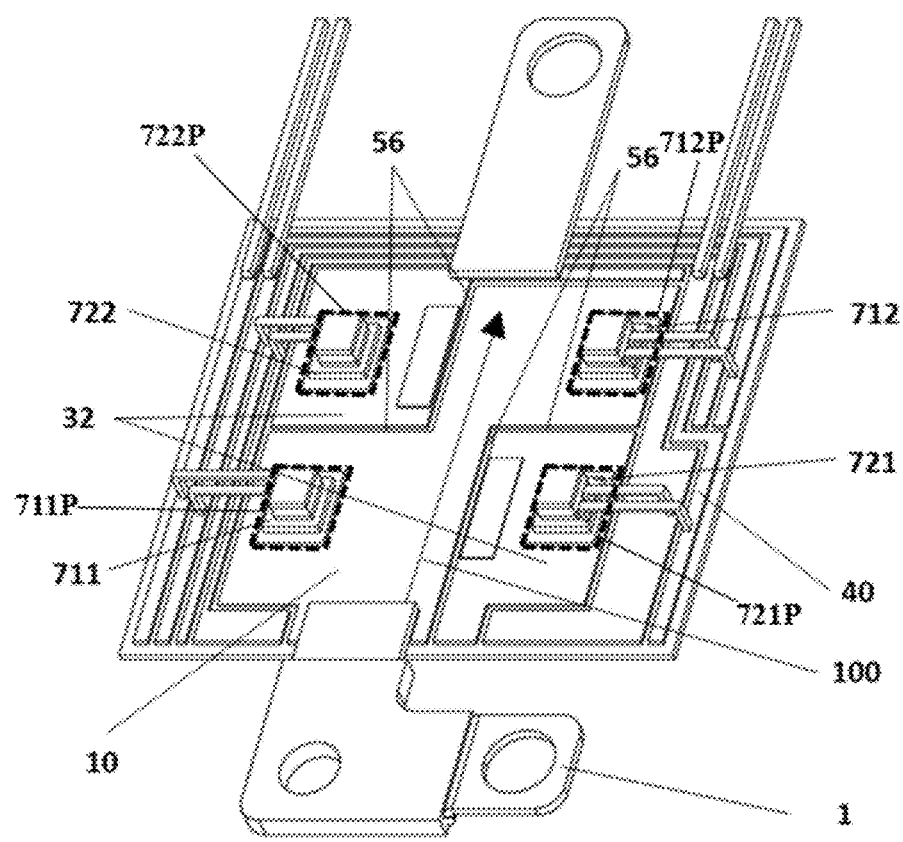
FIG. 6 is a partial structural diagram of the half bridge module according to the one embodiment of the present disclosure, showing switching elements placed at a lower substrate.
Figure 7:
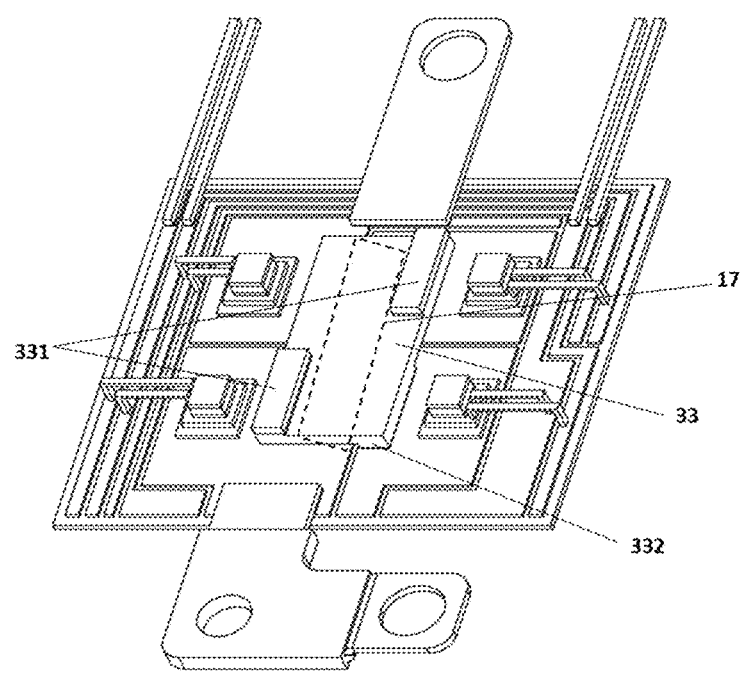
FIG. 7 is a partial structural diagram of the half bridge module according to the one embodiment of the present disclosure, showing the switching elements and a connecting bridge placed at the lower substrate.
Figure 8:
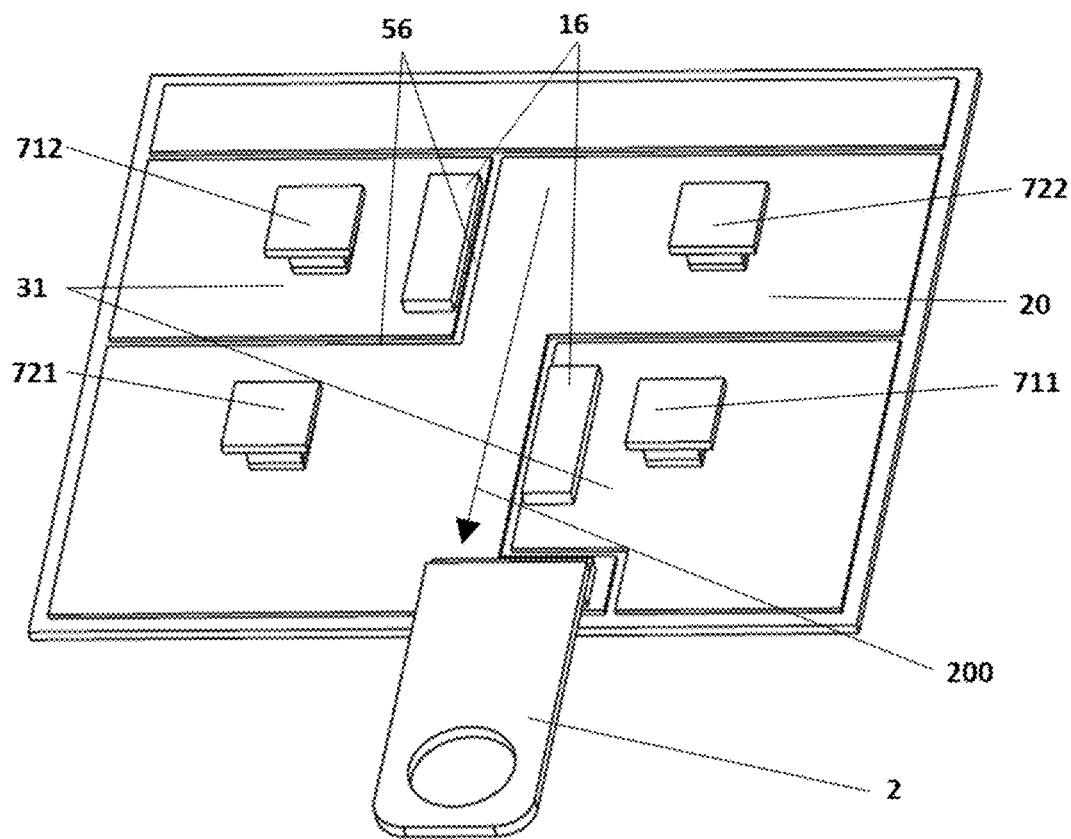
FIG. 8 is a partial structural diagram of the half bridge module according to the one embodiment of the present disclosure, showing a connection structure between the switching elements and an upper substrate.

FIG. 2 is a circuit diagram showing a half bridge module according to a one embodiment of the present disclosure; FIG. 3 is an axonometric diagram showing a structure of the half bridge module according to the one embodiment of the present disclosure; FIG. 4 is a top view showing the structure of the half bridge module according to the one embodiment of the present disclosure; FIG. 5 is a cross-sectional view showing A-A section of the half bridge module in FIG. 4; FIG. 6 is a partial structural diagram of the half bridge module according to the one embodiment of the present disclosure, showing switching elements placed at a lower substrate; FIG. 7 is a partial structural diagram of the half bridge module according to the one embodiment of the present disclosure, showing the switching elements and a connecting bridge placed at the lower substrate; and FIG. 8 is a partial structural diagram of the half bridge module according to the one embodiment of the present disclosure, showing a connection structure between the switching elements and an upper substrate.

As shown in FIG. 2 to FIG. 8, the half bridge module includes a P electrode conductor 10, an N electrode conductor 20, an O electrode conductor 30, two upper bridge arm switches 711 and 712, and two lower bridge arm switches 721 and 722. The P electrode conductor 10 is disposed at the first reference plane, the N electrode conductor 20 is disposed at the second reference plane, and a portion of O electrode conductor 30 is disposed at the third reference plane, wherein the first reference plane, the second reference plane and the third reference plane are parallel to each other, for example, they are all horizontally disposed, and the projection of the P electrode conductor 10 on the first reference plane and the projection of the N electrode conductor 20 on the first reference plane have a first overlap area. The first ends of the upper bridge arm switches 711 and 712 are electrically coupled to the P electrode conductor, the first ends of the lower bridge arm switches 721 and 722 are electrically coupled to the second ends of the upper bridge switches 711 and 712 through the O electrode conductor 30, and the second ends of the lower bridge arm switches 721 and 722 are electrically coupled to the N electrode conductor 20, wherein the projection of the minimum envelope area of the upper bridge switches 711 and 712 on the first reference plane and the projection of the minimum envelope area of the lower bridge switches 721 and 722 on the first reference plane have a second overlap area, and the first overlap area and the second overlap area have an overlap region.

Optionally, the half bridge module further includes a lower substrate 5 and an upper substrate 6 that are parallel to each other. The P electrode conductor 10 is a conductive layer disposed at the lower substrate 5, and the N electrode conductor 20 is a conductive layer disposed at the upper substrate 6. The O electrode conductor 30 includes a first conductive layer 31, a second conductive layer 32 and a connecting bridge 33, and is disposed between the lower substrate 5 and the upper substrate 6, wherein the first conductive layer 31 is disposed at the upper substrate 6 and adjacent to the N electrode conductor 20, the second conductive layer 32 is disposed at the lower substrate 5 and adjacent to the P electrode conductor 10, and the first conductive layer 31 and the second conductive layer 32 are electrically coupled together by the connecting bridge 33 through connecting material 16. All the switches in the half-bridge module are disposed between the lower substrate 5 and the upper substrate 6, and are tiled on the lower substrate 5 without being stacked on each other. That is, projections of the four switches, that is, the upper bridge arm switches 711 and 712 and the lower bridge arm switches 721 and 722, on the first reference plane do not overlap to each other. As shown in FIG. 6, a projection 711P of the upper bridge arm switch 711 is not overlapped with a projection 712P of the upper bridge arm switch 712, a projection 721P of the lower bridge switch 721 is not overlapped with a projection 722P of the lower bridge switch 722. The projection 711P, the projection 712P, the projection 721P, the projection 722P are not overlapped. Specifically, the upper bridge arm switches 711 and 712 are commonly disposed at the P electrode conductor 10, the lower bridge arm switch 721 is separately disposed at a separate second conductive layer 32, and lower bridge arm switch 722 is separately disposed at another separate second conductive layer 32. At this time, in the direction perpendicular to the first reference plane, each switch is provided with only one power conductor above and one power conductor below, that is, only one of the P electrode conductor 10, the N electrode conductor 20 and the O electrode conductor 30 is disposed vertically above each switch and only one of the P electrode conductor 10, the N electrode conductor 20 and the O electrode conductor 30 is disposed vertically below this switch. In addition, the upper side of each switch is further provided with a spacer 15 which may be a conductive metal block. A molding shell 9 is used to package the half bridge module.

Optionally, for example, the first power terminal is a P electrode terminal, the second power terminal is an N electrode terminal, and the third power terminal is an O electrode terminal. That is, the half bridge module further includes a P electrode terminal 1, an N electrode terminal 2, an O electrode terminal 3, a plurality of control signal terminals 4 and a plurality of control signal conductors 40. The P electrode power terminal 1 is electrically coupled to the P electrode conductor 10, and the N electrode power terminal 2 is electrically coupled to the N electrode conductor 20. Both the P electrode power terminal 1 and the N electrode power terminal 2 are led out from a first side of the half bridge module, and are stacked on each other, which may further reduce parasitic inductance of the half bridge module. The O electrode power terminal 3 is electrically coupled to the O electrode conductor 30 and is led out from a second side of the half bridge module opposite to the first side. Each control signal conductor 40 is electrically coupled to a corresponding one of the control ends of the upper bridge arm switches 711 and 712 and the lower bridge arm switches 721 and 722 through a bonding wire 8, and the plurality of control signal conductors 40 are disposed around the upper bridge arm switches 711 and 712 and the lower bridge arm switches 721 and 722. Each control signal terminal 4 is electrically coupled to a corresponding one of the plurality of control signal conductors 40 and is led out from the second side of the half bridge module, and the plurality of control signal terminals 4 are symmetrically distributed on both sides of the O electrode terminal 3.

Optionally, the connecting bridge 33 includes two first protrusions 331 and two second protrusions 332. The two first protrusions 331 are zigzaggedly disposed on a top side of the connecting bridge 33, and are connected to the first conductive layer 31 through the connecting material 16, and the two second protrusions 332 are zigzaggedly disposed on a bottom side of the connecting bridge 33 and are connected to the second conductive layer 32 through the connecting material 16. The zigzaggedly disposing here means that the two protrusions are disposed diagonally. The structure of the connecting bridge 33 with a plurality of the protrusion can be stably disposed in a connecting process of the connecting material, which is simple, and has high connection reliability. In addition, the connecting bridge 33 may be simplified, into a sheet metal structure as well, which may reduce processing cost.

In overlap space 17 vertically corresponding to the first overlap area, the current flowing through the P electrode conductor 10, that is, the direction of the P electrode current 100, is opposite to the direction of the current flowing through the N electrode conductor 20, that is, the N electrode current 200. The overlap space 17 refers to a closed cuboid space surrounded by the P electrode conductor and the N electrode conductor as upper and lower surface, and the P and N electrode conductors are vertically correspond to the first overlap area. Specifically, the P electrode current 100 flows vertically from the P electrode terminal 1 into the cross-sectional view of FIG. 5, and the N electrode current 200 flows vertically out of the cross-sectional view of FIG. 5, and the two current directions are opposite, which realizes a function of inductance cancellation, such that the parasitic inductance of the power module may be reduced, the electrical reliability of the power component operation may be improved, and turn-off loss of the power component may be reduced, thus improving the efficiency of the power module. In addition, the upper and lower surfaces of the switches are adjacent to the substrates, specifically, are connected to the substrates by the connecting material, or connected to the substrates through the spacers 15 and the connecting material 16. The substrate may be a substrate with high thermal conductivity, such as a double-side copper-clad ceramic plate (the ceramic material may be an alumina ceramic, an aluminum nitride ceramic, a silicon nitride ceramic, a silicon carbide ceramic, a beryllium oxide ceramic, etc.) or an insulated metal substrate. The insulating dielectric materials used in these substrates have relatively high thermal conductivity, so that they have good heat transfer performance, then the heat generated by the switches may be exchanged with the environment by upper and lower paths, thereby realizing double-side heat dissipation.

Optionally, on the left side of the overlap space 17, the upper bridge arm switch 711 and the lower bridge arm switch 722 are disposed in sequence from front to back; and on the right side of the overlap space 17, the lower bridge arm switch 721 and the upper bridge arm switch 712 are disposed in sequence from the front to back. That is, the upper bridge arm switches and the lower bridge arm switches are interlacedly disposed. Compared with the case that upper bridge arm switches are only disposed on one side of the overlap space 17 and the lower bridge arm switches are only disposed on the other side, or that the upper bridge arm switches are only disposed in one row, and that the lower bridge arm switches are only disposed in the other row, the solution of the present disclosure has the following advantages.

First, if the upper bridge arm switches are only disposed on one side of the overlap space 17, and the lower bridge arm switches are only disposed on the other side, such as the upper bridge arm switches 711 and 712 are on the left side in sequence from the front to back, and the lower bridge arm switches 721 and 722 are on the right side in sequence from the front to back, or the upper bridge arm switches are only disposed in one row, and the lower bridge arm switches are only disposed in the other row, such as the left side is provided with the upper bridge arm switch 711 and the lower bridge arm switch 721 in sequence from the front to back, and the right side is provided with the upper bridge arm switch 712 and the lower bridge switch 722 in sequence from the front to back, although the upper bridge arm switch 711 is disposed adjacent to the lower bridge arm switch 721, and the upper bridge switch 712 is disposed adjacent to the lower bridge switch 722, the upper bridge arm switch 711 and the lower bridge arm switch 722 are diagonally disposed, and the upper bridge arm switch 712 and the lower bridge arm switch 721 are diagonally disposed.

In the present disclosure, the upper bridge arm switch and the lower bridge arm switches are interlacedly disposed, such that the upper bridge arm switch 711 is adjacent to both the lower bridge arm switches 721 and 722, and the upper bridge arm switch 712 is adjacent to both the lower bridge arm switches 721 and 722. Therefore, the parasitic inductance corresponding to a commutation circuit of the upper bridge arm switch 711 and the lower bridge arm switch 722 is relatively small, and the parasitic inductance corresponding to a commutation circuit of the upper bridge switch 712 and the lower bridge switch 721 is relatively small as well, thereby further reducing the parasitic inductance of the entire half-bridge module.

In addition, in a partial operating mode of the half-bridge module, total power loss of the upper bridge arm switch and that of the lower bridge arm switch may be different, that is, the heat generated by the upper bridge arm switch chip and the lower bridge arm switch chip may be different. At this time, if the layout structure is that the upper bridge arm switches or the lower bridge arm switches are only existed on one side, the heat density of one side may be relatively higher. By adopting that the upper bridge arm switch and the lower bridge arm switch are interlacedly disposed, the heat source may be uniformly disposed, thereby effectively eliminating the hot spot, reducing the heat transfer resistance between the high heat-emitting chip and the environment, and improving heat dissipation performance. As shown in FIG. 6, supposing that the heat generated by the upper bridge arm switches 711 and 712 is higher, a distance between two chips with higher heat generation is the distance between the upper bridge arm switch 711 and the upper bridge arm switch 712. While, in the existing design, the distance between the two chips with higher heat generation is generally the distance between the upper bridge arm switch 711 and the lower bridge switch 721 or 722 in FIG. 6. Therefore, the present disclosure, by adopting that the upper bridge arm switch and the lower bridge arm switch are interlacedly disposed, may effectively increase the distance between the switch chips with larger heat generation, thereby making heat distribution more uniform, thereby improving the heat dissipation performance of the power module.

Secondly, by adopting that the upper bridge arm switch and the lower bridge arm switch are interlacedly disposed, the P electrode conductor 10 and the second conductive layer 32 are interlacedly disposed at the lower substrate 5, and the N electrode conductor 20 and the first conductive layer 31 are interlacedly disposed at the upper substrate 6. At this time, each of the P electrode conductor 10 and the N electrode conductor 20 has an L-shaped structure, that is, L-shaped gap structures 56 are formed on both the lower substrate 5 and the upper substrate 6. Such structure avoids the defect that a partial in-line-shaped gap structure has weak bending resistance, thus improving the bending resistance of the upper and lower substrates themselves. In addition, compared with the in-line-shaped gap structure, the L-shaped gap structure 56 may effectively avoid a local stress concentration phenomenon produced at the gap position of the power module due to internal thermal stress or external structural stress in the processes of assembly and use, thus effectively improving safety and yield in module assembly process, as well as reliability during use.

Further, by adopting that the upper bridge switch and the lower bridge switch are interlacedly disposed, the structure of the connecting bridge 33 is stable. If only the upper bridge arm switches are disposed on one side of the overlap space 17 and only the lower bridge arm switches are disposed on the other side, the structure of the connecting bridge 33 is not stable. That is, during assembly with the lower substrate 5, only the right side and lower substrate 5 have support points, and the left side is in a suspended state, which is disadvantageous for assembly. In this embodiment, the two second protrusions 332 on the diagonal sides of the bottom side of the connecting bridge 33 are disposed on two sides of the overlap space 17, as support points, to stably support the lower substrate 5. At the same time, the two first protrusions 331 on the diagonal sides of the top side are disposed on two sides of the overlap space 17 as well, as support points, to stably support the upper substrate 6.

It should be understood that the interlaced disposing in this embodiment means that the left and right sides of the overlap space 17 are provided with an upper bridge switch and a lower bridge switch respectively, and the arrangement order of the upper bridge arm switches and the lower bridge arm switches on the left and right sides are reversed. In other embodiments, the number and arrangement of the upper and lower bridge arm switches may be different.

Figure 9:
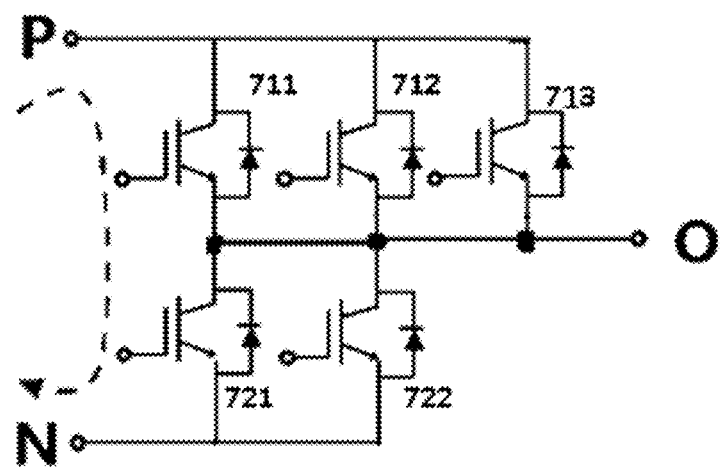
FIG. 9 is a circuit diagram showing a half bridge module according to a one embodiment of the present disclosure.
Figure 10:
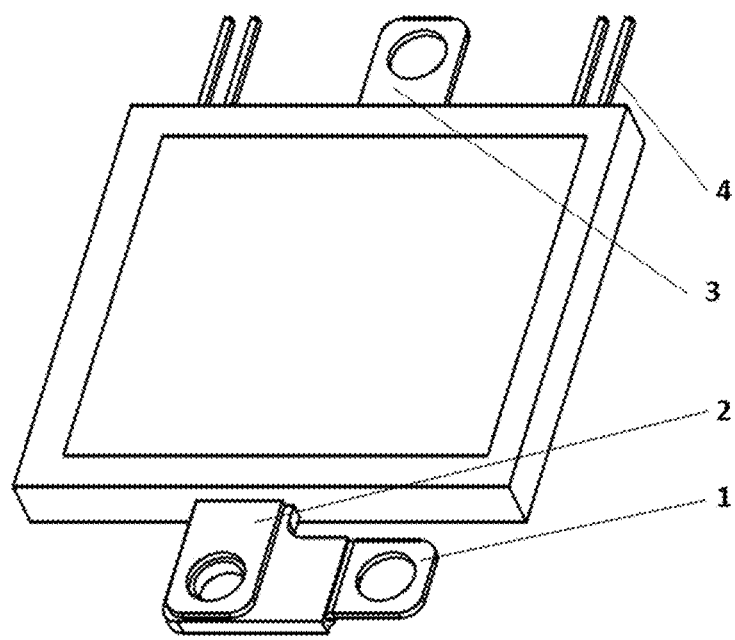
FIG. 10 is an axonometric diagram showing a structure of the half bridge module according to the one embodiment of the present disclosure.
Figure 11:
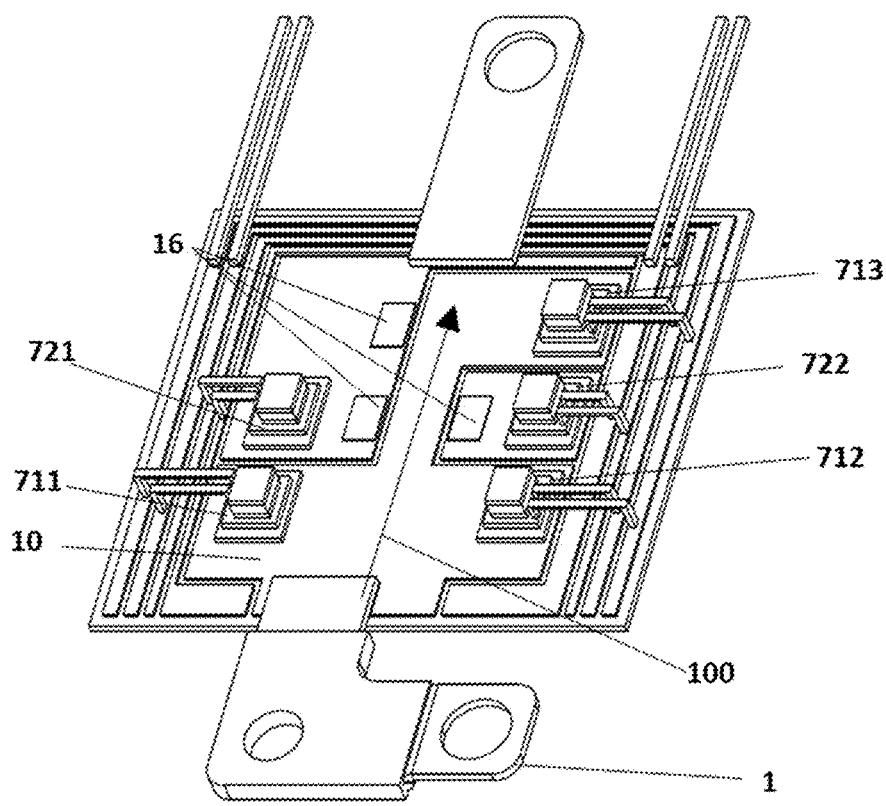
FIG. 11 is a partial structural diagram of the half bridge module according to the one embodiment of the present disclosure, showing switching elements placed at a lower substrate.
Figure 12:
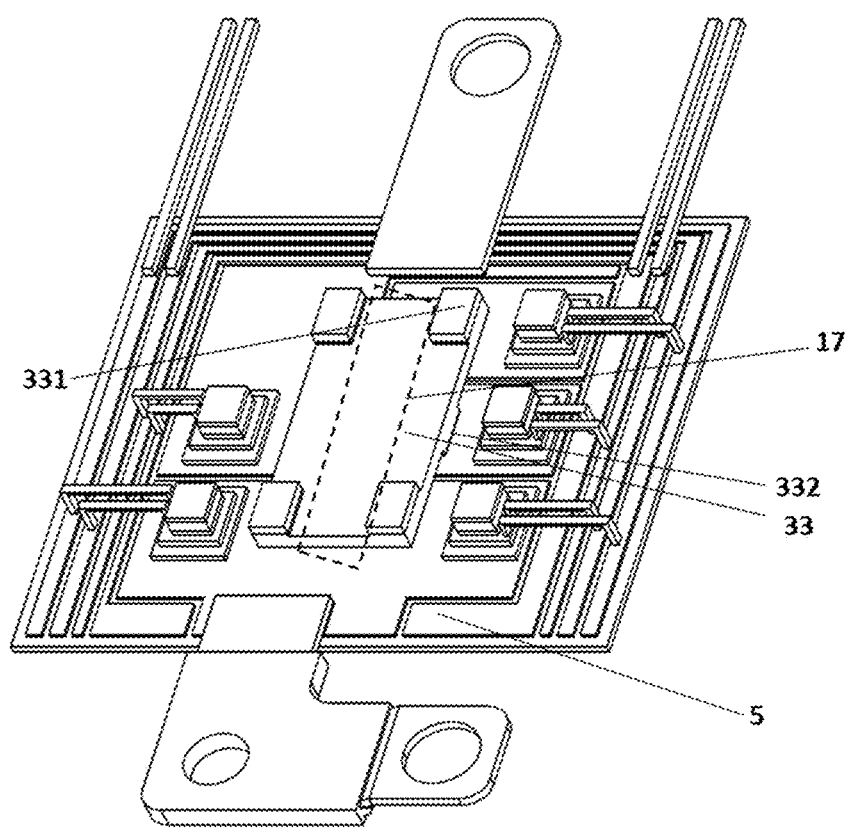
FIG. 12 is a partial structural diagram of the half bridge module according to the one embodiment of the present disclosure, showing the switching elements and a connecting bridge placed at the lower substrate.
Figure 13:
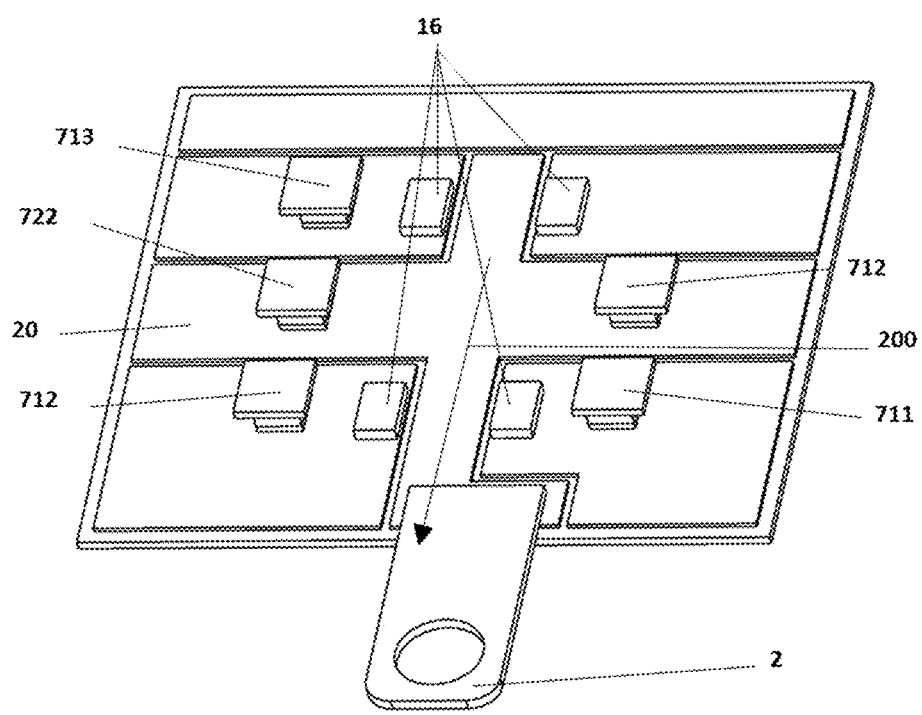
FIG. 13 is a partial structural diagram of the half bridge module according to the one embodiment of the present disclosure, showing a connection structure between the switching elements and an upper substrate.

FIG. 9 is a circuit diagram showing a half bridge module according to a one embodiment of the present disclosure; FIG. 10 is an axonometric diagram showing a structure of the half bridge module according to the one embodiment of the present disclosure; FIG. 11 is a partial structural diagram of the half bridge module according to the one embodiment of the present disclosure, showing switching elements placed at a lower substrate; FIG. 12 is a partial structural diagram of the half bridge module according to the one embodiment of the present disclosure, showing the switching elements and a connecting bridge placed at the lower substrate; and FIG. 13 is a partial structural diagram of the half bridge module according to the one embodiment of the present disclosure, showing a connection structure between the switching elements and an upper substrate.

As shown in FIG. 9 to FIG. 13, the half bridge module in the embodiment is similar to the half bridge module in the one embodiment, and the main difference is that the half bridge module includes three upper bridge arm switches. Specifically, the half bridge module includes a P electrode conductor 10, an N electrode conductor 20, an O electrode conductor 30, three upper bridge arm switches 711, 712 and 713, and two lower bridge arm switches 721 and 722. The projection of the P electrode conductor 10 on the first reference plane and the projection of the N electrode conductor 20 on the first reference plane have a first overlap area; the P electrode conductor 10 is electrically coupled to the first ends of the upper bridge arm switches 711, 712 and 713, the N electrode conductor 10 is electrically coupled to the second ends of the lower bridge arm switches 721 and 722, and the first ends of the lower bridge arm switches 721 and 722 are electrically coupled to the second ends of the upper bridge switches 711, 712 and 713 through the O electrode conductor 30, wherein the projection of the minimum envelope area of the upper bridge switches 711, 712 and 713 on the first reference plane and the projection of the minimum envelope area of the lower bridge switches 721 and 722 on the first reference plane have a second overlap area, and the first overlap area and the second overlap area have an overlap region.

Optionally, the P electrode conductor 10, the N electrode conductor 20 and the O electrode conductor 30 are electrically connected to the P electrode terminal 1, the N electrode terminal 2 and the O electrode terminal 3 respectively; control signal conductors 40 are electrically connected to the corresponding control signal terminals 4, and are electrically connected to the control ends of the corresponding switches through the bonding wires 8. The half bridge module further includes a lower substrate 5 and an upper substrate 6 that are parallel to each other. The P electrode conductor 10 is a conductive layer disposed at the lower substrate 5, and the N electrode conductor 20 is a conductive layer disposed at the upper substrate 6. The three upper bridge arm switches 711, 712 and 713 are commonly disposed at the P electrode conductor 10, and the two lower arm switches are separately disposed at the O electrode conductive layers disposed at the lower substrate 5. The P electrode current 100 flows from the P electrode terminal 1 into the power module, the N electrode current 200 flows from the N-pole terminal 2 out of the power module, and directions of the two currents are opposite to each other, such that the inductance cancellation effect is well realized, which may reduce the parasitic inductance of the power module, improve the reliability of the power device, and reduce the power component turn-off loss, thus improving converter efficiency. In addition, there are heat dissipation paths on both the upper and lower surfaces of the switch that can exchange heat with the environment, which may realize effective double-side heat dissipation.

Optionally, the connecting bridge 33 includes four first protrusions 331 and four second protrusions 332. The four first protrusions 331 are disposed on a top side of the connecting bridge 33, and are connected to the N electrode conductive layer through the connecting material 16. The two second protrusions 332 are disposed on a bottom side of the connecting bridge 33, and are connected to the O electrode conductive layer through the connecting material 16. The structure of the connecting bridge 33 with a plurality of the protrusion can be stably disposed in connecting process of the connecting material, Which is simple, and has high connection reliability. In addition, the connecting bridge 33 may be simplified into a sheet metal structure as well, which may reduce processing cost.

Optionally, on the left side of the overlap space 17 vertically corresponding to the first overlap area, the upper bridge arm switch 711 and the lower bridge arm switch 721 are disposed in sequence from front to back. On the right side of the overlap space 17, the upper bridge arm switch 712, the upper bridge arm switch 722 and the upper bridge arm switch 713 are disposed in sequence from the front to back. That is, the upper bridge arm switches and the lower bridge switch are interlacedly disposed on the right side of the overlap space 17. When the half bridge module is in the partial operating mode, because the total loss of the upper bridge arm switches and the total loss of the lower bridge arm switches are different. As shown in FIG. 9, the power loss of the three upper bridge arm switches are larger, and the loss of the two lower bridge arm switches are smaller, so the operating currents of the lower bridge arm switches may be appropriately increased, such that the number of the lower bridge arm switches is one less than the number of the upper bridge arm switches. Compared with the case where the number of the upper bridge arm switches and the lower bridge arm switches in the half bridge module are the same, one power device is reduced in the half bridge module described in this embodiment, thereby saving cost and reducing the occupied space size.

It should be understood that, in other embodiments, the number of the upper bridge arm switches may be greater than, equal to, or less than the number of the lower bridge arm switches.

Figure 14:
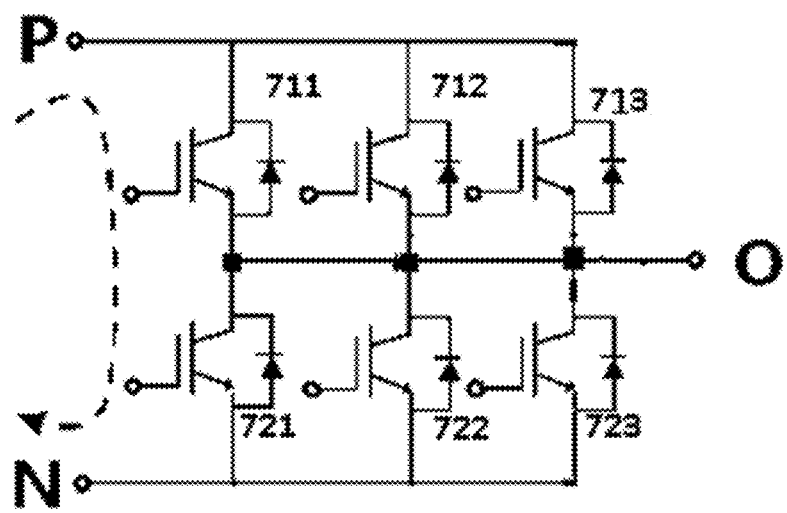
FIG. 14 is a circuit diagram showing a half bridge module according to a one embodiment of the present disclosure.
Figure 15:
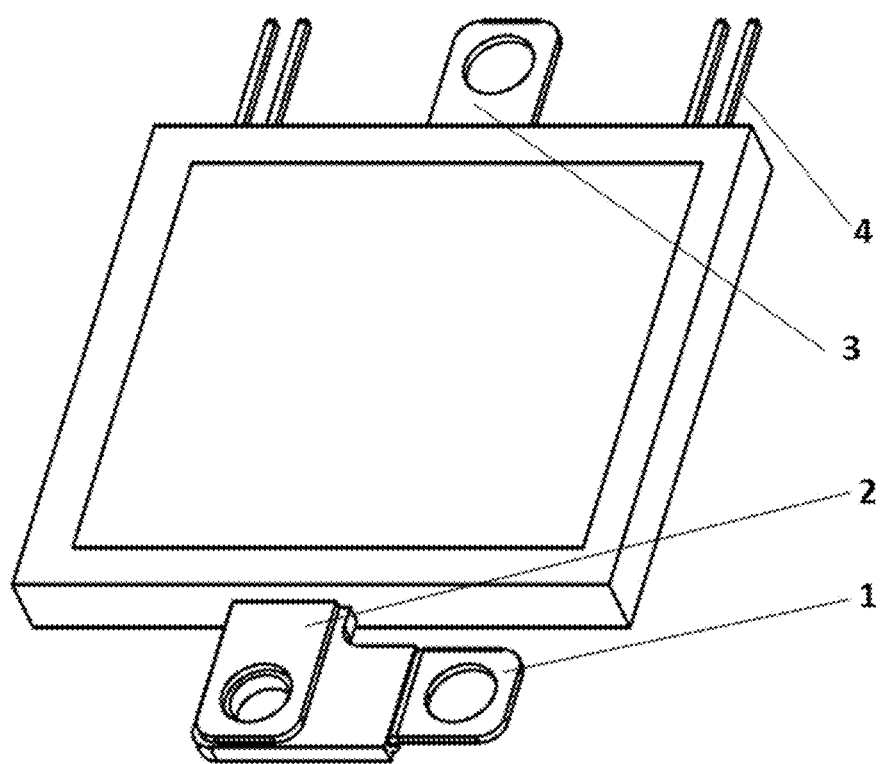
FIG. 15 is an axonometric diagram showing a structure of the half bridge module according to the one embodiment of the present disclosure.
Figure 16:
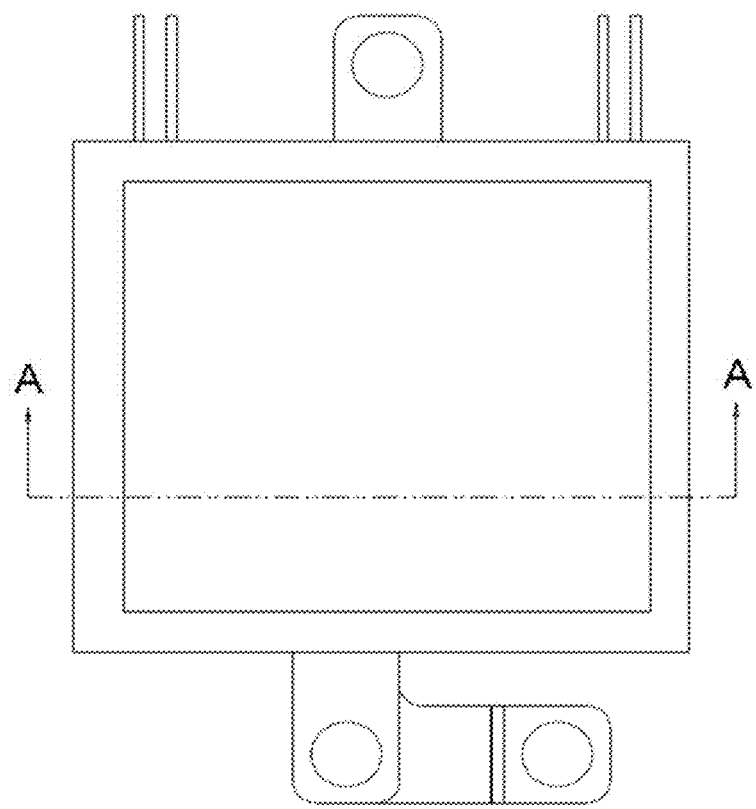
FIG. 16 is a top view showing the structure of half bridge module according to the one embodiment of the present disclosure.
Figure 17:
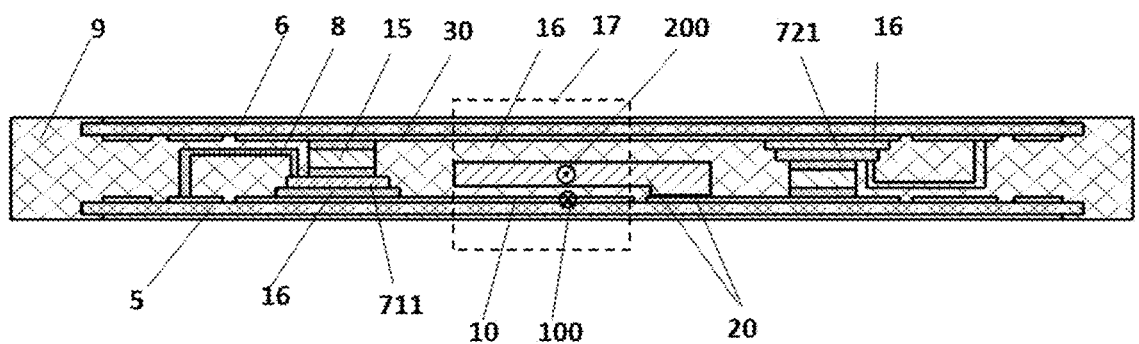
FIG. 17 is a cross-sectional view showing A-A section of the half bridge module in FIG. 16.
Figure 18:
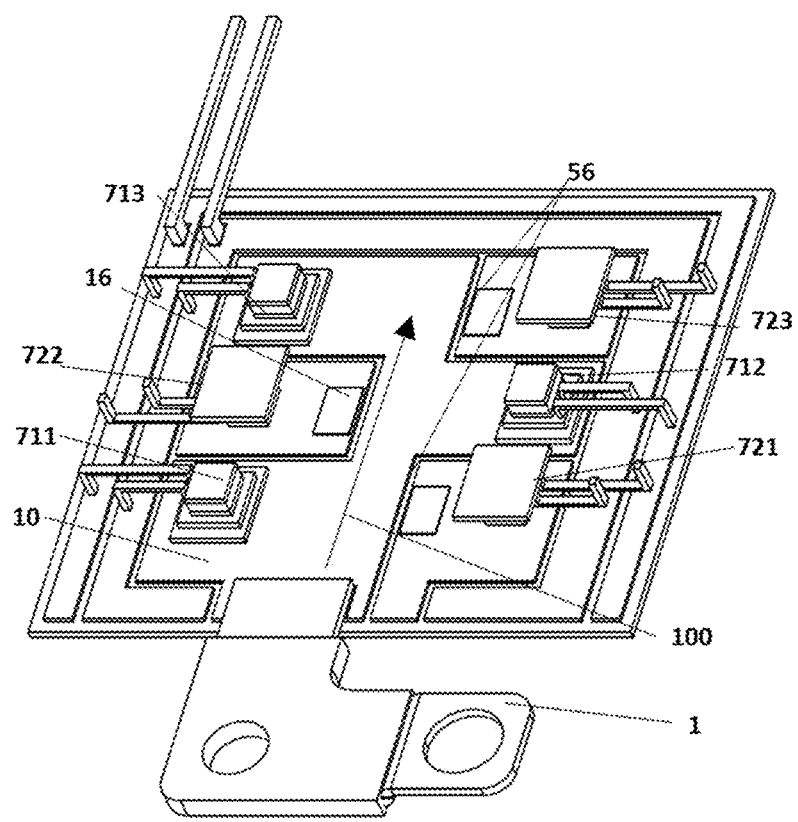
FIG. 18 is a partial structural diagram of the half bridge module according to the one embodiment of the present disclosure, showing switching elements placed at a lower substrate.
Figure 19:
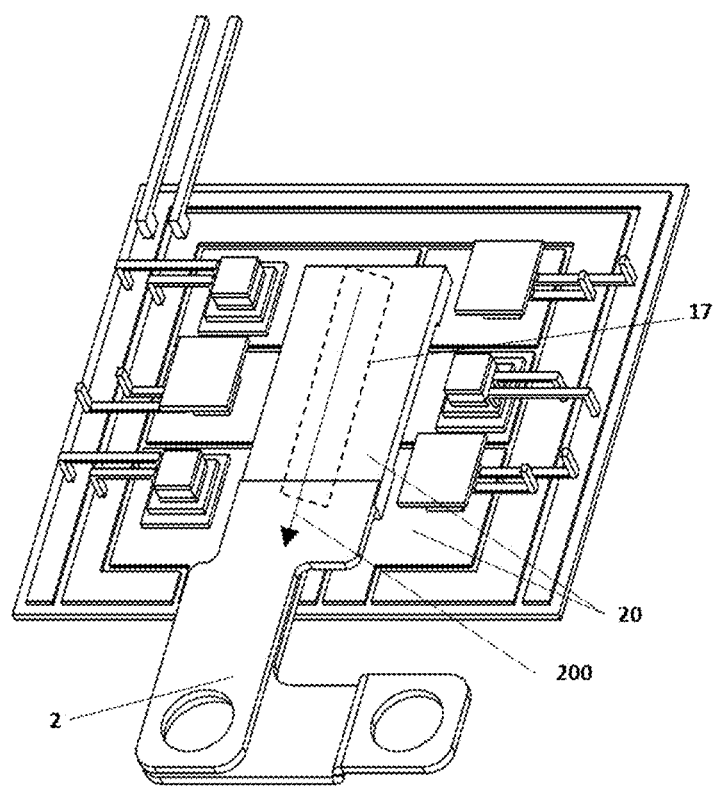
FIG. 19 is a partial structural diagram of the half bridge module according to the one embodiment of the present disclosure, showing the switching elements and a connecting bridge placed at the lower substrate.
Figure 20:
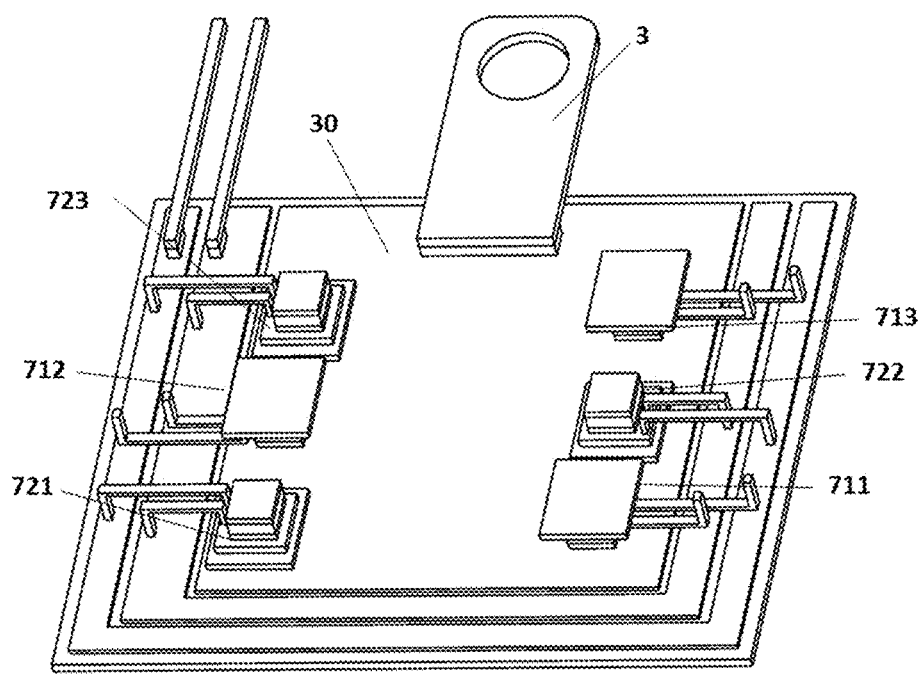
FIG. 20 is a partial structural diagram of the half bridge module according to the one embodiment of the present disclosure, showing a connection structure between the switching elements and an upper substrate.

FIG. 14 is a circuit diagram showing a half bridge module according to a one embodiment of the present disclosure; FIG. 15 is an axonometric diagram showing a structure of the half bridge module according to the one embodiment of the present disclosure; FIG. 16 is a top view showing the structure of half bridge module according to the one embodiment of the present disclosure; FIG. 17 is a cross-sectional view showing A-A section of the half bridge module in FIG. 16; FIG. 18 is a partial structural diagram of the half bridge module according to the one embodiment of the present disclosure, showing switching elements placed at a lower substrate; FIG. 19 is a partial structural diagram of the half bridge module according to the one embodiment of the present disclosure, showing the switching elements and a connecting bridge placed at the lower substrate; and FIG. 20 is a partial structural diagram of the half bridge module according to the one embodiment of the present disclosure, showing a connection structure between the switching elements and an upper substrate.

As shown in FIG. 14 to FIG. 20, the half bridge module in the embodiment is similar to the half bridge module in the one embodiment, and the main difference lies in that the half bridge module includes three upper bridge arm switches and three lower bridge arm switches, and the upper bridge arm switch and the lower bridge arm switch are respectively disposed at different substrates. Specifically, the half bridge module includes a P electrode conductor 10, an N electrode conductor 20, an O electrode conductor 30, three upper bridge arm switches 711, 712 and 713, and three lower bridge arm switches 721, 722 and 723. The projection of the P electrode conductor 10 on the first reference plane and the projection of the N electrode conductor 20 on the first reference plane have a first overlap area. The P electrode conductor 10 is electrically coupled to the first ends of the upper bridge arm switches 711, 712 and 713, the N electrode conductor 20 is electrically coupled to the second ends of the lower bridge arm switches 721, 722 and 723, and the first ends of the lower bridge arm switches 721, 722 and 723 are electrically coupled to the second ends of the upper bridge switches 711, 712 and 713 through the O electrode conductor 30. The projection of the minimum envelope area of the upper bridge switches 711, 712 and 713 on the first reference plane and the projection of the minimum envelope area of the lower bridge switches 721, 722 and 723 on the first reference plane have a second overlap area, and the first overlap area and the second overlap area have an overlap region.

Optionally, the half bridge module includes a lower substrate 5 and an upper substrate 6 that are parallel to each other. The P electrode conductor 10 is a conductive layer disposed at the lower substrate 5, and the O electrode conductor 30 is a conductive layer disposed at the upper substrate 6. The N electrode conductor 20 includes a connecting bridge and a conductive layer disposed at the lower substrate 5, and the connecting bridge may be a sheet metal part. The three upper bridge arm switches are disposed at the P electrode conductor 10 at the lower substrate 5 through the connecting material 16, the three lower bridge arm switches are disposed at the O electrode conductor 30 at the upper substrate 6 through the connecting material 16, and the connecting bridge in the N electrode conductor 20 is located between the upper and lower substrates. The direction of the P electrode current 100 is opposite to the direction of the N electrode current 200, which realizes the function of inductance cancellation well, such that the parasitic inductance of the module is reduced, the reliability of the component is improved, and the turn-off loss of the component is reduced, thus improving the efficiency of the converter.

Optionally, the N electrode connecting bridge includes three protrusions, which are zigzaggedly disposed on the bottom side of the connecting bridge, and are connected to the N electrode conductive layer through the connecting material 16, where the zigzaggedly disposing here means that the three protrusions are not in the same line. The structure of the connecting bridge with a plurality of protrusions can be stably disposed in connecting process of the connecting material, which is simple, and has high connection reliability. In addition, the connecting bridge may be simplified into a sheet metal structure as well, which may reduce processing cost.

Optionally, on the left side of the overlap space 17 vertically corresponding to the first overlap area, the upper bridge arm switch 711, the lower bridge arm switch 722 and the upper bridge arm switching 713 are disposed in sequence from front to back; and on the right side of the overlap space 17, the lower bridge arm switching 721, the upper bridge arm switch 712 and the lower bridge arm switch 723 are disposed in sequence from the front to back. That is, the upper bridge arm switches and the lower bridge switches are interlacedly disposed on both the right side and the left side of the overlap space 17. The thermal paths from the switch to the upper and lower substrates are different. Take the upper bridge arm switch 711 as an example, its back side is a power electrode having the same size as the switch chip and connected to the conductive layer at the lower substrate 5 through the connecting material 16, and its front power electrode is connected to the conductive layer at the upper substrate 6 through the spacer 15 and the connecting material 16. Since the front side of the chip has a control electrode in addition to the power electrode, the size of the spacer 15 is smaller than the chip size. Therefore, the heat-conduction resistance of the chip to the upper substrate 6 is larger than the heat-conduction resistance of the chip to the lower substrate 5. In the embodiment, the sides on each of which only one power electrode of the switch chip is disposed are respectively disposed at the upper and lower substrates through the connection material, thereby the heat dissipation amount difference between the module upper and lower substrate paths may be reduced. Specifically, the upper bridge arm switches 711, 712 and 713 are disposed at the lower substrate 5 through the connection material 16, and the lower bridge arm switches 721, 722 and 723 are disposed at the upper substrate 6 through the connection material 16.

It should be understood that, in other embodiments, a portion of the upper and lower bridge switches may be disposed at the lower substrate and the other portion may be disposed at the upper substrate, or all of the switches may be disposed at the lower substrate or the upper substrate. For example, the upper bridge arm switches are disposed at the O electrode conductor at the upper substrate, and the lower bridge arm switches are disposed at the N electrode conductor at the lower substrate or the like.

Figure 21:
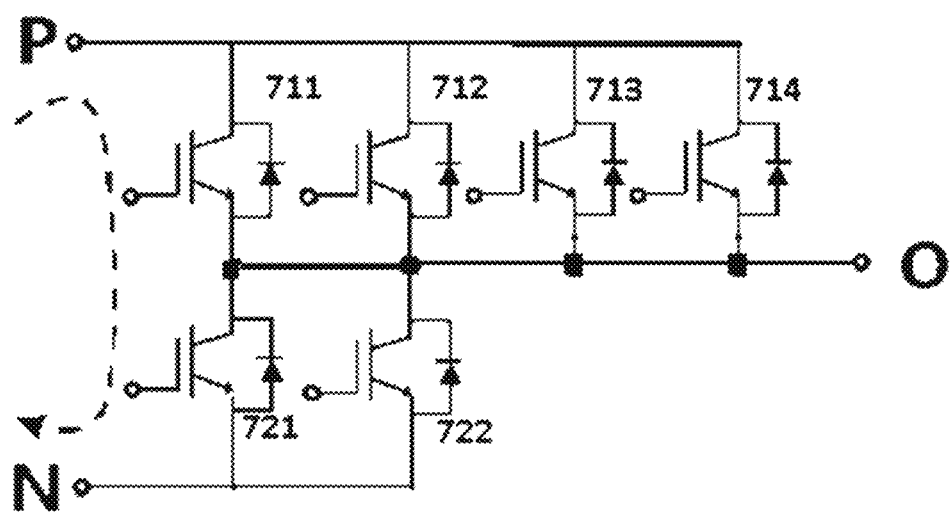
FIG. 21 is a circuit diagram showing a half bridge module according to a one embodiment of the present disclosure.
Figure 22:
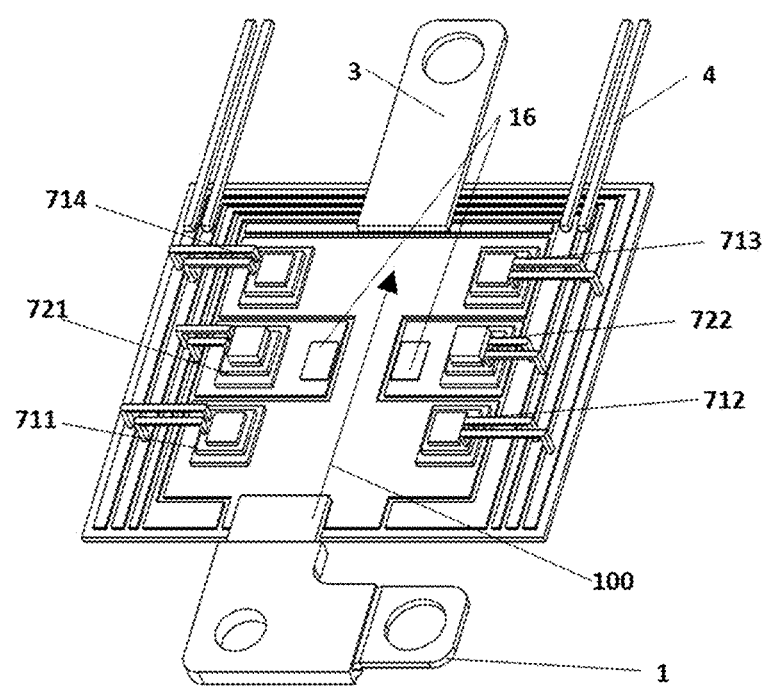
FIG. 22 is a partial structural diagram of the half bridge module according to the one embodiment of the present disclosure, showing switching elements placed at a lower substrate.
Figure 23:
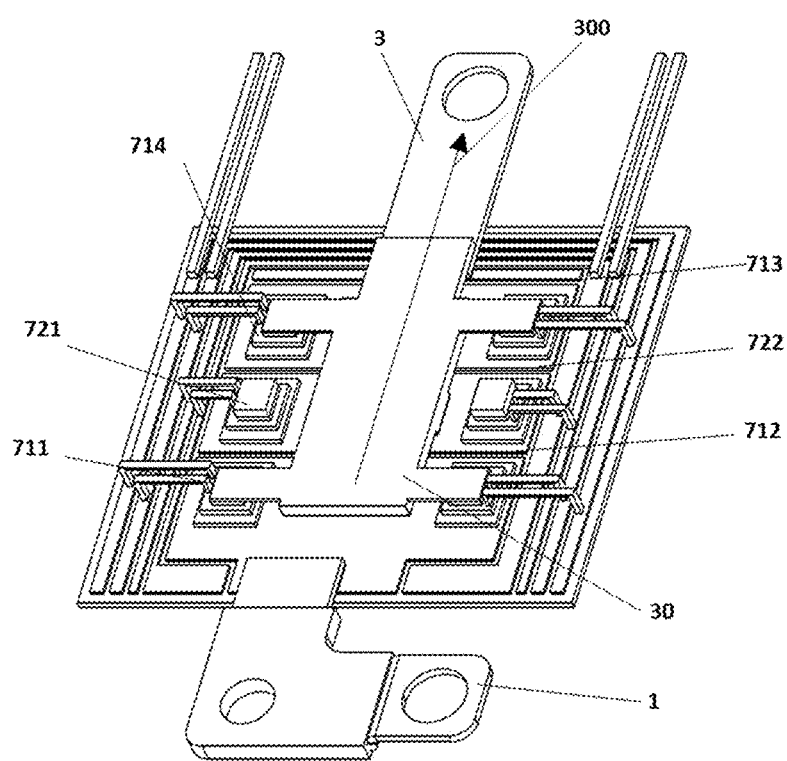
FIG. 23 is a partial structural diagram of a half bridge module according to the one embodiment of the present disclosure, showing the switching elements and a connecting bridge placed at the lower substrate.
Figure 24:
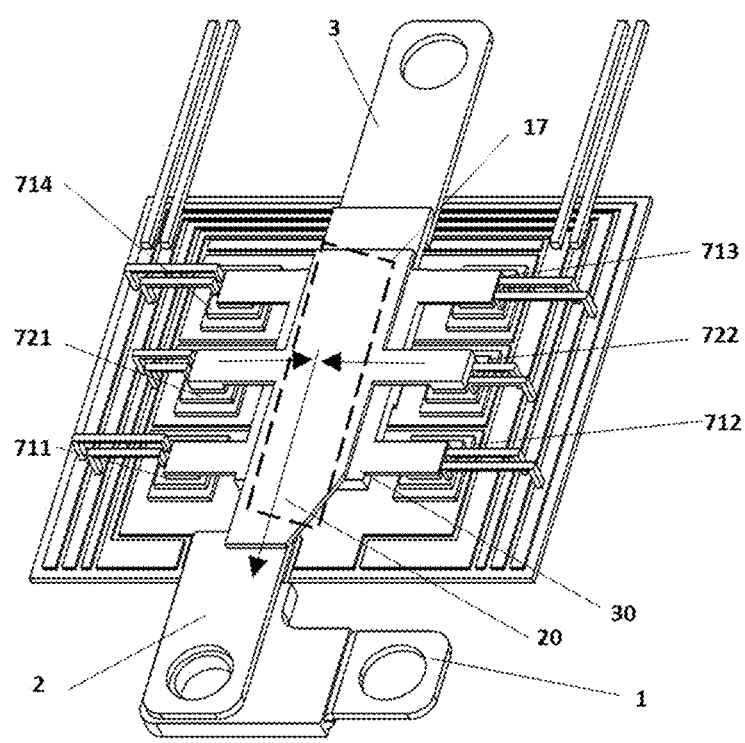
FIG. 24 is a partial structural diagram of a half bridge module according to the one embodiment of the present disclosure, showing the switching elements and two connecting bridges placed at a lower substrate.

FIG. 21 is a circuit diagram showing a half bridge module according to a one embodiment of the present disclosure; FIG. 22 is a partial structural diagram of the half bridge module according to the one embodiment of the present disclosure, showing switching elements placed at a lower substrate; FIG. 23 is a partial structural diagram of a half bridge module according to the one embodiment of the present disclosure, showing the switching elements and a connecting bridge placed at the lower substrate; and FIG. 24 is a partial structural diagram of a half bridge module according to the one embodiment of the present disclosure, showing the switching elements and two connecting bridges placed at a lower substrate.

As shown in FIG. 21 to FIG. 24, the half bridge module in the embodiment is similar to the half bridge module in the one embodiment, and the main difference lies in that the half bridge module includes four upper bridge arm switches, and no upper substrate. Specifically, the half bridge module includes a P electrode conductor 10, an N electrode conductor 20, an O electrode conductor 30, four upper bridge arm switches 711, 712, 713 and 714, and two lower bridge arm switches 721 and 722. The projection of the P electrode conductor 10 on the first reference plane and the projection of the N electrode conductor 20 on the first reference plane have a first overlap area. The P electrode conductor 10 is electrically coupled to the first ends of the upper bridge arm switches 711, 712, 713 and 714, the N electrode conductor 10 is electrically coupled to the second ends of the lower bridge arm switches 721 and 722, and the first ends of the lower bridge arm switches 721 and 722 are electrically coupled to the second ends of the upper bridge switches 711, 712, 713 and 714 through the O electrode conductor 30. The projection of the minimum envelope area of the upper bridge switches 711, 712, 713 and 714 on the first reference plane and the projection of the minimum envelope area of the lower bridge switches 721 and 722 on the first reference plane have a second overlap area, and the first overlap area and the second overlap area have an overlap region.

Optionally, the half bridge module includes a lower substrate 5, the P electrode conductor 10 is a conductive layer disposed at the lower substrate 5, the O electrode conductor 30 includes a connecting bridge and a conductive layer disposed at the lower substrate 5, and the N electrode conductor 20 is a connecting bridge. The four upper bridge arm switches 711, 712, 713 and 714 are commonly disposed at the P electrode conductor 10 through the connecting material 16, and the two lower bridge arm switches 721 and 722 are separately disposed at the conductive layers of the O electrode conductor 30 disposed at the lower substrate 5 respectively. The P electrode current 100 flows from the P electrode terminal 1 into the power module, and the N electrode current 200 flows from the N electrode terminal 2 out of the power module. The directions of the two currents are opposite to each other, which may realize the function of inductance cancellation well, thus reducing the parasitic inductance of the module, improving the reliability of the component, and reducing the turn-off loss of the component, thus improving the efficiency of the converter. In addition, the O electrode current 300 flows form the O electrode terminal 3 out of the power module. At the same time, at the lower surface of each switch, there is a heat dissipation path to the environment, which may realize single-side heat dissipation well. The single-side heat dissipation structure has the advantage of lower cost than that of the double-side heat dissipation, and may be used in a situation where cost requirement is more stringent.

Optionally, on the left side of the overlap space 17 vertically corresponding to the first overlap area, the upper bridge arm switch 711, the lower bridge arm switch 721 and the upper bridge arm switching 714 are disposed in sequence from front to back; and on the right side of the overlap space 17, the upper bridge arm switching 712, the lower bridge arm switch 722 and the upper bridge arm switch 713 are disposed in sequence from the front to back. That is, the upper bridge arm switches and the lower bridge switches are interlacedly disposed on both the right side and the left side of the overlap space 17. Therefore, at the lower substrate 5, the P electrode conductive layer and the O electrode conductive layer are interlacedly disposed, and an L-shaped gap structure is formed between the P electrode conductive layer and the O electrode conductive layer, thereby improving the bending resistance of the lower substrate 5 itself. At the same time, at the P electrode conductive layer and the O electrode conductive layer, no additional conductive island is disposed for the connection between structures, which may save the internal space of the module and improve the electrical performance of related conductive layers.

Optionally, the two protrusions on the bottom side of the O electrode connecting bridge are connected to the O electrode conductive layers at the lower substrate 5 through the connecting material 16. The protrusion structure can be stably disposed in the connecting process of the connecting material 16, which is a simple structure and advantageous for connection process, and has high connection reliability. The two protrusions on the bottom side of the N electrode connecting bridge are connected to the top surface electrodes of the lower bridge arm switches 721 and 722 through the connection material 16, and output the N electrode current 200 through the N electrode terminal 2. The O electrode connecting bridge and the N electrode connecting bridge may be simplified into sheet metal structures as well, which may have low processing cost.

It should be understood that, in other embodiments, the power module may include at least one of the upper substrate and the lower substrate, or may include no substrate.

Figure 25:
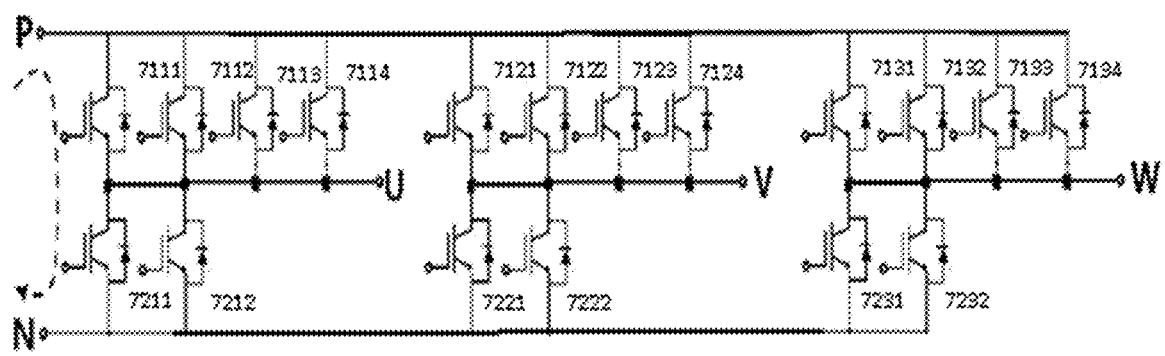
FIG. 25 is a circuit diagram showing a three-phase half bridge module according to a one embodiment of the present disclosure.
Figure 26:
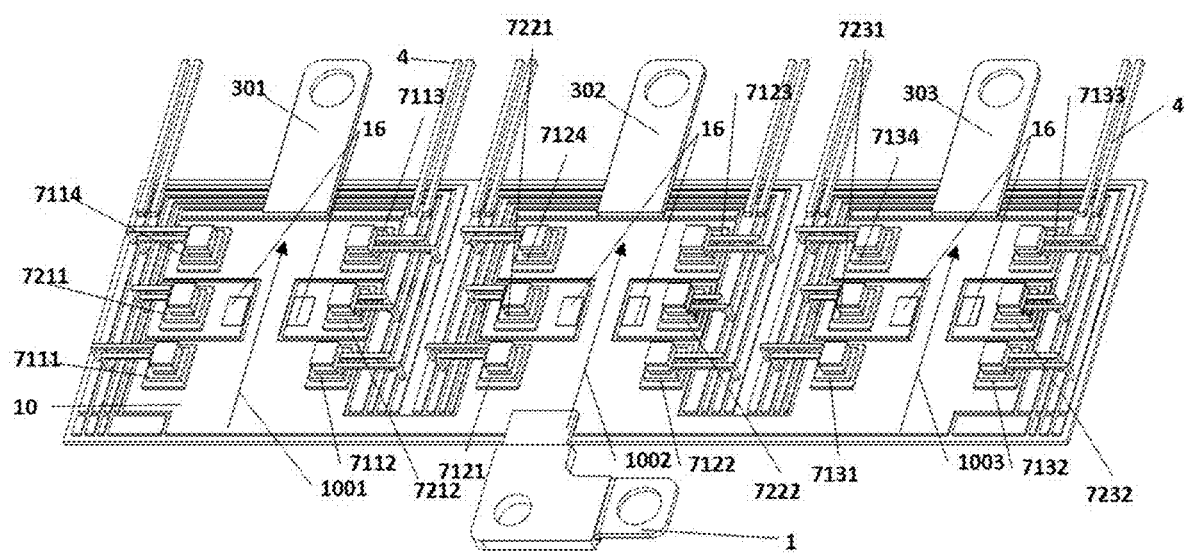
FIG. 26 is a partial structural diagram of the three-phase half bridge module according to the one embodiment of the present disclosure, showing switching elements placed at a lower substrate.
Figure 27:
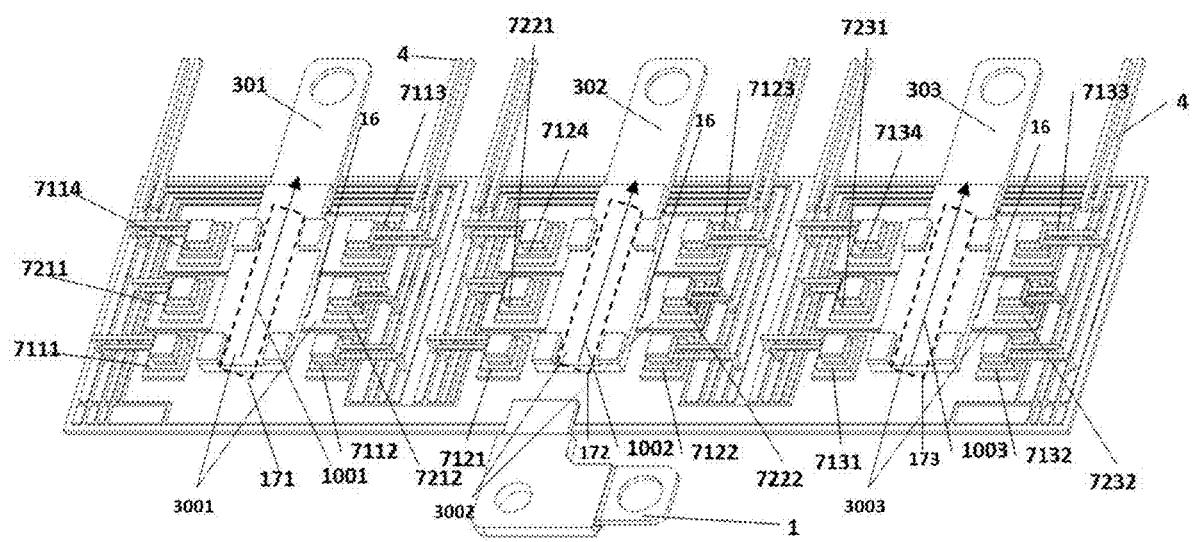
FIG. 27 is a partial structural diagram of the three-phase half bridge module according to the one embodiment of the present disclosure, showing the switching elements and connecting bridges placed at the lower substrate.
Figure 28:
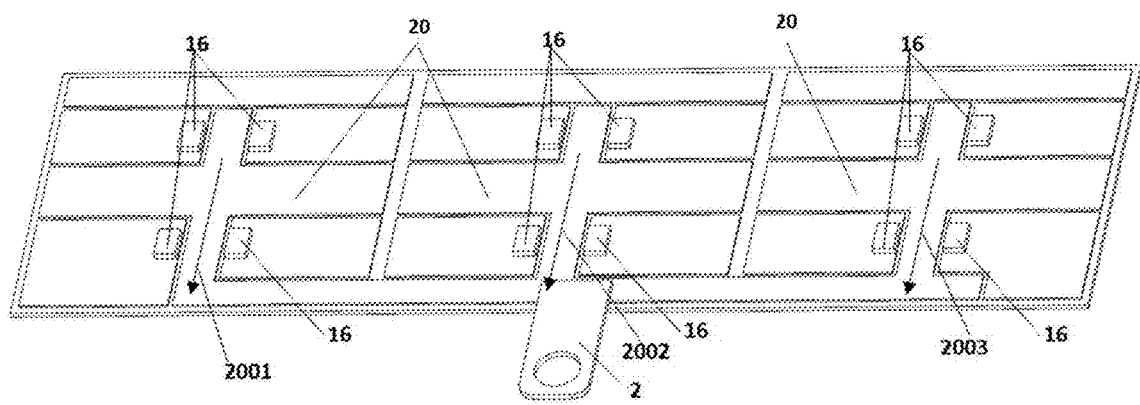
FIG. 28 is a partial structural diagram of the three-phase half bridge module according to the one embodiment of the present disclosure, showing a connection structure between the switching elements and an upper substrate.

FIG. 25 is a circuit diagram showing a three-phase half bridge module according to a one embodiment of the present disclosure. FIG. 26 is a partial structural diagram of the three-phase half bridge module according to the one embodiment of the present disclosure, showing switching elements placed at a lower substrate; FIG. 27 is a partial structural diagram of the three-phase half bridge module according to the one embodiment of the present disclosure, showing the switching elements and connecting bridges placed at the lower substrate; and FIG. 28 is a partial structural diagram of the three-phase half bridge module according to the one embodiment of the present disclosure, showing a connection structure between the switching elements and an upper substrate.

As shown in FIG. 25 to FIG. 28, the half bridge module in the embodiment is similar to the half bridge module in the one embodiment, and the main difference lies in that the power module is a three-phase half-bridge module, and each phase of half-bridge module includes four upper bridge arm switches and two lower bridge arm switches. Specifically, the three-phase half-bridge module includes a P electrode conductor 10, an N electrode conductor 20, a U-phase O electrode conductor 3001, a V-phase O electrode conductor 3002 and a W-phase O electrode conductor 3003. The U-phase half bridge includes four upper bridge arm switches 7111, 7112, 7113 and 7114 and two lower bridge arm switches 7211 and 7212, the V-phase half bridge includes four upper bridge arm switches 7121, 7122, 7123 and 7124 and two lower bridge arm switches 7221 and 7222, and the W-phase half bridge includes four upper bridge arm switches 7131, 7132, 7133 and 7134 and two lower bridge arm switches 7231 and 7232. The P electrode conductor 10 is electrically coupled to the first ends of the upper bridge arm switches 7111, 7112, 7113, 7114, 7121, 7122, 7123, 7124, 7131, 7132, 7133 and 7134; the N electrode conductor 20 is electrically coupled to the second ends of the lower bridge arm switches 7211, 7212, 7221, 7222, 7231 and 7232; the first ends of the lower bridge arm switches 7211 and 7212 of the U-phase half bridge are electrically coupled to the second ends of the upper bridge arm switches 7111, 7112, 7113 and 7114 through the U-phase O electrode conductor 3001, the first ends of the lower bridge arm switches 7221 and 7222 of the V-phase half bridge are electrically coupled to the second ends of the upper bridge switches 7121, 7122, 7123 and 7124 through the V-phase O electrode conductor 3002, and the first ends of the lower bridge arm switches 7231 and 7232 of the W-phase half bridge are electrically coupled to the second ends of the upper bridge arm switches 7131, 7132, 7133 and 7134 through the W-phase O electrode conductor 3003. In each phase of half bridge, the projection of the P electrode conductor 10 on the first reference plane and the projection of the N electrode conductor 20 on the first reference plane have a first overlap area, the projection of the minimum envelope area of the upper bridge switches on the first reference plane and the projection of the minimum envelope area of the lower bridge switches on the first reference plane have a second overlap area, and the first overlap area and the second overlap area have an overlap region.

Optionally, the P electrode conductor 10, the N electrode conductor 20, the U-phase O electrode conductor 3001, the V-phase O electrode conductor 3002 and the W-phase O electrode conductor 3003 are electrically connected to the P electrode terminal 1, the N electrode terminal 2, the-U phase O the-terminal 301, the V-phase O electrode terminal 302 and the W-phase O electrode terminal 303 respectively. The three-phase half-bridge module includes a lower substrate 5 and an upper substrate 6 which are parallel to each other, the P electrode conductor 10 is a conductive layer disposed at the lower substrate 5, and the N electrode conductor 20 is a conductive layer disposed at the upper substrate 6, each of the U-phase O electrode conductor 3001, the V-phase O electrode conductor 3002 and the W-phase O electrode conductor 3003 includes a connecting bridge and a conductive layer disposed at the lower substrate 5. All of the upper bridge arm switches are commonly disposed at the P electrode conductor 10, and the lower bridge arm switches are separately disposed at the conductive layers of the corresponding O electrode conductor. In the U-phase half-bridge, the direction of the U-phase P electrode current 1001 is opposite to that of the U-phase N electrode current 2001; in the V-phase half-bridge, the direction of the V-phase P electrode current 1002 is opposite to that of the V-phase N-level current 2002, and in the W-phase half-bridge, the direction of the W-phase P electrode current 1002 is opposite to that of the W-phase N-level current 2002. In this way, the function of inductance cancellation is realized well, such that the parasitic inductance of the module may be reduced, the reliability of the component may be improved, and the turn-off loss of the component may be reduced, thus improving the efficiency of the converter. In addition, there are heat dissipation paths on both the upper and lower surfaces of the switches that can exchange heat with the environment, which may realize effective double-side heat dissipation.

Optionally, the first overlap area of the U-phase corresponds to the U-phase overlap space 171, the first overlap area of the V-phase corresponds to the V-phase overlap space 172, and the first overlap area of the W-phase corresponds to the W-phase overlap space 173. The U-phase half-bridge, the V-phase half-bridge, and the W-phase half-bridge are disposed in a horizontal linear manner. In the U-phase half bridge, on the left side of the U-phase overlap space 171, the upper bridge arm switch 7111, the lower bridge arm switch 7211 and the upper bridge switch 7114 are disposed in sequence from front to back; and on the right side of the U-phase overlap space 171, the upper bridge arm switch 7112, the lower bridge arm switch 7212 and the upper bridge switch 7113 are disposed in sequence from the front to back. In the V-phase half bridge, on the left side of the V-phase overlap space 172, the upper bridge arm switch 7121, the lower bridge arm switch 7221 and the upper bridge switch 7124 are disposed in sequence from the front to back; and on the right side of the V-phase overlap space 172, the upper bridge arm switch 7122, the lower bridge arm switch 7222 and the upper bridge switch 7123 are disposed in sequence from the front to back. In the W-phase half bridge, on the left side of the W-phase overlap space 173, the upper bridge arm switch 7131, the lower bridge arm switch 7231 and the upper bridge switch 7134 are disposed in sequence from the front to back; and on the right side of the W-phase overlap space 173, the upper bridge arm switch 7132, the lower bridge aim switch 7232 and the upper bridge arm switch 7133 are disposed in sequence from the front to back. That is, in each phase of the half bridge, the upper bridge arm switches and the lower bridge arm switches are all interlacedly disposed on both the left and right sides of the overlap space.

The thermal paths from the switch to the upper and lower substrates are different, and in partial operating mode of the power module, the total power losses of the upper bridge arm switch and the lower bridge arm switch may be different, so the lower substrate portions corresponding to the respective upper bridge arm switches and lower bridge arm switches have temperature differences. The interlaced disposing of the upper bridge arm switches and the lower bridge arm switches may reduce the thermal resistance of the power component with highest junction temperature in the power module, thereby uniformly dissipating heat and reducing the thermal resistance of the module. It should be noted that in other embodiments, the power module may include N phases of half bridges, and N is an integer greater than or equal to 2, and the number and arrangement of the switches in each phase of the half bridges may be the same or different.

Figure 29:
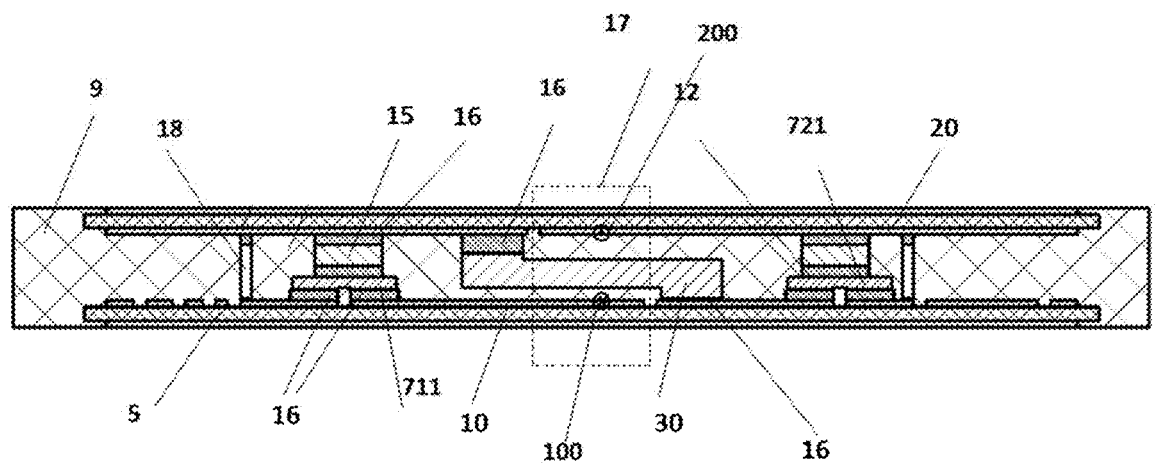
FIG. 29 is a cross-sectional view showing a structure of a half bridge module according to a one embodiment of the present disclosure, wherein switching elements are planar power components.

FIG. 29 is a cross-sectional view showing a structure of a half bridge module according to a one embodiment of the present disclosure, wherein switching elements are planar power components. As shown in FIG. 29, the half bridge module in the embodiment is similar to the half bridge module in the one embodiment, FIG. 29 is similar to FIG. 5 in the one embodiment, the main difference lies in that the switches in the one embodiment are vertical components, and the switches in this embodiment are planar components.

Optionally, both the upper bridge arm switch 711 and the lower bridge arm switch 721 are planar components, such as GaN components. The power electrode of such component is fanned out from one side of the chip, the side from which the power electrode is led out is called the electrode layer, and the side opposite to the electrode layer is called the electrodeless (no electrode) layer. The electrode layer of the switch is connected to the substrate by connection material such as solder material, and then the electrical connection between the lower substrate 5 and the upper substrate 6 is realized by connecting pillars 18.

It should be understood that, in other embodiments, the electrodeless layer of the switch may be connected to the substrate. The switches in the one embodiment to the one embodiment may partially or all adopt the planar power components as well, other structures thereof are maintained.

Figure 30:
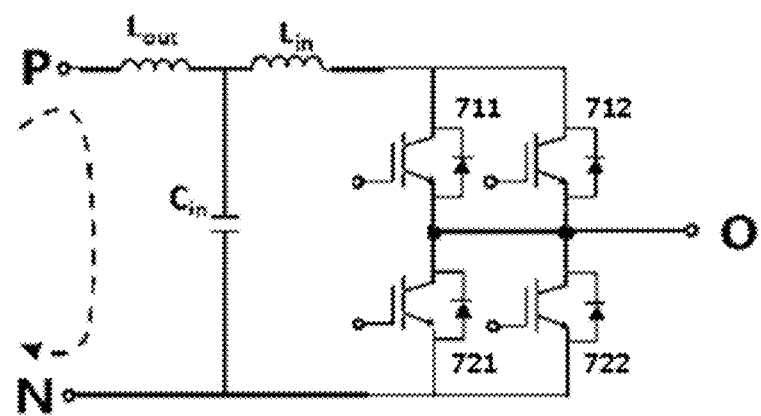
FIG. 30 is an equivalent circuit diagram showing a half bridge module with a clamping capacitor according to a one embodiment of the present disclosure.
Figure 31:
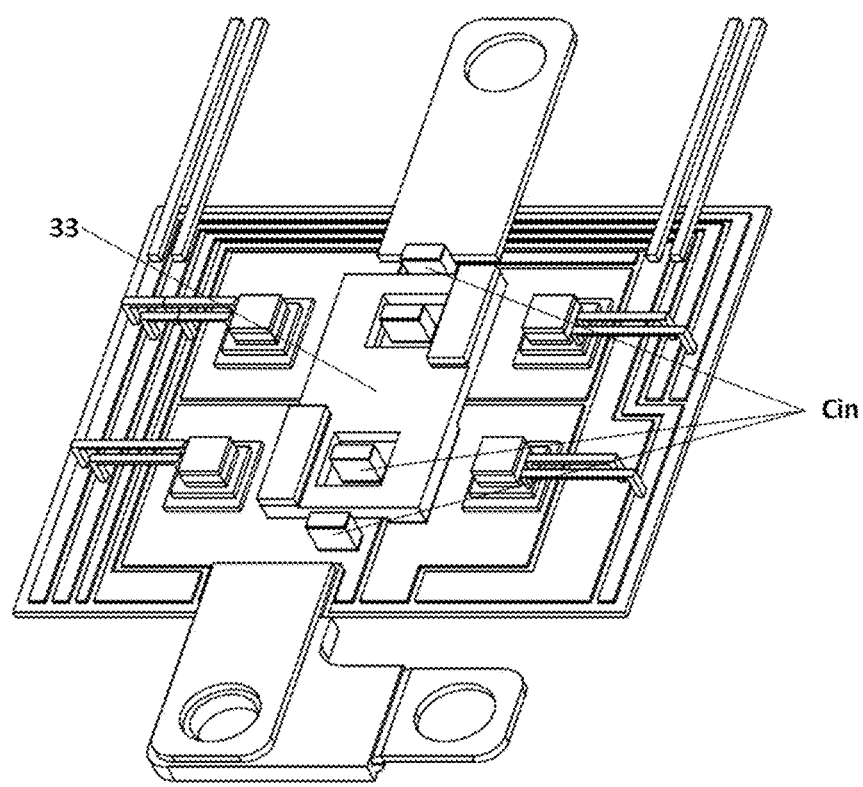
FIG. 31 is a schematic structural diagram showing the half bridge module with the clamping capacitor according to the one embodiment of the present disclosure.

FIG. 30 is an equivalent circuit diagram showing a half bridge module with a clamping capacitor according to a one embodiment of the present disclosure; and FIG. 31 is a schematic structural diagram showing the half bridge module with the clamping capacitor according to the one embodiment of the present disclosure. As shown in FIG. 30 and FIG. 31, the half bridge module in the embodiment is similar to the half bridge module in the one embodiment, and the main difference lies in that the half bridge module in the embodiment further includes a clamping capacitor Cin.

Optionally, the clamping capacitor Cin is disposed between the upper and lower substrates, one end of the clamping capacitor Cin is electrically coupled to the P electrode conductor 10, and the other end of the clamping capacitor Cin is electrically coupled to the N electrode conductor 20. The clamping capacitor Cin is disposed in the power module, thus, when the component is turned off, the area surrounded by the corresponding high-frequency loop may be reduced, thus the parasitic inductance of the loop may be decreased. Specifically, if there is no clamping capacitor Cin disposed in the module, the parasitic inductance value of the loop is Lout+Lin, while, if the clamping capacitor Cin is disposed in the module, the parasitic inductance value of the loop becomes to be Lin, and thus the inductance value decreases.

It should be understood that, the clamp capacitors Cin may be disposed at the front and back ends of the connecting bridge 33, or may be disposed to pass the through holes in the connecting bridge 33. The set position of the clamp capacitor Cin is not limited in the present disclosure.

Figure 32:
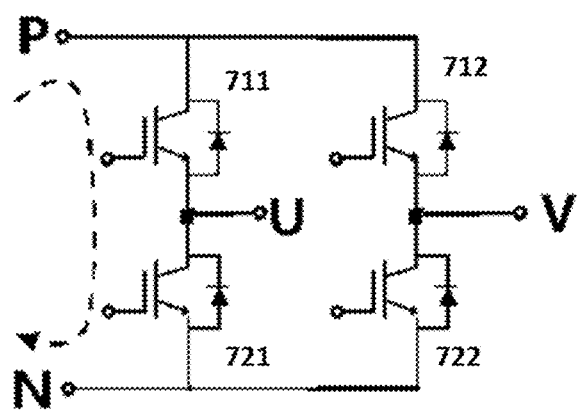
FIG. 32 is a circuit diagram showing a two-phase half bridge module according to an one embodiment of the present disclosure.
Figure 33:
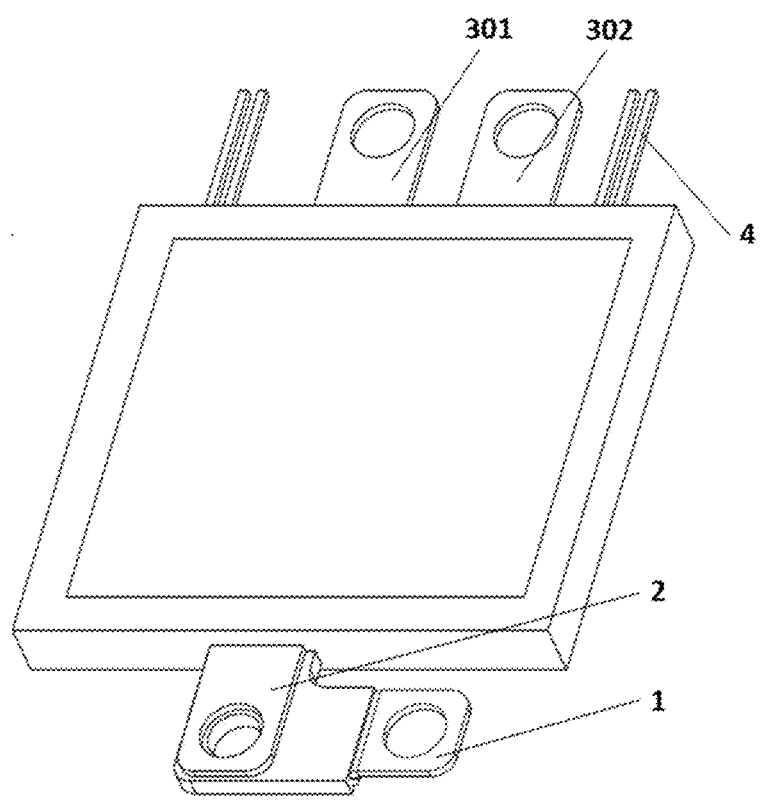
FIG. 33 is an axonometric diagram showing a structure of the two-phase half bridge module according to the one embodiment of the present disclosure.
Figure 34:
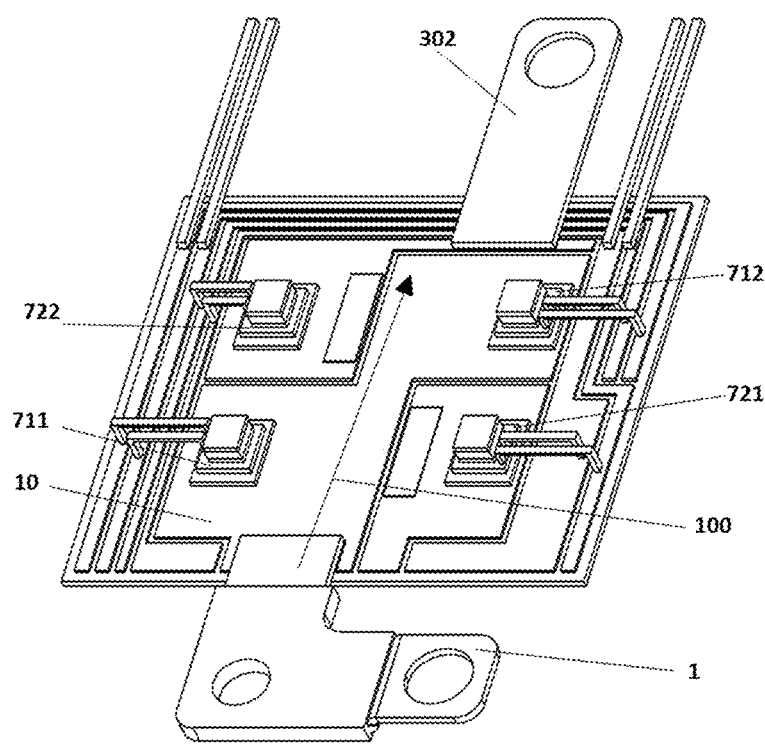
FIG. 34 is a partial structural diagram of the two-phase half bridge module according to the one embodiment of the present disclosure, showing switching elements placed at a lower substrate.
Figure 35:
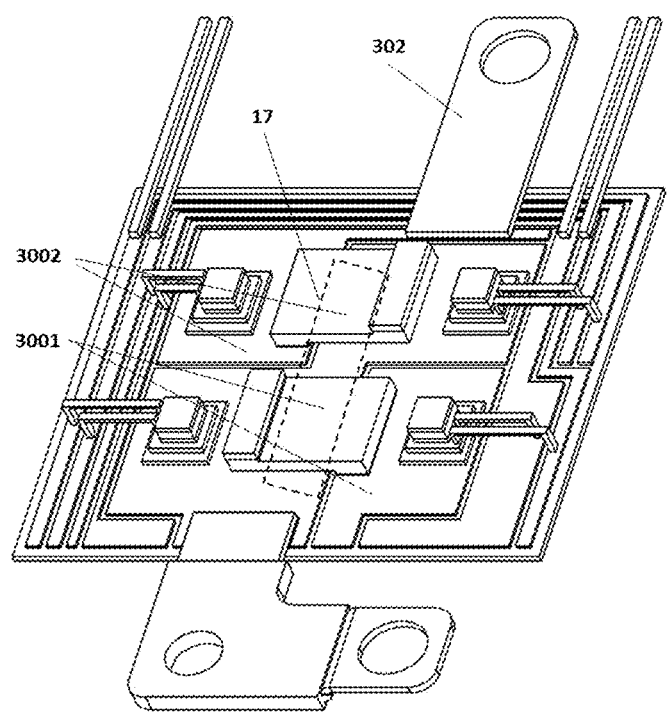
FIG. 35 is a partial structural diagram of the two-phase half bridge module according to the one embodiment of the present disclosure, showing the switching elements and a connecting bridge placed at the lower substrate.
Figure 36:
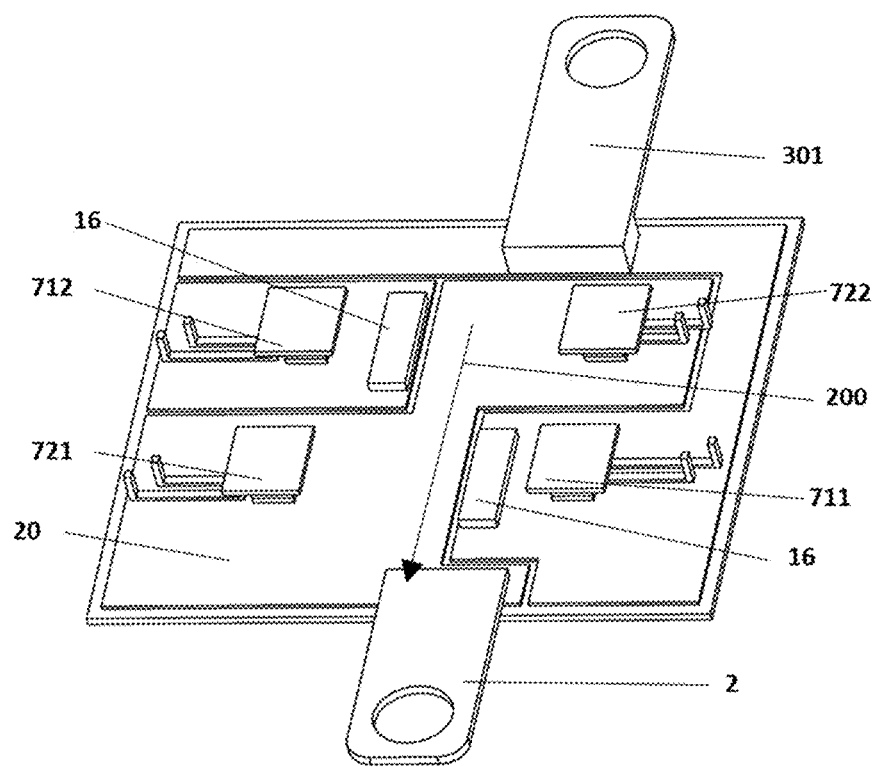
FIG. 36 is a partial structural diagram of the two-phase half bridge module according to the one embodiment of the present disclosure, showing a connection structure between the switching elements and an upper substrate.

FIG. 32 is a circuit diagram showing a two-phase half bridge module according to an one embodiment of the present disclosure; FIG. 33 is an axonometric diagram showing a structure of the two-phase half bridge module according to the one embodiment of the present disclosure; FIG. 34 is a partial structural diagram of the two-phase half bridge module according to the one embodiment of the present disclosure, showing switching elements placed at a lower substrate; FIG. 35 is a partial structural diagram of the two-phase half bridge module according to the one embodiment of the present disclosure, showing the switching elements and a connecting bridge placed at the lower substrate; and FIG. 36 is a partial structural diagram of the two-phase half bridge module according to the one embodiment of the present disclosure, showing a connection structure between the switching elements and an upper substrate.

As shown in FIG. 32 to FIG. 36, the half bridge module in the embodiment is similar to the half bridge module in the one embodiment, and the main difference lies in that the half bridge module in the embodiment is a two-phase half bridge module. Specifically, the two-phase half bridge module includes a P electrode conductor 10, an N electrode conductor 20, a U-phase O electrode conductor 3001, a V-phase O electrode conductor 3002, two upper bridge arm switches 711 and 712, and two lower arm switches 721 and 722. The P electrode conductor 10 is electrically coupled to the first ends of the upper bridge arm switches 711 and 712; the N electrode conductor 20 is electrically coupled to the second ends of the lower bridge arm switches 721 and 722; the first end of the lower arm switch 721 is electrically coupled to the second end of the upper arm switch 711 through the U-phase O electrode conductor 3001, and the first end of the lower bridge arm switch 722 is electrically coupled to the second end of the upper bridge arm switch 712 through the V-phase O electrode conductor 3002. The projection of the P electrode conductor 10 on the first reference plane and the projection of the N electrode conductor 20 on the first reference plane have a first overlap area; the projection of the minimum envelope area of the upper bridge switches 711 and 712 on the first reference plane and the projection of the minimum envelope area of the lower bridge switches 721 and 722 on the first reference plane have a second overlap area, and the first overlap area and the second overlap area have an overlap region.

Optionally, the P electrode conductor 10, the N electrode conductor 20, the U-phase O electrode conductor 3001 and the V-phase O electrode conductor 3002 are electrically connected to the P electrode terminal 1, the N electrode terminal 2, the U-phase O electrode terminal 301 and the V-phase O electrode terminal 302 respectively. The two-phase half-bridge module further includes a lower substrate 5 and an upper substrate 6 which are parallel to each other, wherein the P electrode conductor 10 is a conductive layer disposed at the lower substrate 5, and the N electrode conductor 20 is a conductive layer disposed at the upper substrate 6. Each of the U-phase O electrode conductor 3001 and the V-phase O electrode conductor 3002 includes a connecting bridge and conductive layers disposed at the upper and lower substrates. The two upper bridge arm switches 711 and 712 are commonly disposed on the P electrode conductor 10; the lower bridge arm switch 721 is separately disposed at the conductive layer of the U-phase O electrode conductor 3001 at the lower substrate 5, and the lower bridge arm switch 722 is separately disposed at the conductive layer of the V-phase O electrode conductor 3002 at the lower substrate 5. The P electrode current 100 flows from the P electrode terminal 1 into the power module and the N electrode current 200 flows from the N-pole terminal 2 out of the power module, and directions of the two currents are opposite to each other, such that the inductance cancellation effect may be realized well, the parasitic inductance of the power module may be reduced, the reliability of the power device nay be improved, and the power component turn-off loss may be reduced, thus improving converter efficiency. In addition, there are heat dissipation paths on both the upper and lower surfaces of the switch that can exchange heat with the environment, which may realize effective double side heat dissipation.

Similar to the one embodiment, the upper bridge arm switches and the lower bridge switches in the two-phase half bridge module are interlacedly disposed, so that the heat source may be uniformly disposed, thereby effectively eliminating hot spots, reducing heat transfer resistance between the switch with larger heat generation and the environment, and then improving the heat dissipation performance of the power module. Each connecting bridge in both the U-phase O electrode conductor 3001 and the V-phase O electrode conductor 3002 includes a protrusion structure on the bottom and a protrusion structure on the top. The protrusion structure on the bottom is connected to the conductive layer at the lower substrate 5 through the connecting material 16, and the protrusion structure on the top is connected to the conductive layer at the upper substrate 6 through the connecting material 16. A plurality of the protrusion structures of the connecting bridge 33 can be stably disposed in connecting process of the connecting material, which is a simple structure and advantageous for connection process, and has high connection reliability. In addition, the connecting bridges 33 may be simplified into sheet metal structures as well, which may have low processing cost. In addition, the upper bridge arm switches and the lower bridge arm switches are interlacedly disposed, such that the conductive layers on the lower substrate 5 and the upper substrate 6 are interlacedly disposed to form L-shaped gap structures on both the upper and lower substrates. Such structures avoid the defect that a partial in-line-shaped gap structure has weak bending resistance, thus improving the bending resistance of the upper and lower substrates themselves.

It should be understood that, in the above embodiments, there is a column of switches disposed linearly on each of the left and right sides of the overlap space, and the number of switches in each column is two or three. However, in other embodiments, according to the requirement of the current capacity, the left side of the overlap space may have a plurality of columns of switches disposed, the right side of the overlap space may have a plurality of columns of switches disposed as well, the number of switches in each column may be any number, and the arrangement of each column of switches is not limited to strict linearity.

Figure 37:
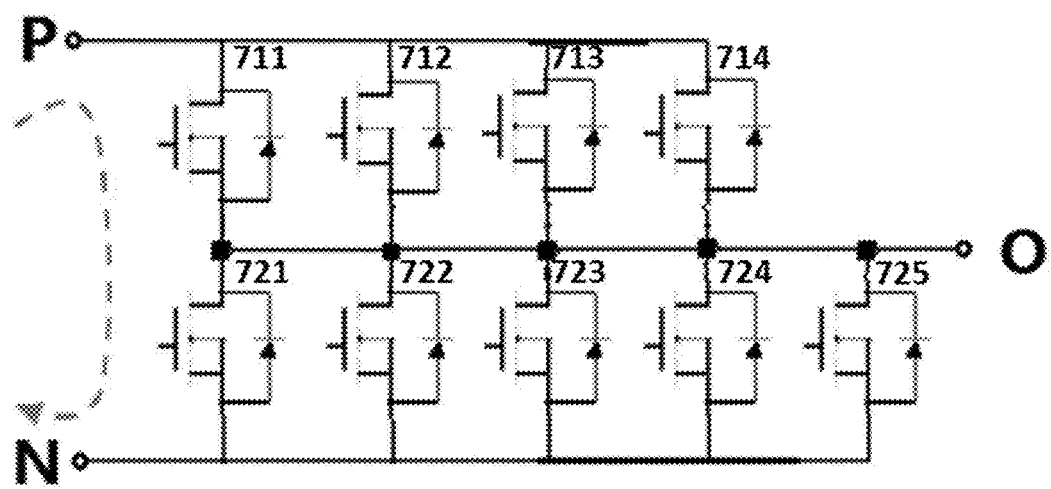
FIG. 37 is a circuit diagram showing a half bridge module according to a one embodiment of the present disclosure.
Figure 38:
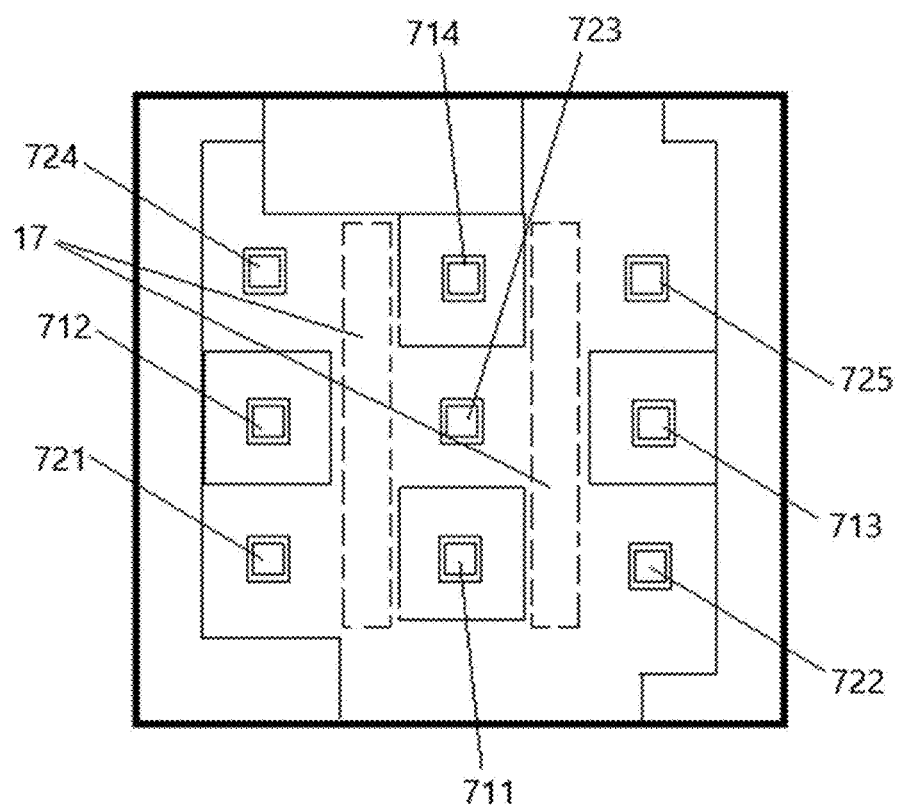
FIG. 38 is a partial structural diagram showing the half bridge module according to the one embodiment of the present disclosure.
Figure 39:
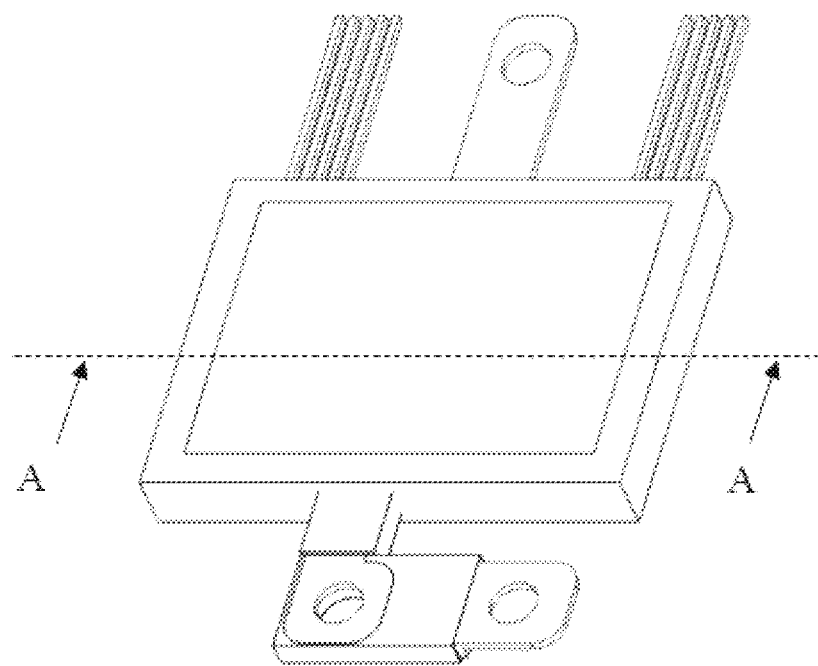
FIG. 39 shows a schematic view of a packaged power module structure of one embodiment of the present disclosure.

FIG. 37 is a circuit diagram showing a half bridge module according to a one embodiment of the present disclosure; and FIG. 38 is a partial structural diagram showing the half bridge module according to the one embodiment of the present disclosure. As shown in FIG. 37 and FIG. 38, the half bridge module in the embodiment is similar to the half bridge module in the one embodiment, and the main difference lies in that the half bridge module includes four upper bridge arm switches and five lower bridge arm switches. Specifically, the half bridge module includes a P electrode conductor, an N electrode conductor, an O electrode conductor, four upper bridge arm switches 711, 712, 713 and 714, and five lower bridge arm switches 721, 722, 723, 724 and 725. The projection of the P electrode conductor on the first reference plane and the projection of the N electrode conductor on the first reference plane have two first overlap areas. The P electrode conductor is electrically coupled to the first ends of the upper bridge arm switches 711, 712, 713 and 714, the N electrode conductor is electrically coupled to the second ends of the lower bridge arm switches 721, 722, 723, 724 and 725, and the first ends of the lower bridge arm switches 721, 722, 723, 724 and 725 are electrically coupled to the second ends of the upper bridge switches 711, 712, 713 and 714 through the O electrode conductor. The projection of the minimum envelope area of the upper bridge switches 711, 712, 713 and 714 on the first reference plane and the projection of the minimum envelope area of the lower bridge switches 721, 722, 723, 724 and 725 on the first reference plane have a second overlap area, and each of the first overlap area and the second overlap area have overlap space.

Optionally, as shown in FIG. 38, the two first overlap areas vertically correspond to two overlap space 17, the nine switches are disposed in a 3*3 array, and the first column of switches, the first overlap space, the second column of switches, the second overlap space and the third column of switches are disposed in sequence from left to right. The first column of switches are the lower bridge arm switch 721, the upper bridge switch 712 and the lower bridge switch 724 disposed in sequence from front to back, the second column of switches are the upper bridge arm switch 711, the lower bridge switch 723 and the upper bridge switch 714 disposed in sequence from the front to back, and the third column of switches are the lower bridge arm switch 722, the upper bridge switch 713 and the lower bridge switch 725 disposed in sequence from the front to back. That is, the upper bridge arm switches and the lower bridge arm switches are interlacedly disposed on both the left and right sides of any one of the overlap space 17, such that the heat sources can be evenly distributed and the parasitic inductance of the module can be reduced.

It should be understood that, in other embodiments, the present disclosure may further expand the switches laterally and longitudinally according to the size and power requirements of the power module.

The present disclosure provides a power module structure includes a first metal layer disposed on a first reference plane; a second metal layer disposed on the first reference plane, wherein the second metal layer is adjacent to the first metal layer; a third metal layer disposed on a second reference plane, wherein the second reference plane is parallel to the first reference plane; a fourth metal layer disposed on the second reference plane, wherein the fourth metal layer is adjacent to the third metal layer and is connected to the second metal layer via a connecting bridge; at least one first switch including a first end connected to the third metal layer and a second end connected to the second metal layer; and at least one second switch including a third end connected to the fourth metal layer and a fourth end connected to the first metal layer. In order to reduce the inductance of the power module, the projection of the first metal layer and the projection of the third metal layer are overlapped on the first reference plane or on the second reference plane to form a first overlapping area. The direction of the current flowing through the first metal layer is opposite to the direction of the current flowing through the third metal layer. Therefore, the stray inductance of the power module is then reduced as well.

As shown in FIGS. 1, 39 to 67, in some embodiments, a first metal layer 41 is a metal layer electrically connected to an N pole. A second metal layer 42 and a fourth metal layer 44 are metal layers electrically connected to an O pole. A third metal layer 43 is a metal layer electrically connected to a P pole. In this embodiment, the P pole presents a positive electrode of a direct current (DC) bus. The N pole presents a negative electrode of the DC bus. The O pole presents an output electrode of the power module. A first power terminal 931 is a P pole power terminal and a second power terminal 932 is an N pole power terminal. A third power terminal 933 is a O pole power terminal. However, the present disclosure is not limited thereto.

In this embodiment, a projection, projected on the first reference plane or projected on the second reference plane, of a connecting area of the first metal layer 41 and the second power terminal 932 is overlapped with a projection, projected on the first reference plane or projected on the second reference plane, of a connecting area of the third metal layer 43 and the first power terminal 931.

FIG. 39 to FIG. 43 shows a schematic view of a power module structure of a one embodiment of the present disclosure. In this embodiment, the power module structure includes a first substrate 21 parallel to a second substrate 22. Power components 28 are disposed between the two substrates. In this embodiment, the quantity of the power components 28 is not limited thereto. In some embodiments, the power components 28 include three first switches 281 and three second switches 282. A first power terminal 931 is connected to the first end of the first switch 281. A second power terminal 932 is electrically connected to the fourth end of the second switch 282. The second end of the first switch 281 is electrically connected to the third end of the second switch 282. The second end of the first switch 281 and the third end of the second switch 282 both are then electrically connected to the third power terminal 933. A signal terminal 23 is connected, via bonding wires 24, to a signal end of the power component 28. Moreover, projections, projected on the plane where the first substrate 21 or the second substrate 22 is located, of the components 28 are not overlapped with each other. Therefore, the components 28 are tile arranged between the first substrate 21 and the second substrate 22, such that the components 28 do not overlapped with each other.

Figure 41:
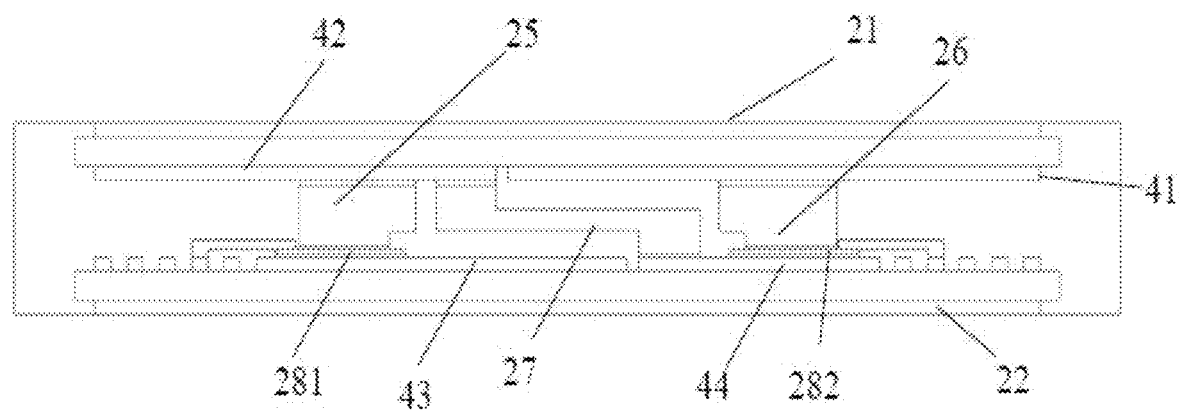
FIG. 41 shows a schematic cross-sectional view alone AA line of the packaged power module structure in FIG. 39.

As shown in FIG. 41, the power module structure includes the first substrate 21 presented as an upper substrate, wherein a lower surface of the first substrate 21 is presented as the first reference plane. The second substrate 22 is presented as a lower substrate, wherein an upper surface of the second substrate 22 is presented as the second reference plane. The first metal layer 41 and the second metal layer 42 are adjacently disposed on the first reference plane. The third metal layer 43 and the fourth metal layer 44 are adjacently disposed on the second reference plane. Moreover, the second metal layer 42 is connected to the fourth metal layer 44 via a connecting bridge 27. As shown in FIG. 41, the connecting bridge 27 is a connecting bridge with irregular shape which is configured to connect the second metal layer 42 and the fourth metal layer 44.

Figure 43:
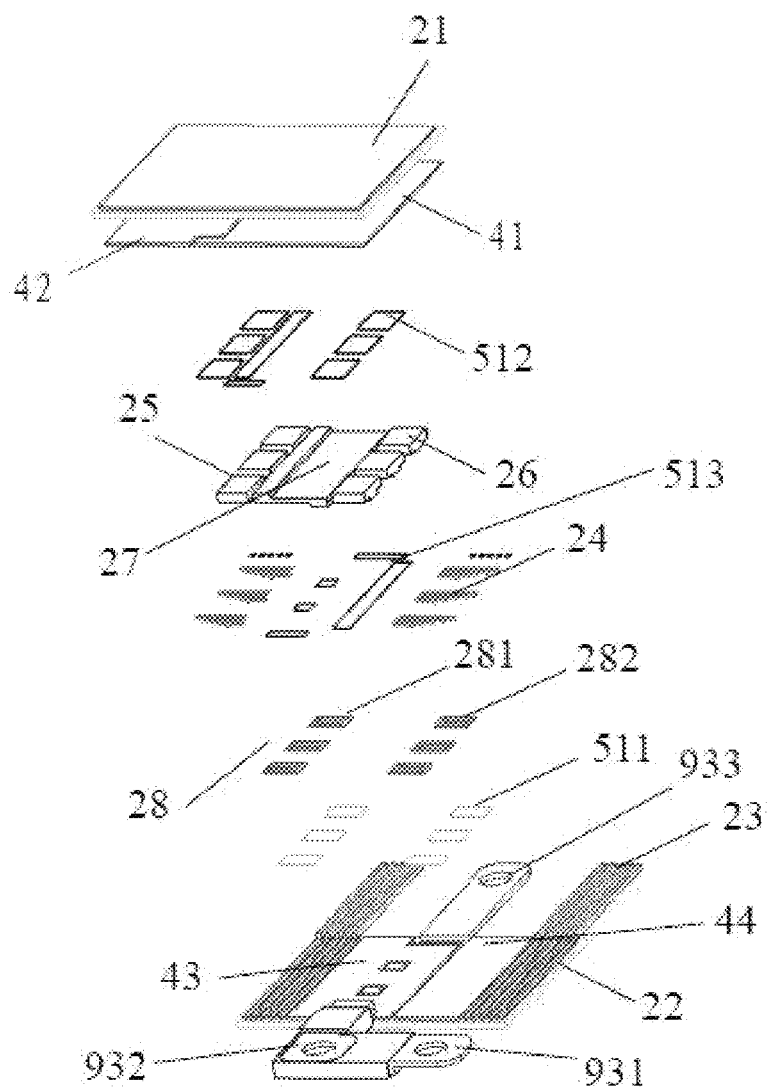
FIG. 43 shows a schematic explosion view of a power module structure of one embodiment of the present disclosure.

As shown in FIG. 43, a projection, projected on the first reference plane or projected on the second reference plane, of the connecting bridge 27 is overlapped with the first overlapping area. Moreover, in some embodiments, at least a portion of the projection of the connecting bridge 27 is within the coverage of the first overlapping area. The first end of the first switch 281 is connected to the third metal layer 43 by a connecting material. The second end of the first switch 281 is connected to the second metal layer 42 via the first spacer 25. The fourth end of the second switch 282 is connected to the first metal layer 41 via the second spacer 26. The third end of the second switch 282 is connected to the fourth metal layer 44 by a connecting material. Moreover, along the vertical direction, only the third metal layer 43 is below the first switch 281 and only the second metal layer 42 is above the first switch 281. And only a first metal layer 41 is above the second switch 282, and only a fourth metal layer 44 is below the second switch 282, each power device 28 has only one power electrode located above and below the power device 28 alone the vertical direction. Therefore, there is no power electrodes stacked above and below the power device. The projection of the first metal layer 41 and the projection of the third metal layer 43 are overlapped on the first reference plane or on the second reference plane to form a first overlapping area that is the projection of the first metal layer 41 is at least partially overlapped with the projection of the third metal layer 43. The direction of the current flowing through the first metal layer 41 is opposite to the direction of the current flowing through the third metal layer 43.

Figure 42:
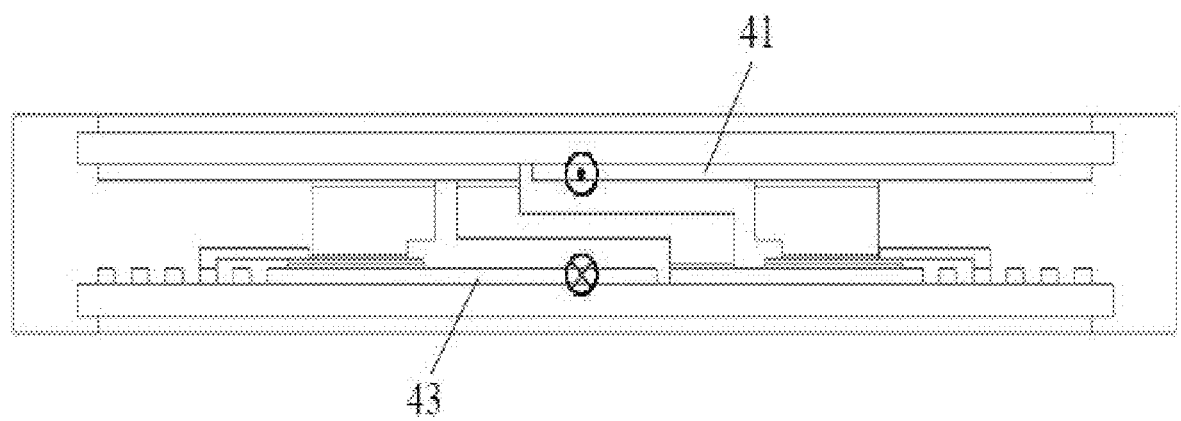
FIG. 42 shows a schematic view of the current direction of the packaged power module structure in FIG. 41.

As shown in FIG. 42, the opposite direction of the current here means that there is that at least a third reference plane is perpendicular to the first reference plane or the second reference plane. The third reference plane vertically cuts the first overlapping area of the third metal layer 43 and the first metal layer 41. The current flowing through the third metal layer 43 and the current flowing through the first metal layer 41 pass through the third reference plane in the opposite direction. The stray inductance of the power module is then reduced since the third metal layer 43 and the first metal layer 41 of the power module are at least partially overlapped and the currents flowing in opposite directions. Moreover, on the upper and lower surfaces of the power device 28, there is a heat dissipation channel that exchanges heat with the environment, which can achieve the goal of double-sided heat dissipation.

Figure 40:
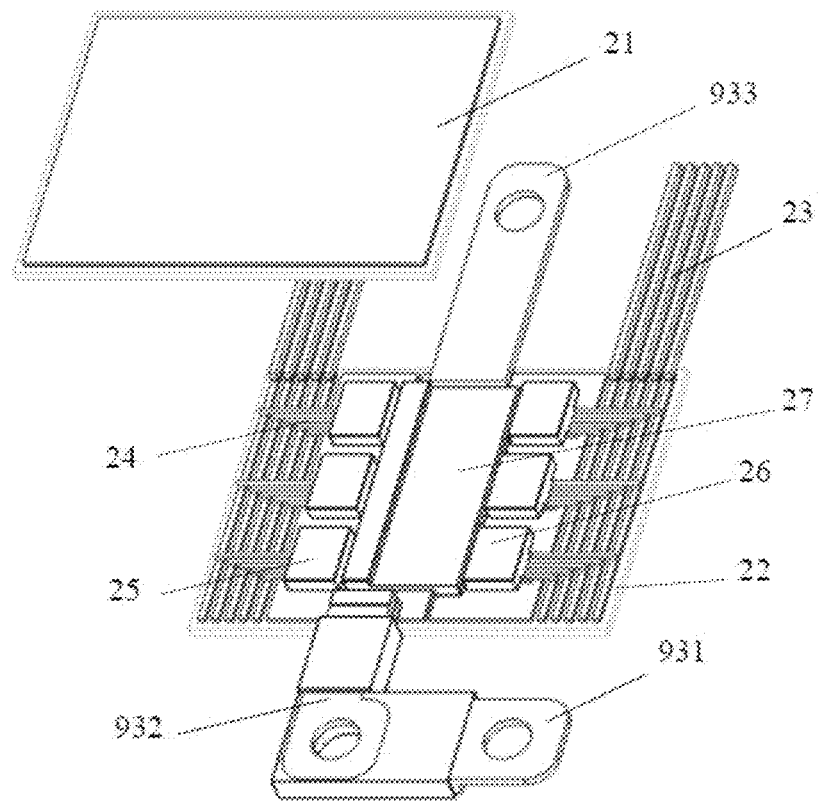
FIG. 40 shows a schematic view of a power module structure of one embodiment of the present disclosure.

As shown in FIG. 40 to FIG. 42, in this embodiment, at least a portion of the first overlapping area is located between a projection, projected on the first reference plane, of a first switch area and a projection, projected on the first reference plane, of a second switch area. The first switch area is the smallest envelop area of the first switches 281. The second switch area is the smallest envelop area of the second switches 282. As shown in FIG. 41, the smallest envelope area of the first switch 281 is located at the left side of the first overlapping area, and the smallest envelope area of the second switch 282 is located at the right side of the first overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the first overlapping area, and the wire lead-out direction of the first signal terminal and the wire lead-out direction of the second signal terminal are respectively away from the first overlapping area.

As shown in FIG. 41, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 931 and the second power terminal 932 are led out in the first direction, and the third power terminal 933 is led out in a direction which is opposite to the first direction. With this configuration, the wire lead-out direction of the first power terminal 931, the second power terminal 932 and the third power terminal 933 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

As shown in FIG. 43, in this embodiment, the first substrate 21 and the second substrate 22 respectively includes a composite substrate including an insulating layer and an outer metal layer. In some embodiments, the first substrate 21 and the second substrate 22 respectively includes an insulating substrate including an insulating layer only. The first metal layer 41, the second metal layer 42, the third metal layer 43 and the fourth metal layer 44 are all disposed on the inner side of the substrate.

In some embodiments, the power module structure does not include the substrate. Therefore, the metal layer of the power module includes a wire lead frame, such that the material for the power module structure is then saved.

The power component 28 is connected to the metal layer disposed on the inner side of the second substrate 22 by the connecting material 511. The connecting material 511 includes solder, sintered silver or conductive silver paste.

The power device 28 is connected to the metal layer disposed on the inner side of the first substrate 21 via the first spacer 25, the second spacer 26, and the connecting material 512. The first spacer 25 and the second spacer 26 are both thermal and electrical conductors. Furthermore, in some embodiments, the material of the first spacer 25 and the second spacer 26 includes copper, aluminum, molybdenum, tungsten, copper tungsten alloy or copper molybdenum alloy.

The connecting bridge 27 is respectively connected to the second metal layer 42 and the fourth metal layer 44 by a connecting material 513. Meanwhile, by adjusting the thicknesses of the first spacer 25 and the second spacer 26, the distance between the first substrate 21 and the second substrate 22 in the power module is adjusted. Therefore, the distance between the third metal layer 43 and the first metal layer 41 is adjustable. The size of the power module is adjustable and the stray inductance of the power module is adjustable as well. The above structure is merely an example embodiment, and in other embodiments, the power module structure may have many variations. For example, the positions of the first switch 281 and the first spacer 25 are interchangeable. The positions of the second switch 282 and the second spacer 26 are interchangeable. It should be understood that, in this embodiment, "inside of the substrate" herein refers to the side of the substrate close to the switch, such as the lower side of the first substrate 21 shown in FIG. 43 and the upper side of the second substrate 22.

In this embodiment, the first switch 281 and the second switch 282 are vertical devices, e.g. IGBT (Insulated Gate Bipolar Transistor), MOSFET or diode.

The signal terminal 23 is connected to the signal end of the power component 28 connected, via the bonding wires 24 and the metal layer disposed on the inner side of the second substrate 22. Moreover, in some embodiments, the signal terminal 23 is connected to the signal end of the power component 28 connected, via the bonding wires 24, a PCB disposed on the outside of the power component 28 and the metal layer disposed on the inner side of the second substrate 22. The first power terminal 931 is electrically connected to the first switch 281 via the third metal layer 43 disposed on the inner side of the second substrate 22, and the second power terminal 932 is electrically connected, via the first metal layer 41 disposed on the inner side of the first substrate 21, to the second switch 282. The first switch 281 and the second switch 282 are electrically connected via the connecting bridge 27. The third power terminal 933 is connected to the connecting bridge 27 via the fourth metal layer 44 disposed on the inner side of the second substrate 22. In some embodiments, the third power terminal 933 is directly connected to the connecting bridge 27. In some embodiments, the third power terminal 933 is integrated with the connecting bridge 27. The projections of the first power terminal 931 and the second power terminal 932 on the first reference plane or the second reference plane are at least partially overlapped. Therefore, the stray inductance of the power module is then reduced. In this embodiment, the connecting bridge 27 is located between the first switch 281 and the second switch 282 and the stray inductance of the power module is further reduced. The material of the bridge 27 includes metal materials. The metal materials include copper, aluminum, molybdenum, tungsten, copper tungsten alloy or copper molybdenum alloy.

Figure 44:
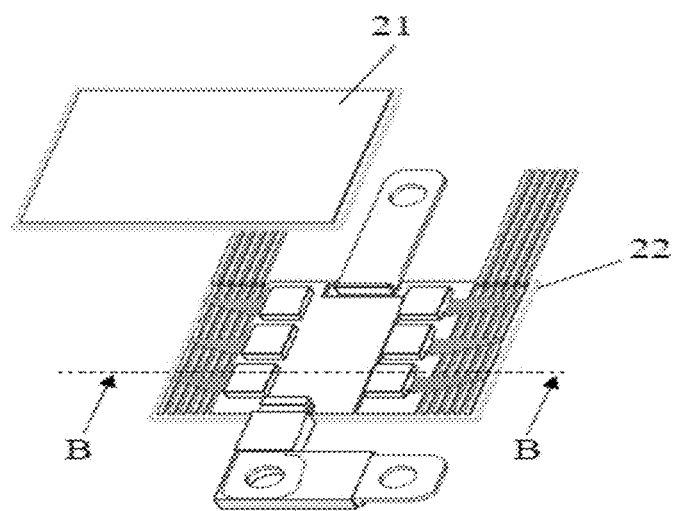
FIG. 44 shows a schematic view of a power module structure of one embodiment of the present disclosure.
Figure 45:
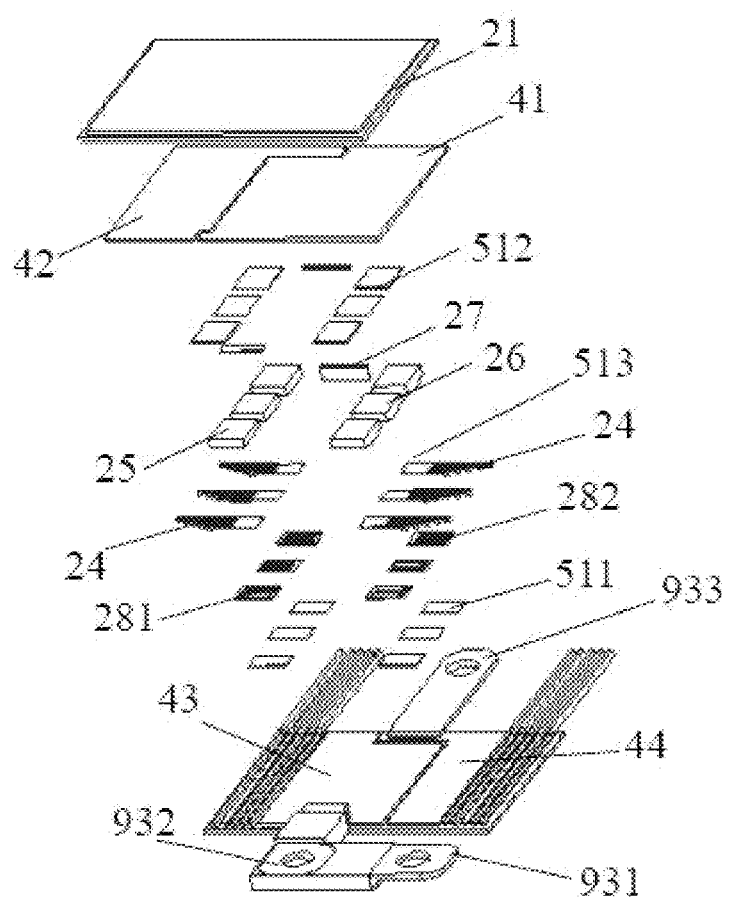
FIG. 45 shows a schematic explosion view of a power module structure of one embodiment of the present disclosure.
Figure 46:
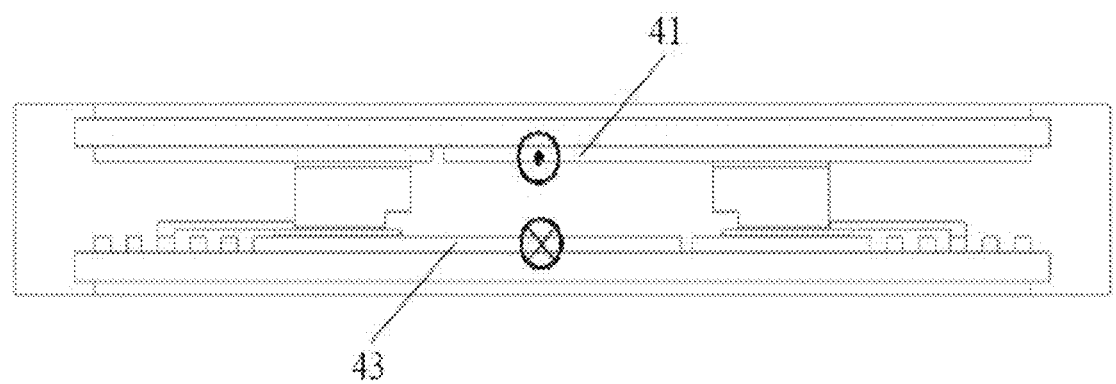
FIG. 46 shows a schematic cross-sectional view alone BB line of the packaged power module structure in FIG. 44.

FIG. 44 to FIG. 46 shows a power module structure of a one embodiment of the present disclosure. The power module structure of the one embodiment is similar to the power module structure of the one embodiment. The first switch 281 is connected, via the connecting bridge 27, to the second switch 282. However, in the one embodiment, the connecting bridge is centrally disposed on the same side of the first switch 281 and the second switch 282. In this embodiment, three pairs of power devices arranged side by side in two columns. The first switch 281 of each pair is arranged in the first column. The second switch 282 is arranged in the second column parallel to the first column. The two power devices of each pair are correspondingly arranged left and right. The connecting bridge 27 is located on a symmetry line of the first column and the second column, and is placed outside of all of the power devices 28. Since the connecting bridge 27 is disposed in a local area between or outside of the first switch 281 and the second switch 282, a goal of better current sharing effect is then achieved.

FIG. 46 is a cross-sectional view along line BB of the power module structure of FIG. 44. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 47:
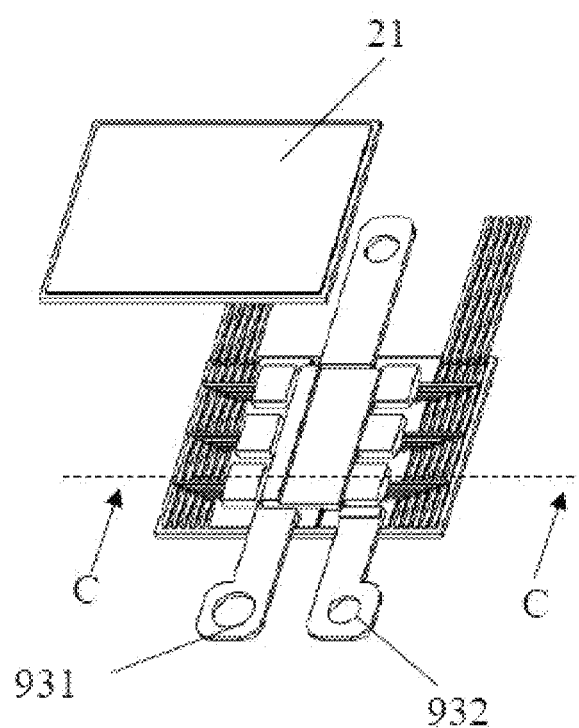
FIG. 47 shows a schematic view of a power module structure of one embodiment of the present disclosure.
Figure 48:
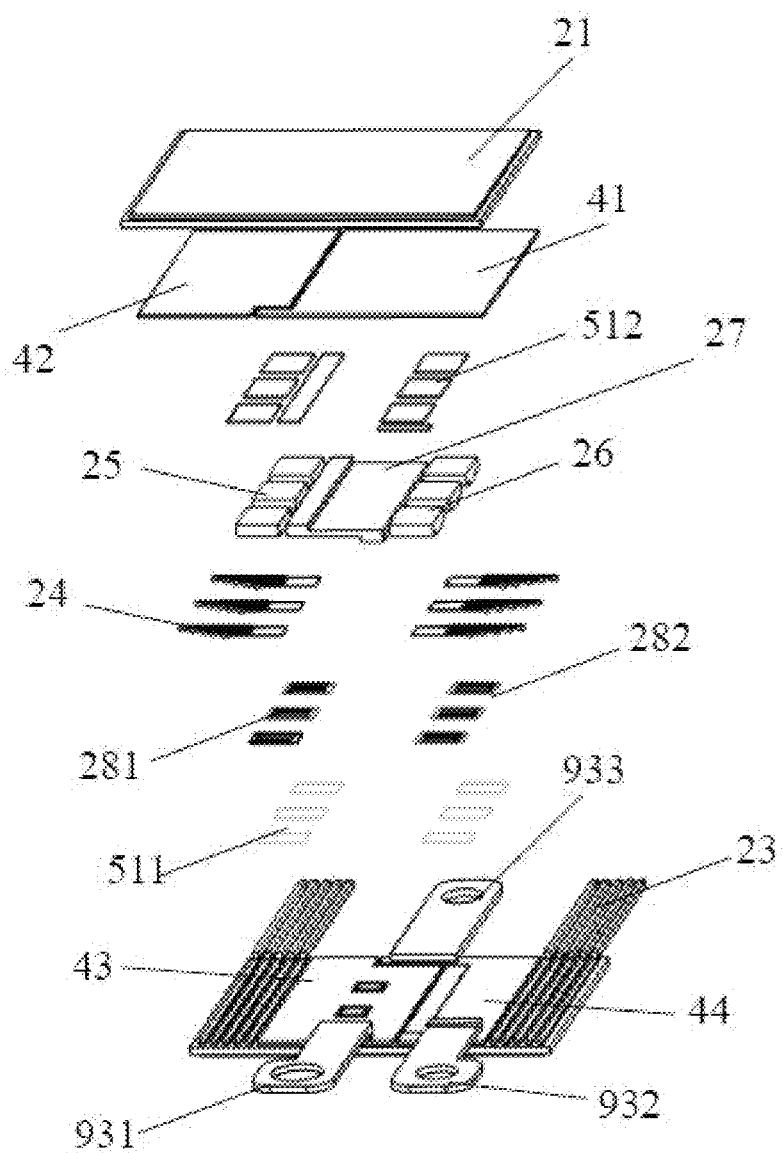
FIG. 48 shows a schematic explosion view of a power module structure of one embodiment of the present disclosure.

FIG. 47 to FIG. 48 shows a schematic view of a power module structure of a one embodiment of the present disclosure. The power module structure of the one embodiment is similar to the power module structure of the one embodiment but a projection, projected on the first reference plane or on the second reference plane, of the first power terminal 931 and the second power terminal 932 are not overlapped. In this embodiment, the power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 49:
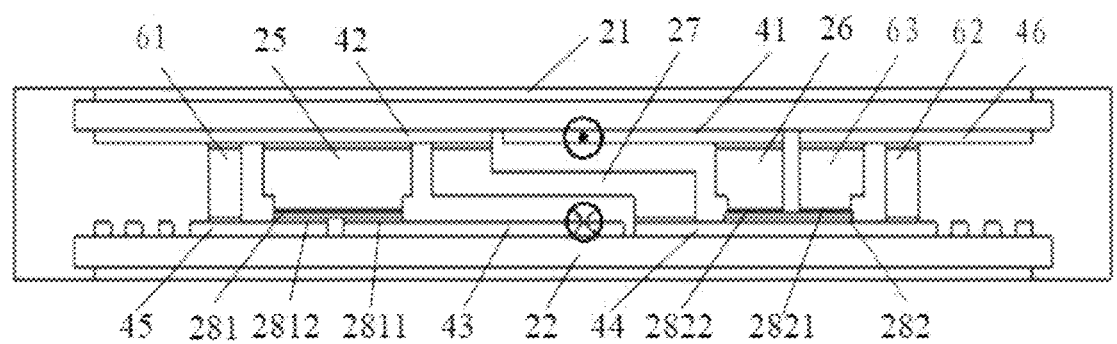
FIG. 49 shows a schematic view of a power module structure of one embodiment of the present disclosure.

FIG. 49 shows a schematic view of a power module structure of a one embodiment of the present disclosure. The power module structure of the one embodiment is similar to the power module structure of the one embodiment, but the first switches 281 and the second switches 282 of FIG. 49 are flat components, e.g. GaN component. A power electrode of the power component is led out from a side of the power component. The side with led-out electrode is an electrode containing layer. The other side of the power component is an electrode non-containing layer. The first switches 281 and the second switches are connected to the same substrate. In some embodiments, the electrode non-containing layer of the power component 28 is connected to the substrate. In some embodiments, the electrode containing layer of the power component 28 is connected to the substrate. As shown in FIG. 49, the electrode containing layer of the power component 28 is connected to the lower substrate 22.

In this embodiment, the power module structure further includes a third spacer 63, a first connecting column 61 and a second connecting column 62. In this embodiment, a first end 2811 of the first switch 281 is connected to the third metal layer 43. A second end 2812 of the first switch 281 is connected to the first connection metal layer 45. The first connection metal layer 45 is disposed on the second reference plane and adjacent to the third metal layer 43. The first connecting column 61 is connected between the first connection metal layer 45 and the second metal layer 42. A third end 2821 of the second switch 282 is connected to the third spacer 63. The third spacer 63 is connected to the second connecting metal layer 46. The second connecting metal layer 46 is disposed on the first reference plane and adjacent to the first metal layer 41.

The second connecting column 62 is respectively connected to the second connecting metal layer 46 and the fourth metal layer 44. A fourth end 2822 of the second switch 282 is connected to the second spacer 26. The second spacer 26 is connected to the first metal layer 41.

In this embodiment, the first spacer 25 is a metal spacer or a spacer with thermal insulation material. The second spacer 26 and the third spacer 63 both are metal spacers. The thermal insulation material includes Aluminum Oxide, Beryllium Oxide, Aluminum Nitride, and DBC (Direct Bonding Copper). The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 50:
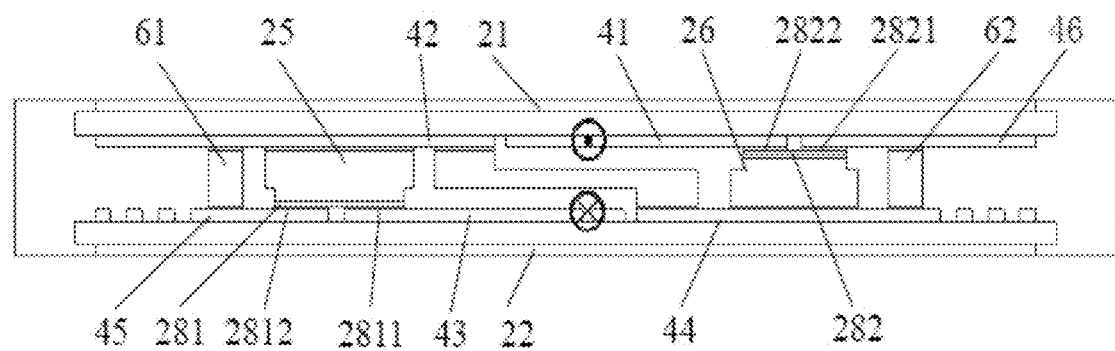
FIG. 50 shows a schematic view of a power module structure of one embodiment of the present disclosure.

FIG. 50 shows a schematic view of a power module structure of a one embodiment of the present disclosure. The power module structure of the one embodiment is similar to the power module structure of the one embodiment. The first switch 281 and the second switch 282 are both flat components but, as shown in FIG. 50, the first switch 281 and the second switch 282 are respectively disposed on the second substrate 22 and the first substrate 21. In this embodiment, the first switch 281, including the electrode containing layer, is disposed on the second substrate 22 and connected to the metal layer of the inner side of the second substrate 22. The second switch 282, including the electrode containing layer, is disposed on the first substrate 21 and connected to the metal layer of the inner side of the first substrate 21. The present disclosure is not limited thereto.

In this embodiment, the power module structure further includes the first connecting column 61 and the second connecting column 62. In this embodiment, the first end 2811 of the first switch 281 is connected to the third metal layer 43. The second end 2812 of the first switch 281 is connected to the first connection metal layer 45. The first connection metal layer 45 is disposed on the second reference plane and adjacent to the third metal layer 43. The first connecting column 61 is connected between the first connection metal layer 45 and the second metal layer 42. The third end 2821 of the second switch 282 is connected to the second connection metal layer 46. The second connection metal layer 46 is disposed on the first reference plane and adjacent to the first metal layer 41. The second connecting column 62 is respectively connected to the second connecting metal layer 46 and the fourth metal layer 44. The fourth end 2822 of the second switch 282 is connected to the first metal layer 41.

In this embodiment, the first spacer 25 is a metal spacer or a spacer with thermal insulation material. The second spacer 26 is a metal spacer or a spacer with thermal insulation material. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 51:
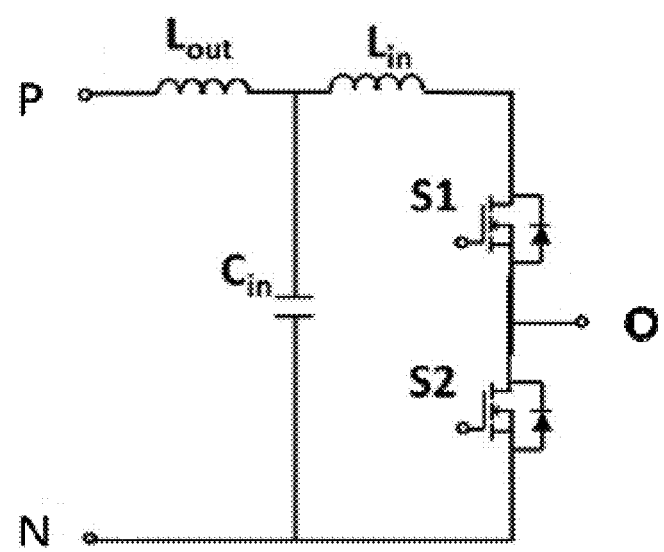
FIG. 51 shows a schematic view of equivalent circuits of a half-bridge module including clamping capacitors.

FIG. 51 shows a schematic view of equivalent circuits of a half-bridge module including clamping capacitors. In this embodiment, the power module structure includes a clamping capacitor $C_{in}$ which will reduce an area of high frequency circuits when the component is turned off. Moreover, the stray inductance of the high frequency circuits is then reduced as well. For example, when the power module does not include the clamping capacitor $C_{in}$, the stray inductance of the high frequency circuits is $L_{out}+L_{in}$. When the power module includes the clamping capacitor $C_{in}$, the stray inductance of the high frequency circuits is $L_{in}$, which means the inductance of the power module becomes small.

Figure 52:
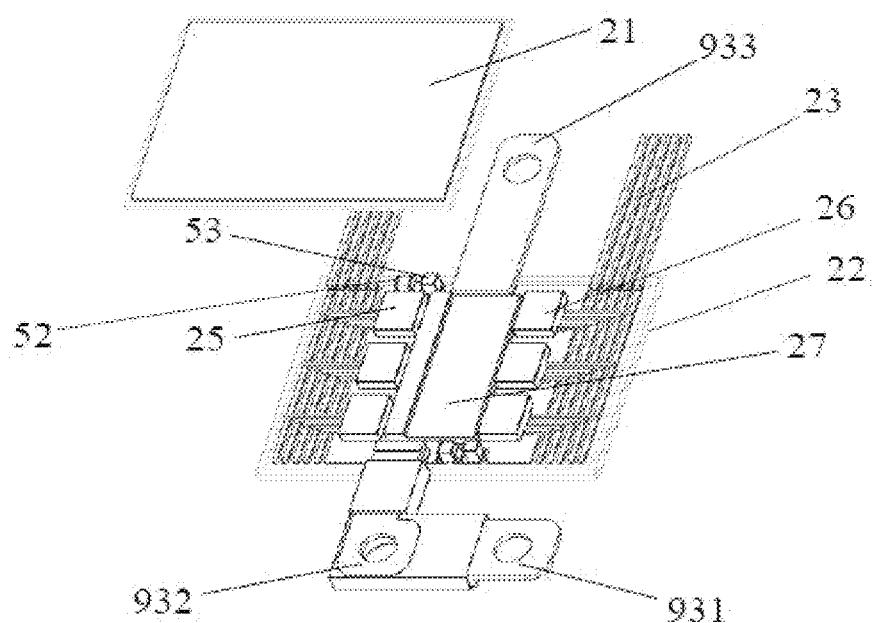
FIG. 52 shows a schematic view of a power module structure of one embodiment of the present disclosure.

FIG. 52 shows a schematic view of a power module structure of a one embodiment of the present disclosure. The power module structure of the one embodiment is similar to the power module structure of the one embodiment but further includes a clamping capacitor 52. The clamping capacitor 52 is disposed between the first reference plane and the second reference plane and is electrically connected between the third metal layer 43 and the first metal layer 41.

In this embodiment, the clamping capacitor 52 is a flat clamping capacitor. The power module structure further includes a capacitor connecting spacer 53, wherein the clamping capacitor 52 and the capacitor connecting spacer 53 are located at outside of the connecting bridge 27. An end of the clamping capacitor 52 is electrically connected to the third metal layer 43 and the other end of the clamping capacitor 52 is electrically connected, via the capacitor connecting spacer 53, to the first metal layer 41. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well. Therefore, in this embodiment, since the power module structure includes the clamping capacitor 52 located between the P pole and the N pole, the stray inductance of the power module is then reduced.

Figure 53:
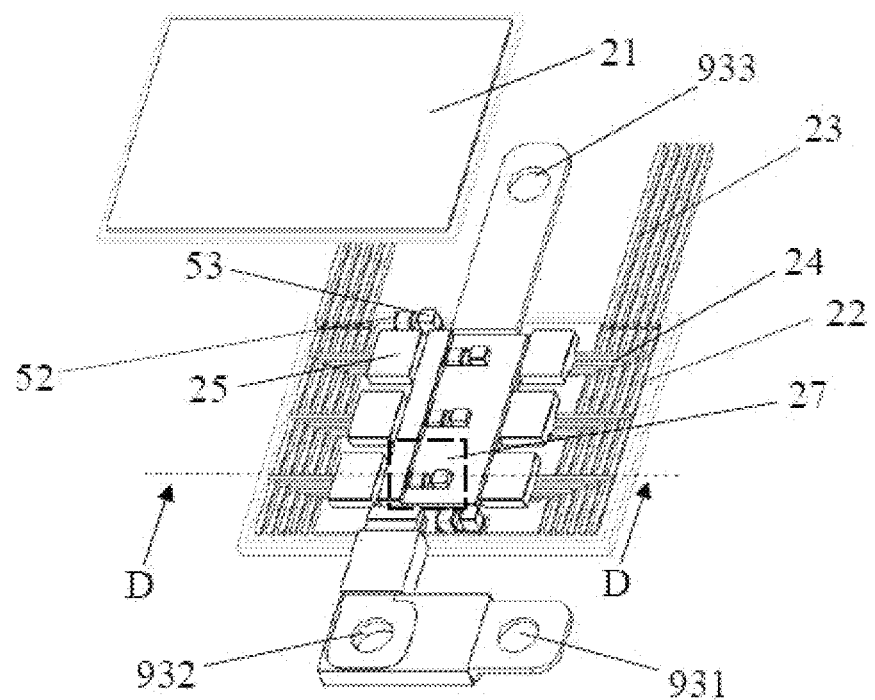
FIG. 53 shows a schematic view of a power module structure of one embodiment of the present disclosure.
Figure 54:
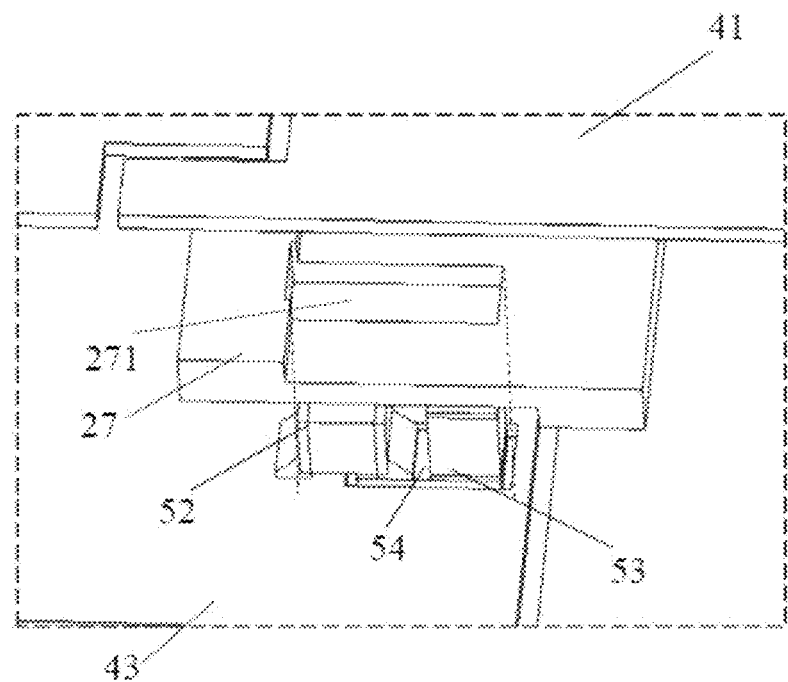
FIG. 54 shows an enlarged schematic view of a square area in FIG. 53.
Figure 55:
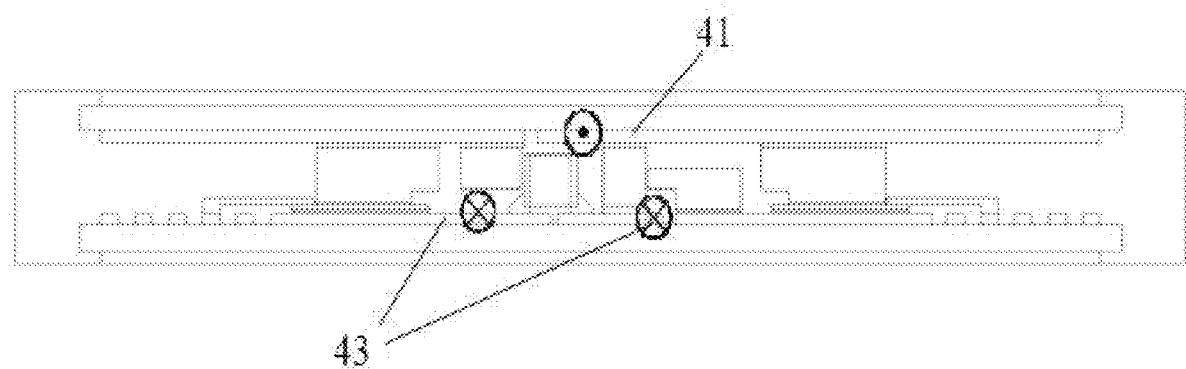
FIG. 55 shows a schematic cross-sectional view alone DD line of the power module structure in FIG. 53.

FIG. 53 to FIG. 55 shows a schematic view of a power module structure of a one embodiment of the present disclosure. The power module structure of the one embodiment is similar to the power module structure of the one embodiment. The power module structure, in this embodiment, the power module structure includes the clamping capacitor 52 and the capacitor connecting bridge 53. The clamping capacitor is a flat clamping capacitor. However, in this embodiment, except the clamping capacitor 52 disposed on the outside of the connecting bridge 27, the connecting bridge 27 further includes a hollow portion 271 for receiving the clamping capacitor 52 and the capacitor connecting spacer 53. In this embodiment, a end of the clamping capacitor 52 is electrically connected, via the connecting material, to the third metal layer 43 and the other end of the clamping capacitor 52 is electrically connected, via the third connecting metal layer 54, the capacitor connecting spacer 53 disposed on the third connecting metal layer 54 and the connecting material, to the first metal layer 41. Compared with the power module structure of the one embodiment, since the power module structure of the one embodiment includes clamping capacitor 52 disposed in the hollow portion 271 and at outside of the bridge 27, an area of high frequency circuits will be reduced and the inductance of the high frequency circuits is reduced as well.

FIG. 55 shows a schematic cross-sectional view alone DD line of the power module structure in FIG. 53. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well. Therefore, in this embodiment, since the power module structure includes the clamping capacitor 52 located between the P pole and the N pole, the stray inductance of the power module is then reduced.

Figure 56:
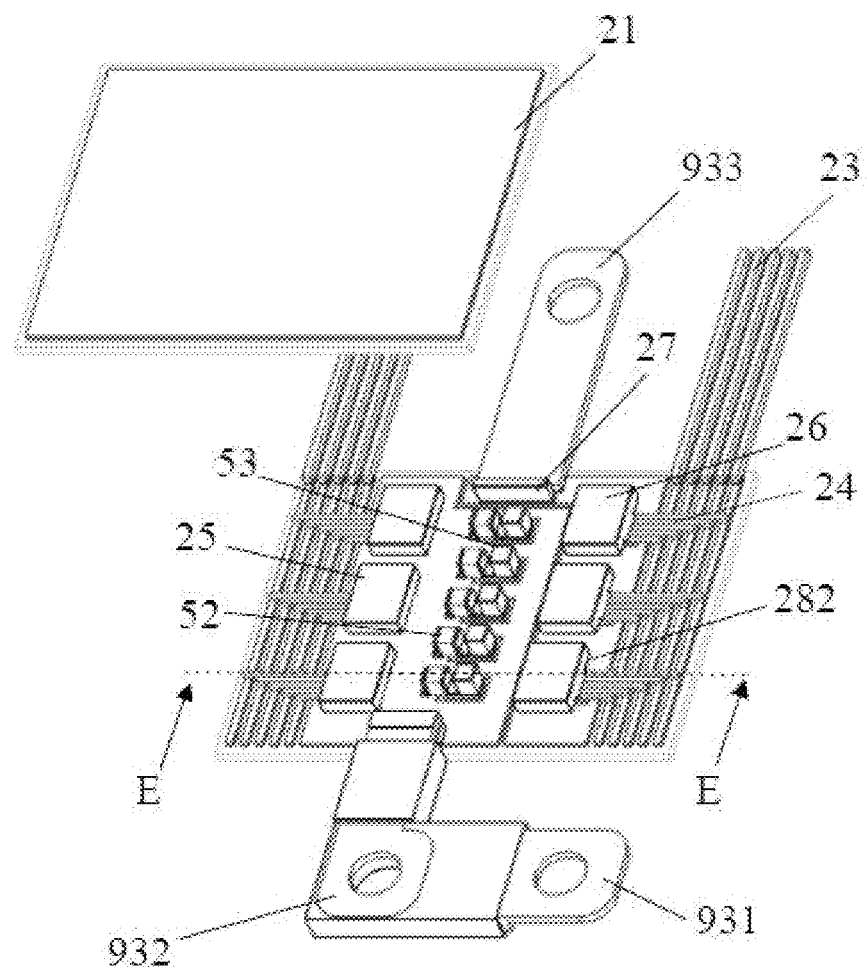
FIG. 56 shows a schematic view of a power module structure of one embodiment of the present disclosure.
Figure 57:
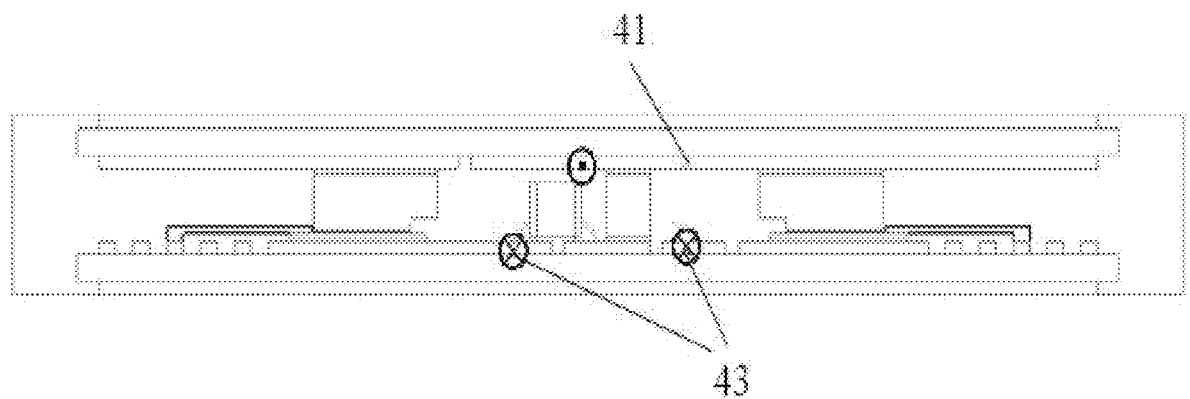
FIG. 57 shows a schematic cross-sectional view alone EE line of the power module structure in FIG. 56.

FIG. 56 to FIG. 57 shows a schematic view of a power module structure of a one embodiment of the present disclosure. The one embodiment is similar to the one embodiment. The connecting bridge 27 is disposed on the same side of the first switch 281 and the second switch 282. In this embodiment, the power module structure further includes the clamping capacitors 52 and the capacitor connecting spacers 53. The clamping capacitor 52 is a flat clamping capacitor. Except the location of the connecting bridge 27, the clamping capacitors 52 and the capacitor connecting spacers 53 are located between the first switch 281 and the second switch 282. In this embodiment, a end of the clamping capacitor 52 is electrically connected, via the connecting material, to the third metal layer 43 and the other end of the clamping capacitor 52 is electrically connected, via the connecting material and the capacitor connecting spacer 53, to the first metal layer 41.

FIG. 57 shows a schematic cross-sectional view alone EE line of the power module structure in FIG. 56. The power device 28 includes only one power electrode on the upper and the lower sides of the power device 28 in a vertical direction. Therefore, the stray inductance of the power module is then reduced as well. Therefore, in this embodiment, since the power module structure includes the clamping capacitor 52 located between the P pole and the N pole, the stray inductance of the power module is then reduced.

Figure 58:
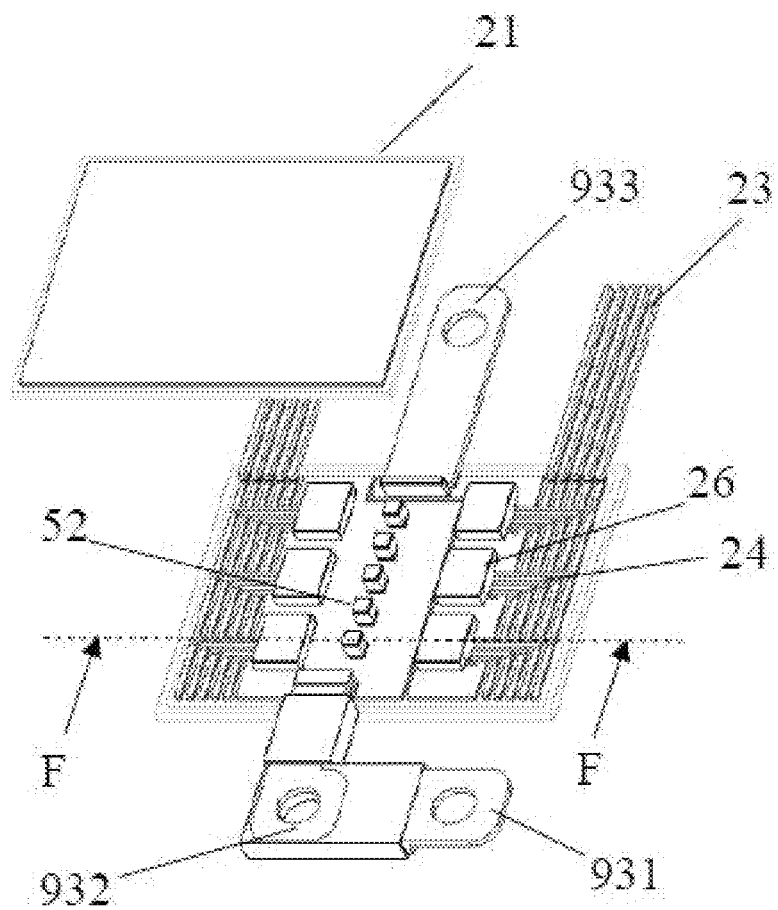
FIG. 58 shows a schematic view of a power module structure of one embodiment of the present disclosure.
Figure 59:
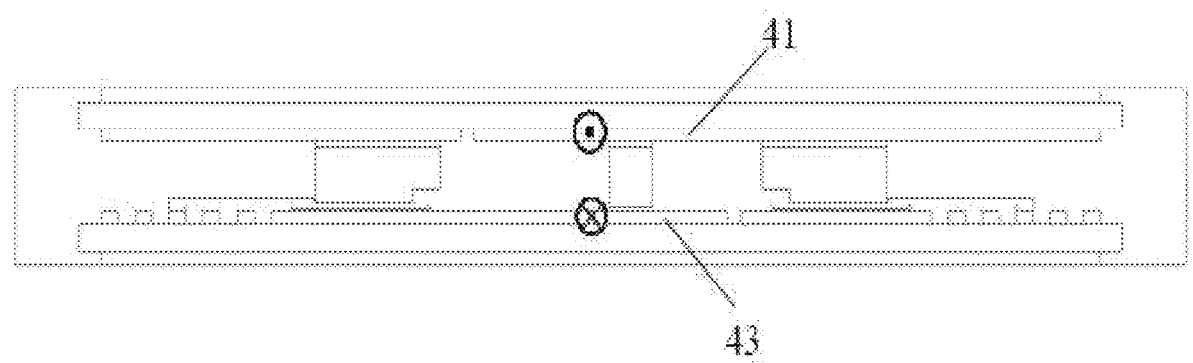
FIG. 59 shows a schematic cross-sectional view alone FF line of the power module structure in FIG. 58.

FIG. 58 to FIG. 59 shows a schematic view of a power module structure of a one embodiment of the present disclosure. The one embodiment is similar to the one embodiment. The connecting bridge 27 is disposed on the same side of the first switch 281 and the second switch 282. In this embodiment, the power module structure further includes the clamping capacitors 52, wherein the clamping capacitor 52 is an upright clamping capacitor. In this embodiment, except the location of the connecting bridge 27, the clamping capacitors 52 located between the first switch 281 and the second switch 282. In this embodiment, a end of the clamping capacitor 52 is electrically connected, via the connecting material, to the third metal layer 43 and the other end of the clamping capacitor 52 is electrically connected, via the connecting material, to the first metal layer 41.

FIG. 59 shows a schematic cross-sectional view alone FF line of the power module structure in FIG. 58. The power device 28 includes only one power electrode on the upper and the lower sides of the power device 28 in a vertical direction. Therefore, the stray inductance of the power module is then reduced as well. Therefore, in this embodiment, since the power module structure includes the clamping capacitor 52 located between the P pole and the N pole, the stray inductance of the power module is then reduced.

Figure 60:
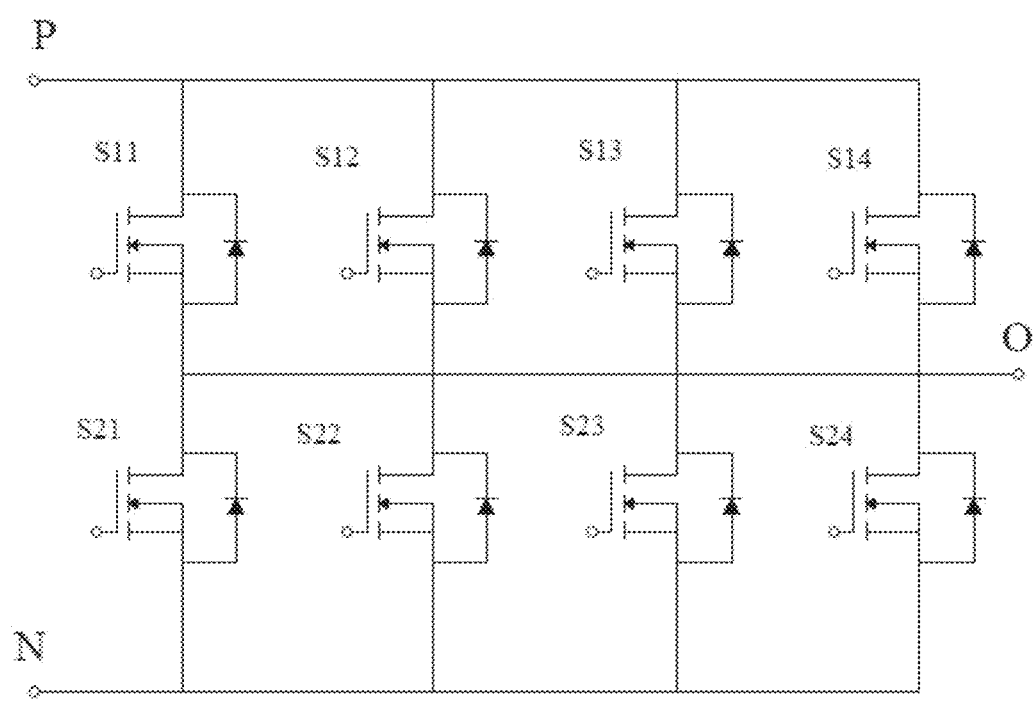
FIG. 60 shows a schematic view of equivalent circuits of a half-bridge module including four pair switches.
Figure 61:
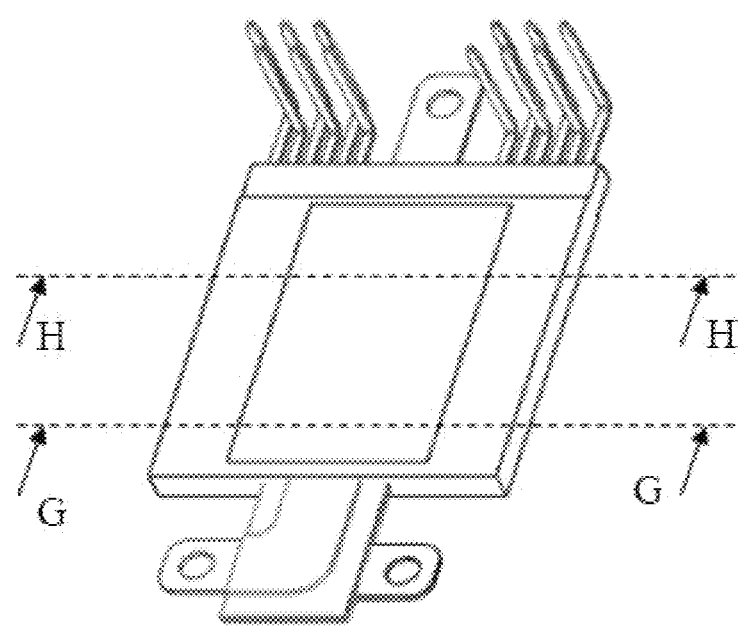
FIG. 61 shows a schematic view of a power module structure of one embodiment of the present disclosure.
Figure 64:
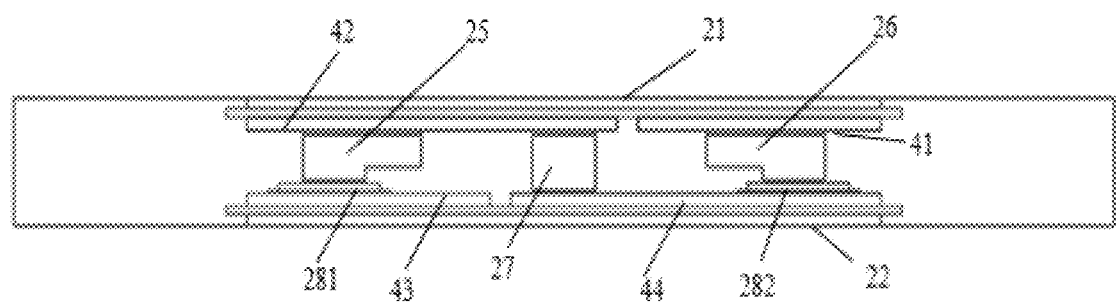
FIG. 64 shows a schematic cross-sectional view alone HH line of the power module structure in FIG. 61.
Figure 65:
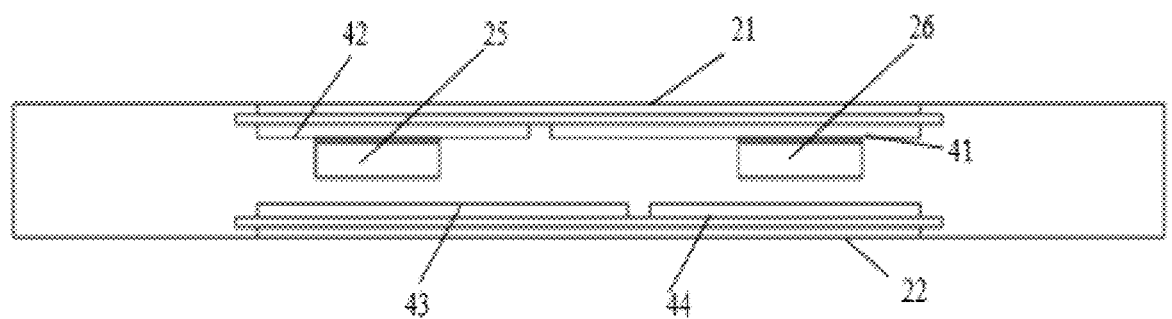
FIG. 65 shows a schematic cross-sectional view alone GG line of the power module structure in FIG. 61.

FIG. 60 to FIG. 67 shows a schematic view of a power module structure of a one embodiment of the present disclosure. FIG. 60 shows a schematic view of equivalent circuits of a half-bridge module including four pair switches. The switches S11, S12, S13 and S14 are respectively presented as the first switch 281. The switches S21, S22, S23 and S24 are respectively presented as the second switch 282. In the one embodiment, the projection of the first metal layer 41 and the projection of the third metal layer 43 are overlapped on the first reference plane or on the second reference plane to form a first overlapping area. The projection of the second metal layer 42 and the projection of the fourth metal layer 44 are overlapped on the first reference plane or on the second reference plane to form a second overlapping area. Moreover, the projection, projected on the first reference plane or the second reference plane, of the first bridge 27 is within the coverage of the second overlapping area. Therefore, in this embodiment, the connecting bridge 27 is not necessary to be designed as an irregular shape like the connecting bridge of the one embodiment. As shown in FIG. 64, in this embodiment, the connecting bridge 27 is a cylindrical connecting bridge. Moreover, the first switch 281 is electrically connected, via the cylindrical connecting bridge 27, to the second switch 282. The third power terminal 933 is connected, via the second substrate 22, to the cylindrical connecting bridge 27. In some embodiments, the third power terminal 933 is directly connected to the cylindrical connecting bridge 27. Compared with the connecting bridge with irregular shape of the one embodiment, in this embodiment, the cylindrical connecting bridge 27 is easier to produce and has higher reliability. The cost of the power module structure is then reduced.

Figure 62:
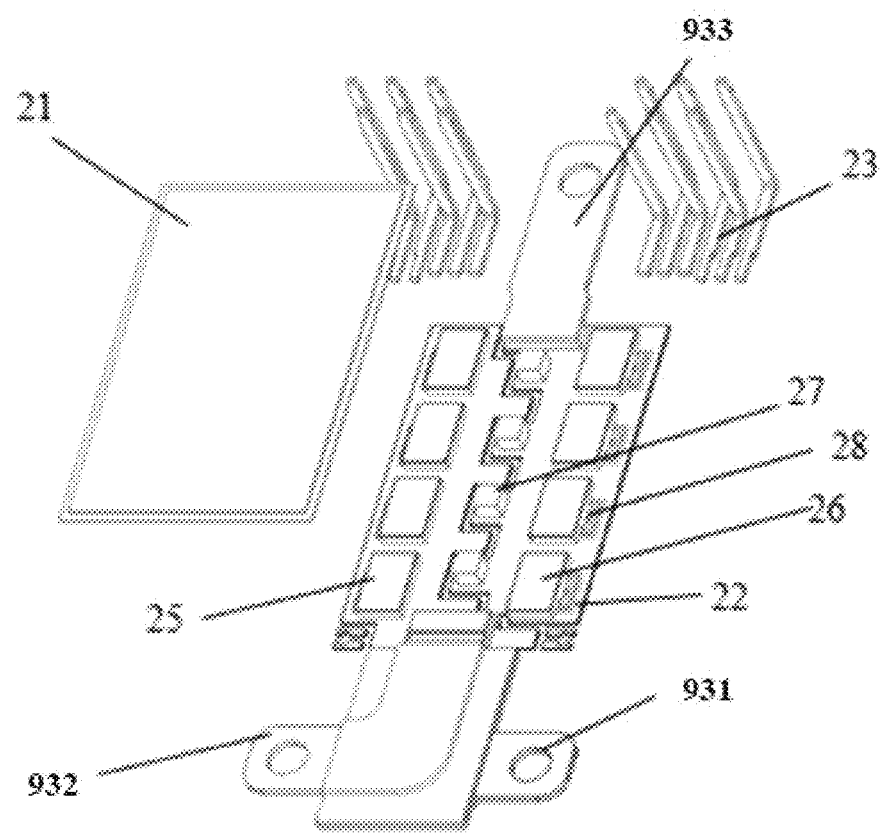
FIG. 62 and FIG. 63 show a schematic explosion view of a portion of the power module structure of FIG. 61.
Figure 63:
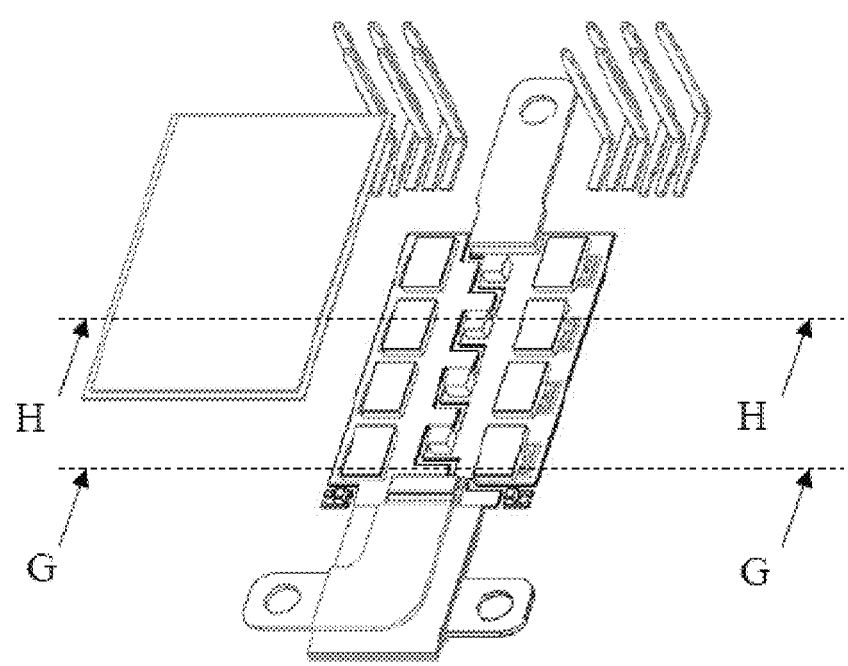

In this embodiment, the projection of the connecting bridge 27, projected on the first reference plane or on the second reference plane, does not overlap with the first overlapping area. Moreover, as shown in FIG. 62, a projection, projected on the first reference plane or projected on the second reference plane, of a connecting area of the first metal layer 41 and the second power terminal 932 is overlapped with a projection, projected on the first reference plane or projected on the second reference plane, of a connecting area of the third metal layer 43 and the first power terminal 931.

Figure 66:
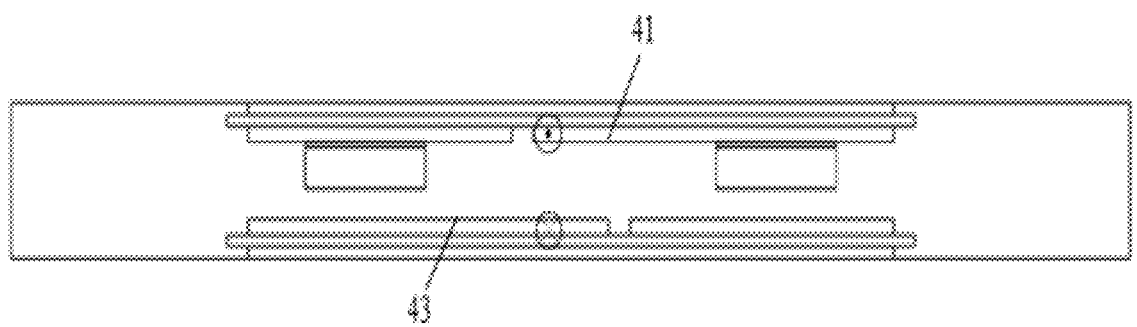
FIG. 66 shows a schematic view of the current direction of the power module structure in FIG. 64.

As shown in FIG. 66, the direction of the current flowing through the first metal layer 41 is opposite to the direction of the current flowing through the third metal layer 43. The stray inductance of the power module is then reduced since the third metal layer 43 and the first metal layer 41 of the power module are at least partially overlapped and the currents flowing in opposite directions.

Figure 67:
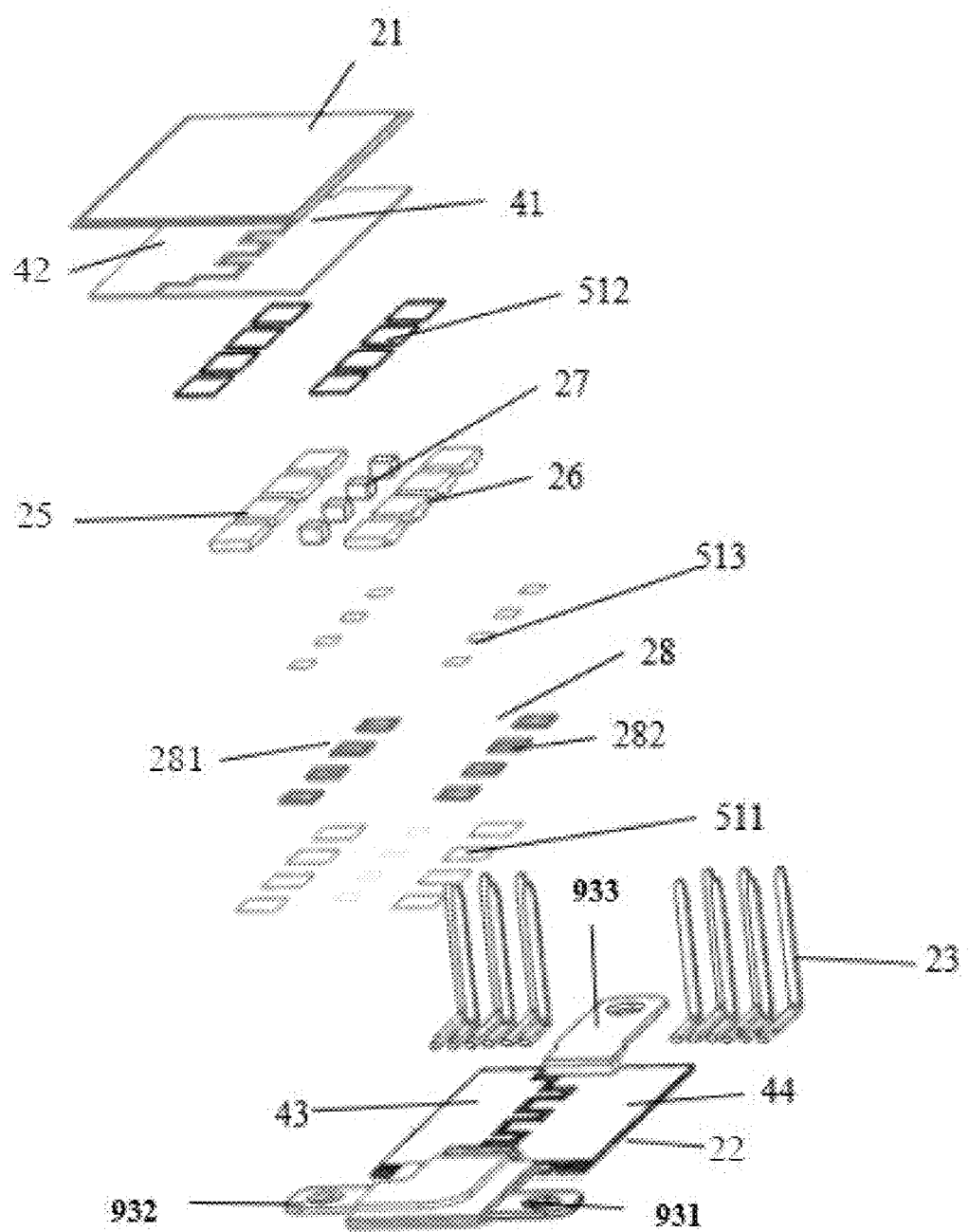
FIG. 67 shows a schematic explosion view of a power module structure of one embodiment of the present disclosure.

In this embodiment, the first overlapping area and the second overlapping area are alternately arranged. As shown in FIG. 67, at a boundary of the first metal layer 41 and the second metal layer 42, an edge of the first metal layer 41 and an edge of the second metal layer 42 are fitting into each other in a zigzag manner to form a zigzag boundary. Moreover, at a boundary of the third metal layer 43 and the fourth metal layer 44, an edge of the third metal layer 43 and an edge of the fourth metal layer 44 are fitting into each other in a zigzag manner to form a zigzag boundary.

In this embodiment, a projection, projected on the first reference plane or on the second reference plane, of the zigzag edge of the first metal layer 41 is overlapped with a projection, projected on the first reference plane or on the second reference plane, of the zigzag edge of the third metal layer 43 to form the first overlapping area. Moreover, a projection, projected on the first reference plane or on the second reference plane, of the zigzag edge of the second metal layer 42 is overlapped with a projection, projected on the first reference plane or on the second reference plane, of the zigzag edge of the fourth metal layer 44 to form the second overlapping area. The quantities and the deployment pattern of the connecting bridge 27 shown in FIG. 67 are not limited thereto. In some embodiments, the cylindrical connecting bridges 27 is evenly deployed between the first switch 281 and the second switch 282 which will reduce more inductance value of the stray inductance. The first overlapping area and the second overlapping area are evenly deployed between the first switch 281 and the second switch 282. In this embodiment, the cylindrical connecting bridge 27 is made of metal materials. The metal material includes copper, aluminum, molybdenum, copper-tungsten alloy or copper-molybdenum alloy.

Figure 68:
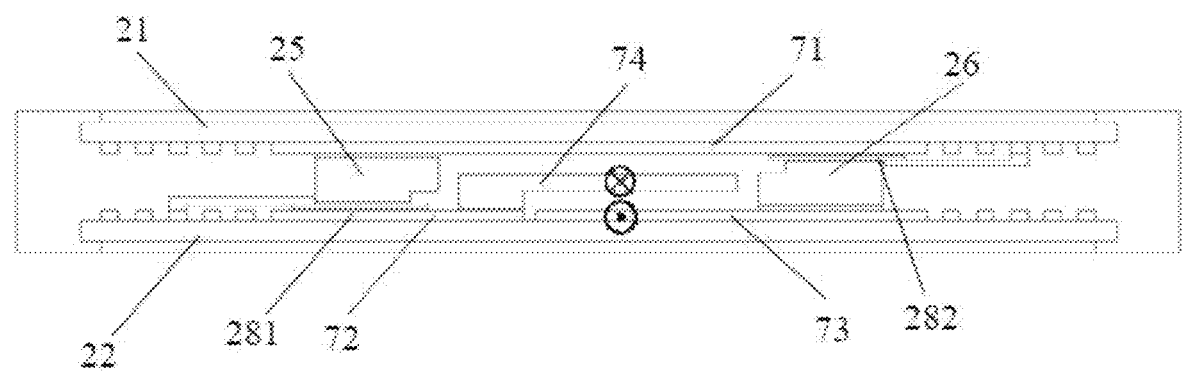
FIG. 68 shows a schematic view of a power module structure of one embodiment of the present disclosure.
Figure 69:
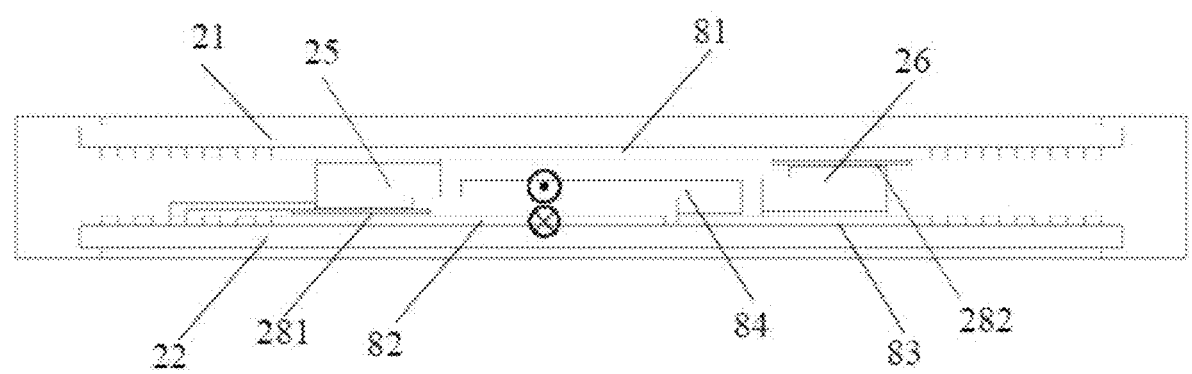
FIG. 69 shows a schematic view of a power module structure of one embodiment of the present disclosure.

FIG. 68 and FIG. 69 shows a schematic view of the power module structure of the one embodiment and the one embodiment of the present disclosure. As shown in FIG. 68, the one embodiment of the present disclosure, a first metal layer 71 is a metal layer electrically connected to an O pole. A second metal layer 72 and a fourth metal layer 74 are metal layers electrically connected to a P pole. A third metal layer 73 is a metal layer electrically connected to a N pole. However, the present disclosure is not limited thereto.

In this embodiment, the power module structure includes the first metal layer 71 disposed on a first reference plane. The second metal layer 72 and the third metal layer 73 are disposed on the second reference plane. The second reference plane is parallel to the first reference plane. The fourth metal layer 74 is disposed between the first reference plane and the second reference plane. The fourth metal layer 74 is electrically connected to the second metal layer 72.

The first switch 281 includes a first end and a second end. The first end of the first switch 281 is electrically connected to the second metal layer 72 and the second end of the first switch 281 is electrically connected to the first metal layer 71. The second switch 282 includes a third end and a fourth end. The third end of the second switch 282 is electrically connected to the first metal layer 71. The fourth term end of the second switch 282 is electrically connected to the third metal layer 73. In this embodiment, a projection, projected on the first reference plane or on the second reference plane, of the fourth metal layer 74 is overlapped with a projection, projected on the first reference plane or on the second reference plane, of the third metal layer 73 to form an overlapping area. The direction of the current flowing through the fourth metal layer 74 is opposite to the direction of the current flowing through the third metal layer 73. Therefore, the stray inductance of the power module is then reduced as well. Moreover, since the distance between the fourth metal layer 74 and the third metal layer 73 is extremely small, the stray inductance of the power module is further reduced.

In this embodiment, the opposite direction of the current here means that there is at least a third reference plane perpendicular to the first reference plane or the second reference plane. The third reference plane vertically cuts the overlapping area of the fourth metal layer 74 and the third metal layer 73. The current flowing through the fourth metal layer 74 and the current flowing through the third metal layer 73 pass through the third reference plane in the opposite direction. The stray inductance of the power module is then reduced since the fourth metal layer 74 and the third metal layer 73 of the power module are at least partially overlapped and the currents flow in opposite directions. Moreover, on the upper and lower surfaces of the first switch 281 and the second switches 282, there is a heat dissipation channel that exchanges heat with the environment, which can achieve the goal of double-sided heat dissipation.

In this embodiment, as shown in FIG. 68, at least a portion of the overlapping area is located between a projection, projected on the first reference plane, of a first switch area and a projection, projected on the first reference plane, of a second switch area. The first switch area is the smallest envelop area of the first switch 281. The second switch area is the smallest envelop area of the second switch 282. As shown in FIG. 68, the smallest envelope area of the first switch 281 is located at the left side of the overlapping area, and the smallest envelope area of the second switch 282 is located at the right side of the overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the overlapping area, and the wire lead-out direction of the first signal terminal and the wire lead-out direction of the second signal terminal are respectively away from the overlapping area. As shown in FIG. 68, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 931 and the second power terminal 932 are led out in the first direction, and the third power terminal 933 is led out in a direction which is opposite to the first direction. With this configuration, the wire lead-out direction of the first power terminal 931, the second power terminal 932 and the third power terminal 933 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the quantity of the first switch 281 and the second switch 282 are not limited thereto. The first substrate 21 and the second substrate 22 are respectively disposed on the upper and the lower sides of the power module structure. In some embodiments, there is no substrate disposed on the upper and the lower sides of the power module structure. Therefore, the metal layer of the power module includes a wire lead frame, such that the material for the power module structure is then saved.

The first switch 281 is connected to the metal layer disposed on the inner side of the second substrate 22 by the connecting material. The second switch 282 is connected to the metal layer disposed on the inner side of the second substrate 21 by the connecting material. The connecting material is solder, sintered silver or conductive silver paste. The first switch 281 is connected to the metal layer disposed on the inner side of the first substrate 21 via the first spacer 25. The second switch 282 is connected to the metal layer disposed on the inner side of the first substrate via the second spacer 26. In some embodiments, the positions of the first switch 281 and the first spacer 25 are interchangeable. The positions of the second switch 282 and the second spacer 26 are interchangeable.

In this embodiment, the first switch 281 and the second switch 282 are vertical devices or planar devices, e.g. Insulated Gate Bipolar Transistor (IGBT), Metal Oxide Semiconductor Field Effect Transistor (MOSFET), diode or GaN devices. In some embodiments, the power module structure further includes the third spacer 63, the first connection column 61, the second connection column 62, and the clamping capacitor 52 on the basis of the embodiments of the present disclosure.

FIG. 69 shows a schematic view of a power module structure of a one embodiment of the present disclosure. In this embodiment, a first metal layer 81 is a metal layer electrically connected to an O pole. A second metal layer 82 is a metal layer electrically connected to a P pole. A third metal layer 83 and a fourth metal layer 84 are metal layers electrically connected to an N pole. However, the present disclosure is not limited thereto.

In this embodiment, the first metal layer 81 is disposed on the first reference plane. The second metal layer 82 and the third metal layer 83 are disposed on the second reference plane. The second reference plane is parallel to the first reference plane. The fourth metal layer 84 is disposed between the first reference plane and the second reference plane and respectively parallel to the first reference plane and the second reference plane. The fourth metal layer 84 is electrically connected to the third metal layer 83. The first switch 281 includes a first end connected to the second metal layer 82 and a second end connected to the first metal layer 81. The second switch 282 includes a third end connected to the first metal layer 81 and a fourth end connected to the third metal layer 83.

In this embodiment, a projection, projected on the first reference plane or on the second reference plane, of the fourth metal layer 84 is overlapped with a projection, projected on the first reference plane or on the second reference plane, of the second metal layer 82 to form an overlapping area. The direction of the current flowing through the fourth metal layer 84 is opposite to the direction of the current flowing through the second metal layer 82. Therefore, the stray inductance of the power module is then reduced as well. Moreover, since the distance between the fourth metal layer 84 and the second metal layer 82 is extremely small, the stray inductance of the power module is further reduced.

In this embodiment, the opposite direction of the current here means that there is at least a third reference plane perpendicular to the overlapping area of the fourth metal layer 84 and the second metal layer 82. The current flowing through the fourth metal layer 84 and the current flowing through the second metal layer 82 pass through the third reference plane in the opposite direction. The fourth metal layer 84 and the second metal layer 82 of the power module structure are at least partially overlapped and the currents flow in opposite directions. Therefore, the stray inductance of the power module is then reduced. Moreover, on the upper and lower surfaces of the first switch 281 and the second switch 282, there is a heat dissipation channel that exchanges heat with the environment, which can achieve the goal of double-sided heat dissipation.

As shown in FIG. 69, the power module structure of FIG. 69 is similar to the one embodiment. In this embodiment, the overlapping area of the fourth metal layer 84 and the second metal layer 82 is located between a projection, projected on the first reference plane, of the first switch area and a projection, projected on the first reference plane, of the second switch area. The first switch area is the smallest envelop area of the first switch 281. The second switch area is the smallest envelop area of the second switch 282. As shown in FIG. 69, the smallest envelope area of the first switch 281 is located at the left side of the overlapping area, and the smallest envelope area of the second switch 282 is located at the right side of the overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the first overlapping area, and the wire lead-out direction of the first signal terminal and the wire lead-out direction of the second signal terminal are respectively away from the overlapping area.

As shown in FIG. 69, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 931 and the second power terminal 932 are led out in the first direction, and the third power terminal 933 is led out in a direction which is opposite to the first direction. With this configuration, the wire lead-out direction of the first power terminal 931, the second power terminal 932 and the third power terminal 933 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the quantity of the first switch 281 and the second switch 282 are not limited thereto. The first substrate 21 and the second substrate 22 are respectively disposed on the upper and the lower sides of the power module structure. In some embodiments, there is no substrate disposed on the upper and the lower sides of the power module structure. Therefore, the metal layer of the power module includes a wire lead frame, such that the material for the power module structure is then saved. The first switch 281 is connected to the metal layer disposed on the inner side of the second substrate 22 by the connecting material. The second switch 282 is connected to the metal layer disposed on the inner side of the second substrate 21 by the connecting material. The connecting material includes solder, sintered silver or conductive silver paste. The first switch 281 is connected to the metal layer disposed on the inner side of the first substrate 21 via the first spacer 25 and the connecting material. The second switch 282 is connected to the metal layer disposed on the inner side of the first substrate via the second spacer 26 and the connecting material. In some embodiments, the positions of the first switch 281 and the first spacer 25 are interchangeable. The positions of the second switch 282 and the second spacer 26 are interchangeable.

In this embodiment, the first switch 281 and the second switch 282 are vertical devices or planar devices, e.g. Insulated Gate Bipolar Transistor (IGBT), Metal Oxide Semiconductor Field Effect Transistor (MOSFET), diode or GaN devices. In some embodiments, the power module structure further includes the third spacer 63, the first connection column 61, the second connection column 62, and the clamping capacitor 52 on the basis of the embodiments of the present disclosure.

Figure 70:
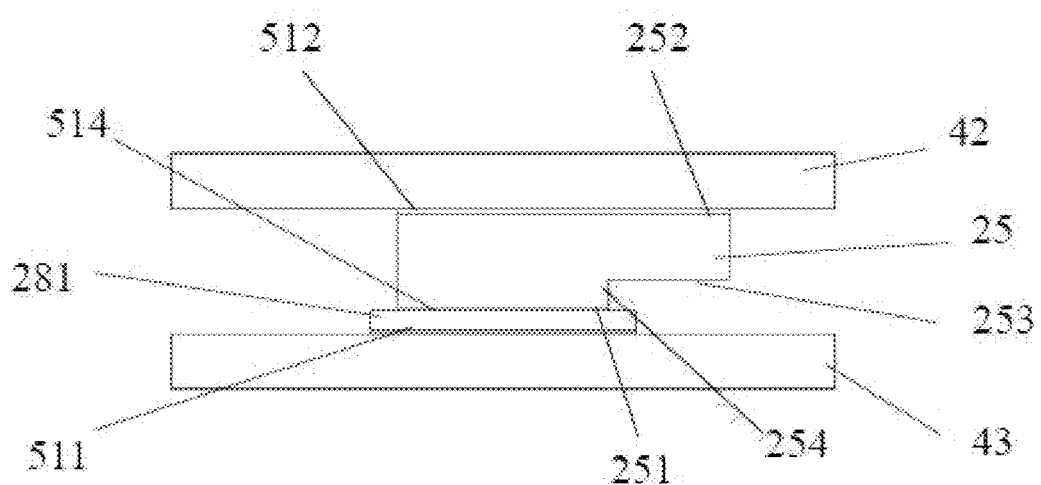
FIG. 70 to FIG. 71 shows a schematic view of a first spacer structure of one embodiment of the present disclosure; and FIG. 72 to FIG. 80 shows a schematic view of a plurality of structure types of a first spacer of some embodiments of the present disclosure.
Figure 71:
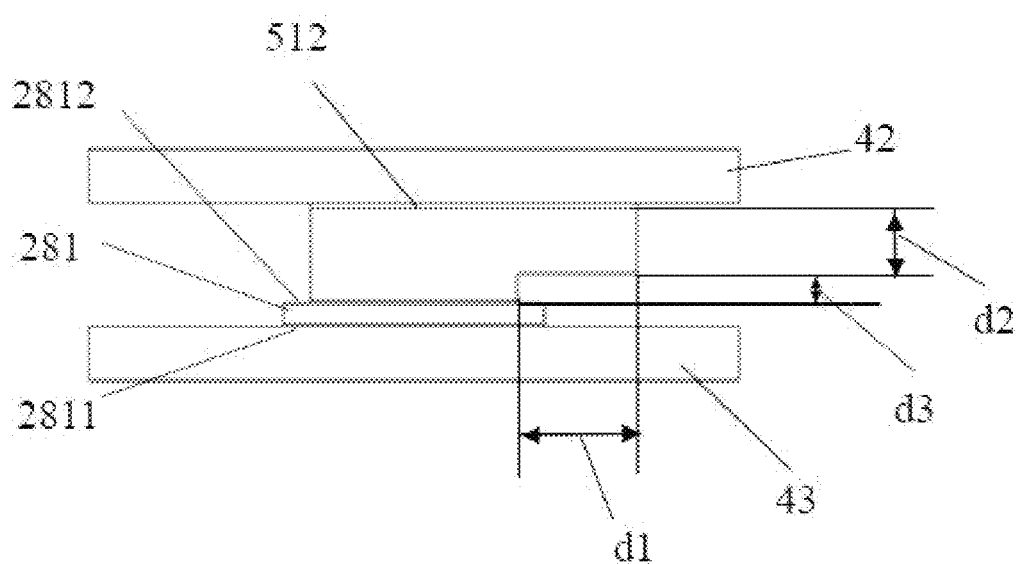

FIG. 70 and FIG. 71 show a schematic view of a first spacer structure of one embodiment of the present disclosure. The structure of the first spacer of the one embodiment, for example, is shown in FIGS. 70 and 71, and is applied to the above various embodiments to be combined into a new technical solution, which is within the protection scope of the present invention.

As shown in FIG. 70, the first spacer 25 includes a first spacer plane 251 connected to the first switch 281 and a second spacer plane 252 connected to the second metal layer 42. A projection, projected on the first reference plane, of the second spacer plane 252 is greater than a projection, projected on the first reference plane, of the first spacer plane. In some embodiments, a first end of the first switch 281 is connected, via the connecting material 511, to the third metal layer 43. A second end of the first switch 281 is connected, via the connecting material 514, to the first spacer plane 251 of the first spacer 25. The second spacer plane 252 of the first spacer 25 is connected, via the connecting material 512, to the second metal layer 42. It should be understood that the couple herein refers to indirect connect, that is, connect by a connecting material. With this configuration, the heat dissipation capability is improved and the structural strength is enhanced.

In some embodiments, an edge side of the projection, on the first reference plane, of the second spacer plane 252 is protruded an edge side of the projection, on the first reference plane, of the first spacer plane 251 a distance d1. As shown in FIG. 71, the right side of the second spacer plane 252 is protruded the right side of the first spacer plane 251 a distance d1. In this embodiment, the d1 is 0.5 to 5 mm but the present disclosure is not limited thereto. Therefore, in this embodiment, a contact area of the first spacer 25 and the second metal layer 42 is then enlarged. In some embodiments, a contact area of the first spacer 25 and the metal layer is then enlarged, wherein the metal layer is connected to the first spacer 25 via the connecting material. Therefore, the bonding strength of the first spacer 25 to the metal layer is then increased.

In this embodiment, at least one side of the first spacer plane 251 of the first spacer 25 is formed a recess facing to the second spacer plane 252. The recess includes a fourth spacer plane 254 connected to the first spacer plane 251 and a third spacer plane 253 connected to the fourth spacer plane 254. A distance d3 between the third spacer plane 253 and the first spacer plane 251 is greater than 0.1 mm, and a distance d2 between the third spacer plane 253 and the second spacer plane 252 is greater than 0.5 mm but the present disclosure is not limited thereto.

Figure 72:
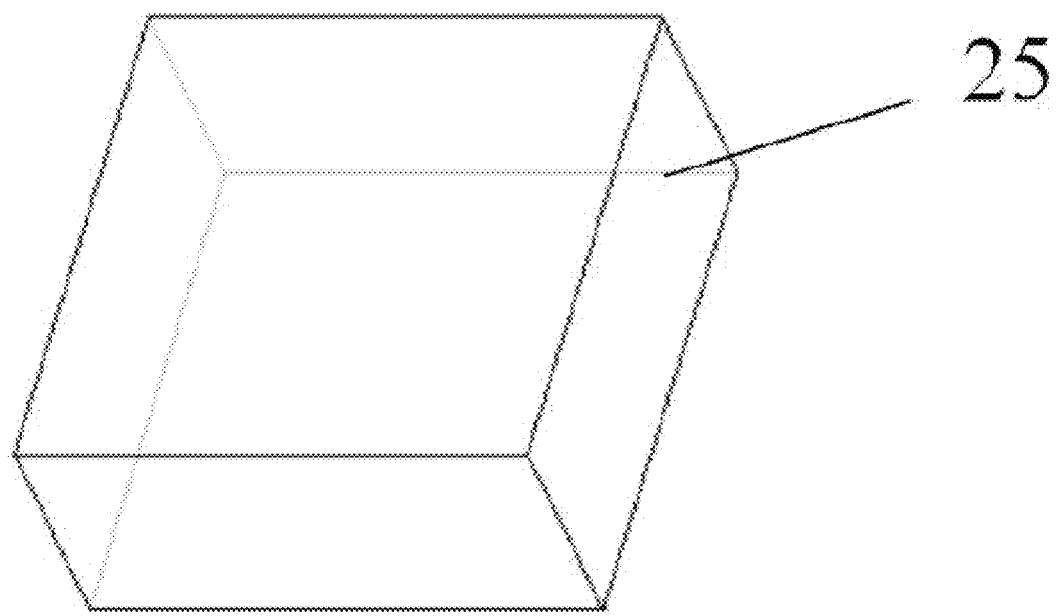

Here is one embodiment of the first spacer 25. In addition, the first spacer 25 is various in the embodiments as shown in FIGS. 72 to 80. As shown in FIG. 72, a projection, projected on the first spacer plane 251, of the second spacer plane 252 is overlapped with the first spacer plane 251.

Figure 73:
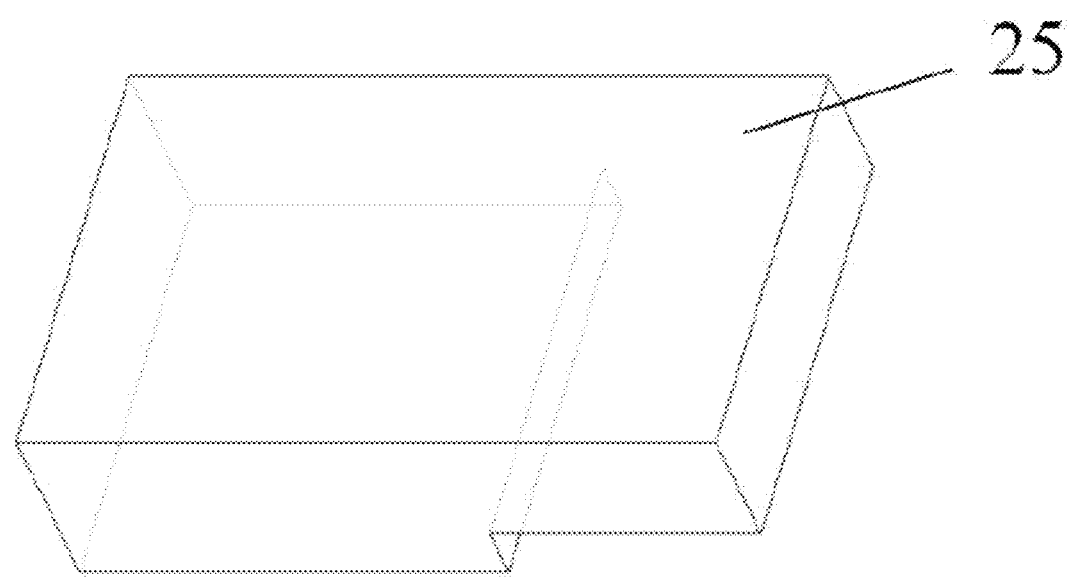
Figure 74:
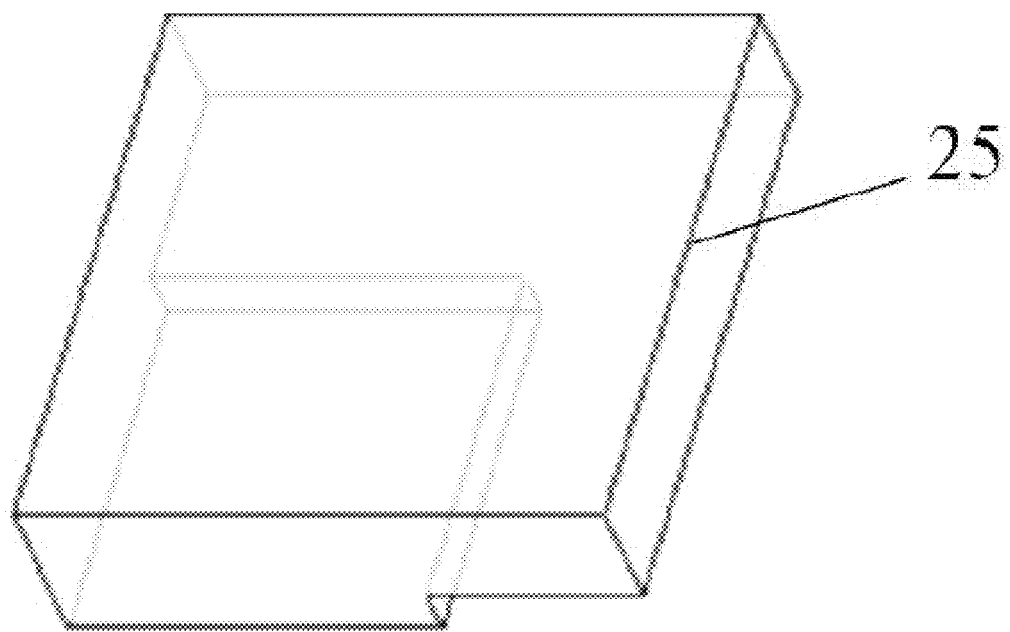
Figure 75:
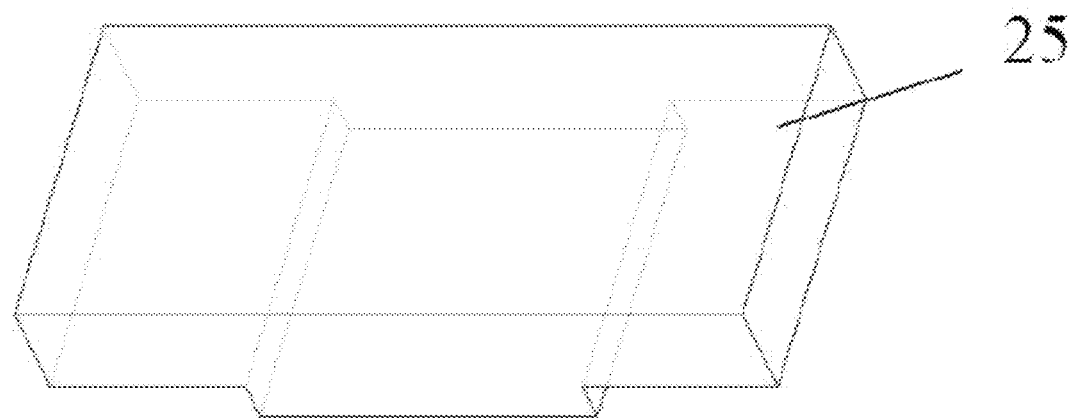
Figure 76:
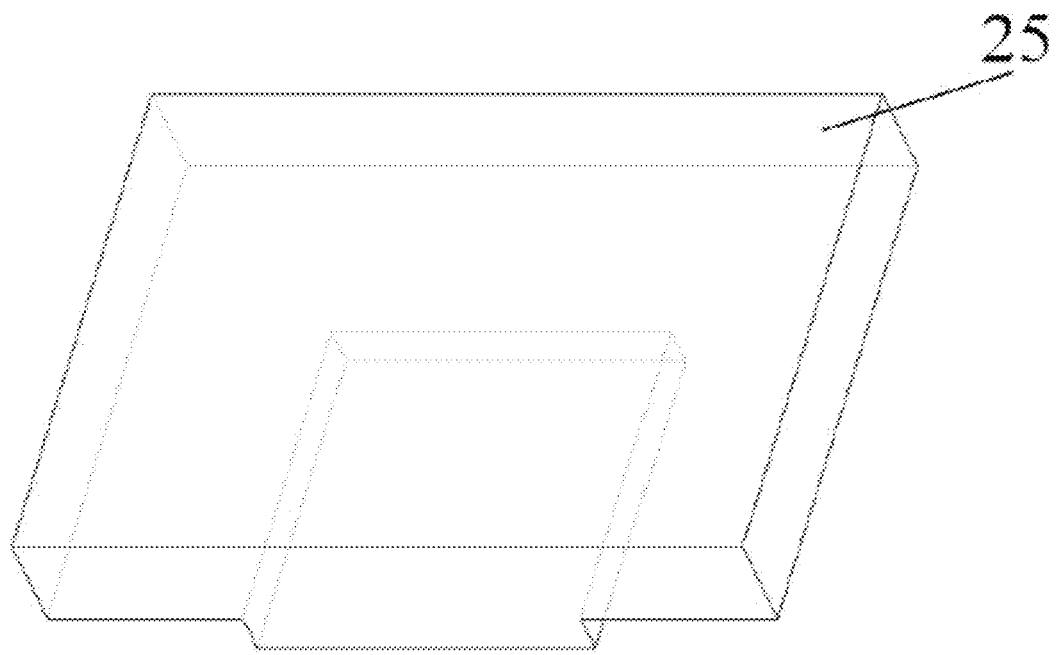
Figure 77:
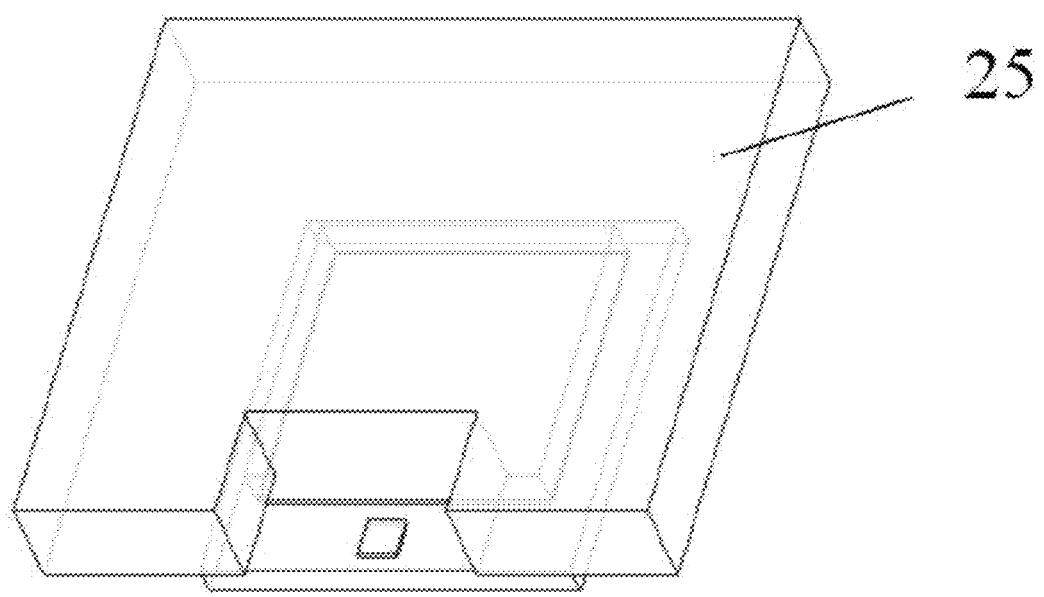
Figure 78:
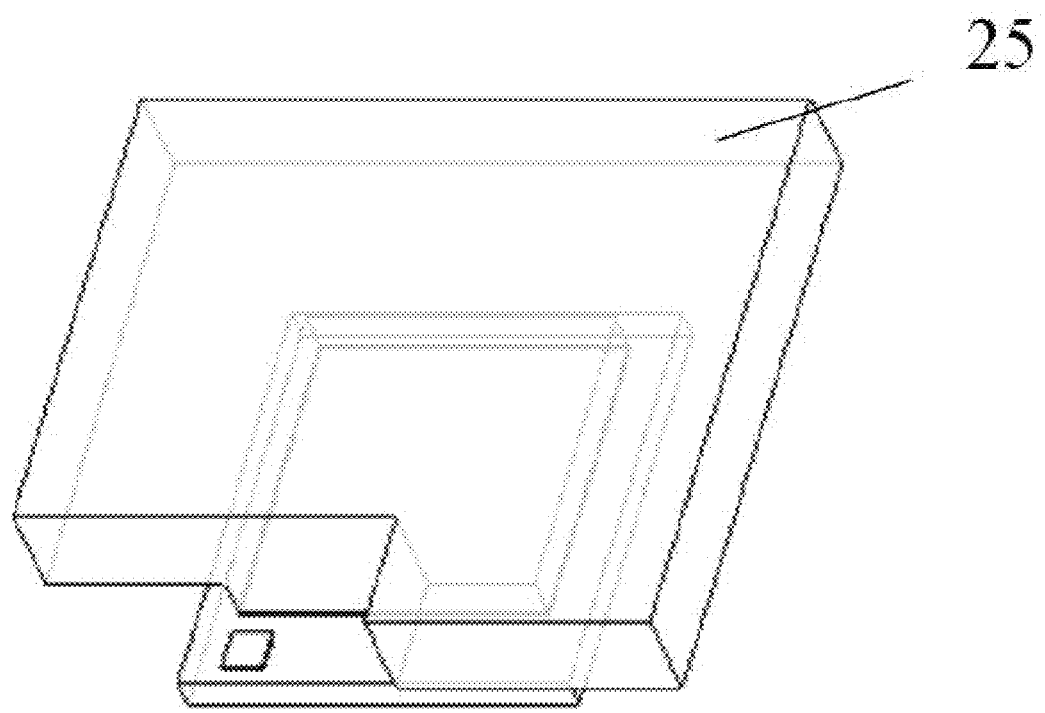

In order to increase the contact area of the second spacer plane 252 of the first spacer 25 and the second metal layer 42, as shown in FIG. 73, a projection, projected on the first spacer plane 251, is protruded one side of the first spacer plane 251. In some embodiments, as shown in FIG. 74 and FIG. 75, a projection, projected on the first spacer plane 251, is protruded two sides of the first spacer plane 251. In some embodiments, as shown in FIG. 76, a projection, projected on the first spacer plane 251, is protruded three sides of the first spacer plane 251. In some other embodiments, a projection, projected on the first spacer plane 251, is protruded four sides of the first spacer plane 251. The first switch 281 includes a signal end beside the second end. The signal end, as shown in FIG. 77, is disposed at an intermediate portion of the edge of the first switch 281. As shown in FIG. 78, in some embodiments, the signal end is disposed at a corner of the first switch 281.

Figure 79:
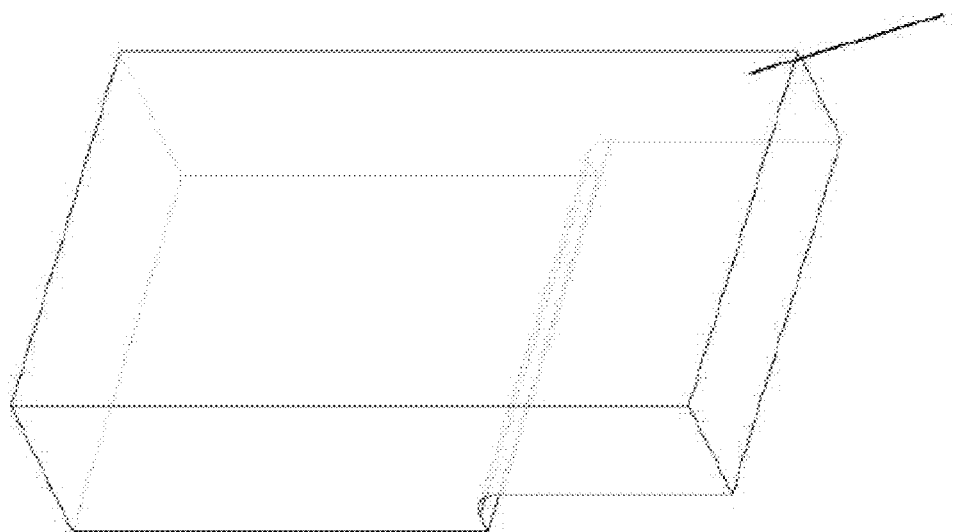
Figure 80:
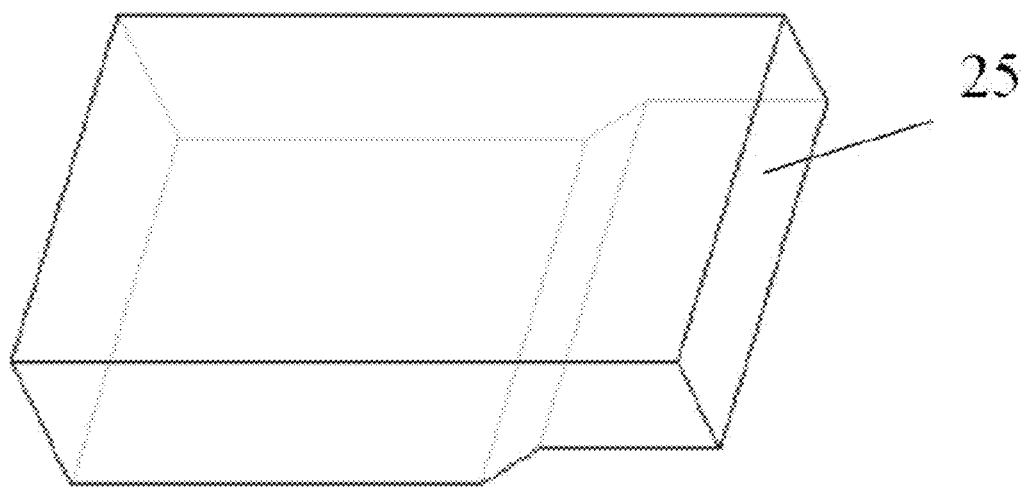

In this embodiment, the connection of the fourth spacer plane and the third spacer plane is an angle equal to 90°. But in some other embodiments, as shown in FIG. 79, the connection of the fourth spacer plane and the third spacer plane is a fillet, or as shown in FIG. 80, is an angle greater than 90°.

Moreover, in some embodiments, the second spacer 26 includes a fifth spacer plane connected to the second switch 282 and a sixth spacer plane connected to the first metal layer 41. In some embodiments, the second spacer 26 includes a fifth spacer plane connected to the second switch 282 and a sixth spacer plane connected to the fourth metal layer 44. In different embodiments, the metal layer connected to the sixth spacer plane is different. A projection, projected on the first reference plane, of the sixth spacer plane is greater than a projection, projected on the first reference plane, of the fifth spacer plane. The projection, projected on the first reference plane, of the sixth spacer plane is protruded one side of the projection, projected on the first reference plane, of the fifth spacer plane 0.5 to 5 mm. Therefore, a contact area of the sixth spacer plane and the metal layer connected to the sixth spacer plane is then enlarged and the structure strength of the power module is then enhanced.

In this embodiment, at least one side of the fifth spacer plane of the second spacer is formed a recess facing to the sixth spacer plane. The recess includes an eighth spacer plane connected to the fifth spacer plane and a seventh spacer plane connected to the eighth spacer plane. A distance between the seventh spacer plane and the fifth spacer plane is greater than 0.1 mm, and a distance between the seventh spacer plane and the sixth spacer plane is greater than 0.5 mm.

Furthermore, in some embodiments, the second spacer 26 is shown as the spacer in FIGS. 72 to 80. In one embodiment, the first spacer and the second spacer of the above embodiments are combined with the one embodiment. But in some other embodiments, the first spacer and the second spacer of the above embodiments are combined with the one embodiment to the one embodiment to form different embodiments of the present disclosure Which are within the scope of coverage of the present disclosure. In some embodiments, the first spacer 25 and the second spacer 26 of the one embodiment and the one embodiment are shown in FIGS. 72 to 80. In some embodiments, the first spacer and the second spacer of the one embodiment and the one embodiment are combined with other embodiments to form different embodiments of the present disclosure which are within the scope of coverage of the present disclosure.

In summary, since a projection, projected on the first reference plane or on the second reference plane, of a P pole metal layer is overlapped with a projection, projected on the first reference plane or the second reference plane, of a N pole metal layer. Moreover, since the current flowing through the P pole is opposite to the current flowing through the N pole, the goal of the cancellation of the inductance is achieved and the stray inductance of the power module is then reduced.

Although relative terms such as "upper", "lower", "left", "right", "front" and "back" are used in this specification to describe the relative relationship between one component and another component in a figure, these terms are used in this specification only for convenience to illustrate such as the orientation of the embodiments described in the drawings. It should be understood that, if the devices in the figures are flipped upside down, the component described as "above" will become the component as "below". When a structure is "on" another structure, it may mean that the structure is integrally formed on the said another structure, or that the structure is "directly" disposed on the said another structure, or that the structure is "indirectly" disposed on the said another structure through a further another structure.

The terms "include" and "have" are used to express the meaning of an opening inclusion, and refer to that, in addition to the listed elements, components, etc., there may be additional elements, components, etc. The term "a plurality of" refers to two or more. The term "electrical coupe" refers to direct electrical connection or electrical connection through other components.

After considering the specification and practicing the disclosure here, those skilled in this art will easily come up with other implementation plans of the disclosure. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are to be considered as illustrative only, and the true scope of the disclosure is pointed out by the appended claims.

What is claimed is:

1. A power module, comprising:
    a first conductor, wherein at least a portion of the first conductor is disposed at a first reference plane;
    a second conductor, wherein at least a portion of the second conductor is disposed at a second reference plane, the second reference plane is parallel to the first reference plane, and a projection of the first conductor on the first reference plane and a projection of the second conductor on the first reference plane have a first overlap area;
    a third conductor, wherein at least a portion of the third conductor is disposed at a third reference plane, and the third reference plane is parallel to the first reference plane and the second reference plane;
    a plurality of first switches, wherein a first end of each of the first switches is electrically coupled to the first conductor;
    a plurality of second switches, wherein a first end of each of the second switches is electrically coupled to a second end of at least one of the first switches through the third conductor, and a second end of each of the second switches is electrically coupled to the second conductor,
    a first power terminal, electrically coupled to the first conductor, wherein the first power terminal is led out from a first side of the power module;
    a second power terminal, electrically coupled to the second conductor, wherein the second power terminal is led out from a first side of the power module;
    a third power terminal, electrically coupled to the third conductor, wherein the third power terminal is led out from a second side of the power module;
    a plurality of control signal conductors, wherein each of the control signal conductors is electrically coupled to one of control ends of the plurality of first switches and the plurality of second switches, and the plurality of control signal conductors are disposed around the plurality of first switches and the plurality of second switches; and a plurality of control signal terminals, wherein each of the control signal terminals is electrically coupled to corresponding one of the plurality of control signal conductors, and led out from the second side of the power module, and the plurality of control signal terminals are symmetrically distributed on both sides of the third power terminal;

wherein the first side and the second side of the power module are opposite to each other, and the first power terminal and the second power terminal are stacked on each other;

wherein a projection of a minimum envelope area of the plurality of first switches on the first reference plane and a projection of a minimum envelope area of the plurality of second switches on the first reference plane have a second overlap area, and the first overlap area and the second overlap area have an overlap region.

2. The power module according to claim 1, wherein, the first switches and the second switches that are located on at least one of a first side and a second side of the first overlap area are interlacedly disposed, and the first side and the second side of the first overlap area are oppositely disposed.

3. The power module according to claim 1, wherein in the first conductor and the second conductor corresponding to the first overlap area, a direction of a current flowing through the first conductor is opposite to a direction of a current flowing through the second conductor.

4. The power module according to claim 1, wherein in a direction perpendicular to the first reference plane, each of the first switches is provided with one of the first conductor, the second conductor and the third conductor above, and with one of the first conductor, the second conductor and the third conductor below; and each of the second switches is provided with only one of the first conductor, the second conductor and the third conductor above, and with only one of the first conductor, the second conductor and the third conductor below.

5. The power module according to claim 1, wherein the plurality of first switches are disposed at a first substrate, and the plurality of second switches are disposed at the first substrate or a second substrate.

6. The power module according to claim 5, wherein the first conductor is a conductive layer disposed at the first substrate, and one of the second conductor and the third conductor is a conductive layer disposed at the second substrate.

7. The power module according to claim 1, wherein the plurality of first switches are disposed on the first conductor or the third conductor, and the plurality of second switches are disposed on the second conductor or the third conductor.

8. The power module according to claim 1, wherein the first conductor has an L-shaped structure.

9. The power module according to claim 1, wherein the third conductor comprises:
a first conductive layer, disposed at the second reference plane and adjacent to the second conductor;
a second conductive layer, disposed at the first reference plane and adjacent to the first conductor; and
a connecting bridge, wherein at least a portion of the connecting bridge is disposed at the third reference plane, and electrically coupling the first conductive layer and the second conductive layer together,
wherein the plurality of first switches are commonly connected to the same first conductor, and each of the second switches is separately connected to a separate one of the second conductive layer.

10. The power module according to claim 9, wherein the connecting bridge comprises:
a plurality of first protrusions, zigzaggedly disposed on a first side of the connecting bridge, wherein the plurality of first protrusions are connected to the first conductive layer by connection material; and
a plurality of second protrusions, zigzaggedly disposed on the second side of the connecting bridge, wherein the plurality of second protrusions are connected to the second conductive layer by the connecting material, and the second side of the connecting bridge is opposite to the first side of the connecting bridge.

11. The power module according to claim 9, wherein the connecting bridge is a sheet metal part.

12. The power module according to claim 1, wherein the second end of each of the first switches and the first end of each of the second switches are electrically coupled together by the third conductor.

13. The power module according to claim 1, wherein a number of the plurality of first switches and a number of the plurality of second switches are equal or unequal.

14. The power module according to claim 1, wherein the second reference plane is positioned between the first reference plane and the third reference plane.

15. The power module according to claim 1, wherein the second conductor comprises a sheet metal part.

16. The power module according to claim 1, further comprising:
a clamping capacitor, wherein one end of the clamping capacitor is electrically coupled to the first conductor, and the other end of the clamping capacitor is electrically coupled to the second conductor.

17. The power module according to claim 1, wherein the third conductor comprises N connecting bridges, each of the connecting bridges connects a portion of the first switches and a portion of the second switches in series to form a single-phase half-bridge structure, the plurality of first switches and the plurality of second switches form N phases of half-bridge structures, and N is an integer greater than or equal to 2.

* * * * *